US007879535B2

United States Patent
Kano et al.

(10) Patent No.: US 7,879,535 B2
(45) Date of Patent: Feb. 1, 2011

(54) PATTERN FORMING METHOD, GRAFT PATTERN MATERIAL, CONDUCTIVE PATTERN FORMING METHOD AND CONDUCTIVE PATTERN MATERIAL

(75) Inventors: Takeyoshi Kano, Shizuoka-ken (JP); Koichi Kawamura, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 1204 days.

(21) Appl. No.: 11/090,593

(22) Filed: Mar. 28, 2005

(65) Prior Publication Data

US 2005/0214693 A1 Sep. 29, 2005

(30) Foreign Application Priority Data

| Mar. 26, 2004 | (JP) | ............... 2004-093726 |
| Mar. 26, 2004 | (JP) | ............... 2004-093727 |
| Mar. 26, 2004 | (JP) | ............... 2004-093728 |
| Jun. 1, 2004 | (JP) | ............... 2004-163786 |

(51) Int. Cl.
*G03F 1/00* (2006.01)

(52) U.S. Cl. .................. 430/322; 430/269; 430/291; 430/315; 430/324

(58) Field of Classification Search ................ 430/269, 430/315, 291, 16, 322, 324
See application file for complete search history.

(56) References Cited

U.S. PATENT DOCUMENTS

| 7,739,789 B2 * | 6/2010 | Kano et al. ............... 29/846 |
| 2002/0177053 A1 * | 11/2002 | Calderon ............... 430/18 |
| 2003/0068581 A1 * | 4/2003 | Kawamura et al. ........... 430/315 |

FOREIGN PATENT DOCUMENTS

| JP | 58-196238 A | 11/1983 |
| JP | 04-259381 A | 9/1992 |
| JP | 2002-299833 A | 10/2002 |
| JP | 2003-332738 A | 11/2003 |
| JP | 2004-31588 A | 1/2004 |
| JP | 2004-056106 A | 2/2004 |
| JP | 2004-299833 A | 10/2004 |

OTHER PUBLICATIONS

En Tang Kang, et al., "Surface Modification of Fluoropolymers via Molecular Design", Advanced Materials, Oct. 6, 2000, pp. 1481-1494, vol. 12, No. 20.
Japanese Office Action for Application No. 2004-163786 dated Jul. 14, 2009.
Office Action for Japanese Application No. 2004-163786 dated Nov. 17, 2009.

* cited by examiner

*Primary Examiner*—Thorl Chea
(74) *Attorney, Agent, or Firm*—Sughrue Mion, PLLC

(57) ABSTRACT

The present invention provides a pattern forming method characterized in that energy is applied to a surface of a base material including a polyimide having a polymerization initiating moiety in a skeleton thereof to thereby generate an active site on the surface of the base material, and a polymer directly bonded to the base material surface and having at least a group selected from a group consisting of: a polar group; a functional group whose hydrophilicity/hydrophobicity changes, whose structure is changed into a structure that interacts with an electroless plating catalyst or a precursor thereof, or which ceases to interact with an electroless plating catalyst or a precursor thereof in response to heat, acid or radiation; and a polymerizable functional group, is generated in a pattern shape using the active site as a starting point so that a pattern is formed on the surface of the base material.

9 Claims, No Drawings

PATTERN FORMING METHOD, GRAFT PATTERN MATERIAL, CONDUCTIVE PATTERN FORMING METHOD AND CONDUCTIVE PATTERN MATERIAL

CROSS-REFERENCE TO RELATED APPLICATION

This application claims priority under 35 USC 119 from Japanese Patent Application Nos. 2004-93726, 2004-93727, 2004-93728, and 2004-163786, the disclosures of which are incorporated by reference herein.

BACKGROUND OF THE INVENTION

1. Field of the Invention

The present invention relates to a pattern forming method, graft pattern material, conductive pattern forming method and conductive pattern material, and more particularly to a method of forming a metallic pattern advantageous for a metallic wiring plate, print wiring substrate (FPC substrate, TAB tape and the like) and semiconductor package.

2. Description of the Related Art

Currently, the fields of FPC and TAB, in which a wiring width is narrower relative to metallic wirings in other fields, are fields in which there is an increasing demand for the application of a high-frequency current.

The FPC (Flexible Printed Circuit) is a wiring substrate in which a metallic pattern is formed on a flexible substrate and is used for a head part which repeatedly operates at a high speed in a hard disk drive or an optical pickup because of its high flexibility. Alternatively, the FPC is also used for a camera, portable telephone and the like because it can foldably incorporate an electronic circuit into a narrow space therein.

The TAB tape, which is an abbreviation for Tape Automated Bonding tape, is a wiring substrate capable of thin packaging for IC/LSI using a heat-resistant film as a base substrate. As a method of the packaging, a lead and a semiconductor chip formed on the wiring substrate are directly collectively bonded with each other by means of hot pressing. The TAB tape is superior in providing higher density wiring and therefore is used for a driver substrate for LCD/PDP and the like and a CSP interposer (rewiring substrate) for a memory, DSP device and the like.

As methods of forming the metallic pattern formed in the FPC and TAB a "subtractive method", a "semi-additive method" and a "full-additive method" are mainly known.

The subtractive method is a method in which a photosensitive layer reactive to irradiation of active light is provided on a metallic layer formed on a substrate, the photosensitive layer is subjected to image-wise exposure, the image is developed so as to form a resist image, the metal is etched so as to form a metallic pattern, and, as a final step, the resist is stripped. In the metallic substrate used in the above-mentioned method, an adhesion property is generated by means of an anchor effect resulting from applying an unevenness process to an interface between the substrate and the metallic layer in order to adhere the substrate and the metallic layer to each other. As a result, the interface part of the finished metallic pattern is rendered uneven relative to the substrate, which unfavorably deteriorates a high-frequency characteristic when the metallic pattern is used as an electric wiring. As another problem, when the metallic substrate is formed, the substrate is subjected to the unevenness process, which requires a complicated step of treating the substrate with strong acid such as chromic acid.

In order to eliminate the above-mentioned problems, a method of minimizing the unevenness of the substrate and simplifying the processing steps for the substrate by grafting a radically-polymerizable compound on a surface of the substrate so as to modify a property of the substrate surface (as examples of which, see Japanese Patent Application Laid-Open (JP-A) No. 58-196238, and pp 1481-1494 of "Advanced Materials", $20^{th}$ edition, published in 2000) has been proposed. The metallic substrate formed in the above-mentioned method can be patterned by means of the subtractive method, but, the subtractive method has its own unique problem, that is, a so-called over-etching process in which a post-etching line width becomes thinner than a line width of a resist pattern is advantageous in order to form the metallic pattern having a fine line width by means of the subtractive method (for example, see JP-A No. 2004-31588). The reason why the over-etching process is problematic is that the formation of the fine metallic pattern directly by the over-etching process easily leads to the generation of a blurred line, a faint line, a broken line and the like, making it difficult to form a metallic pattern of 30 μm or less, which is disadvantageous for the formation of a favorable fine metallic pattern. The above-mentioned conventional method further creates a problem, from the standpoint of the environmental and pricing, because the metallic film present in any area other than the pattern portion is removed and therefore wasted in large amounts by the etching process and because the disposal of waste fluid generated by the etching process is costly.

In order to eliminate the above-mentioned problems, the metallic pattern forming method called the semi-additive method has beens proposed. The semi-additive method is a method in which a thin ground substrate layer made of Cr or the like is formed on the substrate by means of plating or the like, a resist pattern is formed on the ground metallic layer, a metallic layer made of Cu or the like is formed on the ground metallic layer other than the region where the resist pattern is formed by means of the plating, the resist pattern is removed so as to form a wiring pattern, the wiring pattern is used as a mask to etch the ground metallic layer, and a metallic pattern is formed in the region other than where the resist pattern is formed. The method does not require the etching process, and therefore, is capable of easily forming a fine line pattern of 30 μm or less. The method is also effective from the standpoints of the environment and pricing because the metal is deposited only in a desired part by means of the plating. However, there is also a problem included in this method in that it is necessary to apply the unevenness process to the substrate surface in order to generate the adhesion property between the substrate and the metallic pattern, as a result of which the interface of the finished metallic pattern becomes uneven relative to the substrate and the high-frequency characteristic thereby deteriorates when the metallic pattern is used as an electric wiring.

The metallic pattern forming method called the full-additive method has also been proposed. The full-additive method is a method in which a resist pattern is formed on the substrate, the metal is deposited other than the region where the resist pattern is formed, and the resist pattern is thereafter removed. This method, which is also an etchingless method, enables the easy formation of a fine line pattern of 30 μm or less, but shares the same problem as in the case of the semi-additive method. Therefore, a novel metallic pattern forming method capable of forming a thin line pattern, reducing unevenness in the substrate interface, and reducing the waste fluid generated by the etching process is desired.

Not only a continuous metal thin film, but also a metallic fine particle pattern formed by selectively adsorbing a metallic fine particle to a specific region is attracting an attention.

As a typical example of such a method, a method of spraying a nanopaste on a pattern by means of an ink jet is known (for example, see JP-A No. 2002-299833). This method, however, also includes problems, such as that a considerable amount of time is required for the pattern forming.

The substrate used for the formation of the wiring substrate is necessarily solder-resistant and is usually required to have heat resistance against approximately 250° C. Therefore, a polyimide substrate having a superior heat resistance is generally used. However, the problems associated with the metallic pattern forming mentioned earlier remain unsolved even in using the polyimide substrate. Thus, a novel metallic pattern forming method is also desired for the formation of a metallic pattern on a polyimide substrate, which is superior in heat resistance. However, the current situation is that such a method has not yet been provided.

SUMMARY OF THE INVENTION

The invention has been invented in consideration of the disadvantages of the above-mentioned conventional technology. The invention provides a conductive pattern forming method capable of forming a fine conductive pattern superior in heat resistance, adhesion property relative to a base material surface and durability on a surface of a polyimide base material through simplified steps and a conductive pattern material obtained according to the conductive pattern formation method.

The inventors of the invention have performed earnest study in view of the above-mentioned issues. As a result, they have found that, when a polyimide wherein a polymerization initiating moiety is introduced into a skeleton is used as a base material, an active site can be easily generated (generation of radical) on a surface of the polyimide base material by applying energy using UV light or the like, and, using the active site as a starting point, a polymer directly bonded to the base material surface and having at least a group selected from the group consisting of: a polar group; a functional group whose hydrophilicity/hydrophobicity changes, whose structure is changed into a structure interacts with an electroless plating catalyst or a precursor thereof, or which ceases to interact with an electroless plating catalyst or a precursor thereof, in response to heat, acid or radiation; and a polymerizable functional group, is generated in a pattern shape, and the pattern can be thereby formed on the surface of the polyimide base material in an easy and simplified manner.

More specifically, one aspect of the invention is a pattern forming method comprising: applying energy to a surface of a base material including a polyimide having a polymerization initiating moiety in a skeleton thereof to generate an active site on the surface of the base material; forming a polymer compound layer including a polymer compound that directly bonds to the surface of the base material and has one of the following functional groups (i) and (ii) by using the active site as a starting point; and applying heat, acid or radiation to the polymer compound layer in a patterned shape to form one of the following patterns of (I) and (II) on the surface of the base material, wherein: the pattern (I) is obtained when the polymer compound having the functional group (i) is used, and the pattern (II) is obtained when the polymer compound having the functional group (ii) is used; the functional group (i) is a functional group whose hydrophilicity or hydrophobicity is changed in response to heat, acid or radiation; the functional group (ii) is either a functional group whose structure is changed into a structure that interacts with an electroless plating catalyst or a precursor thereof, or a functional group that ceases to interact with an electroless plating catalyst or a precursor thereof, in response to heat, acid or radiation; the pattern (I) is a pattern including a hydrophilic region and a hydrophobic region; and the pattern (II) is a pattern including a region that interacts with either the electroless plating catalyst or the precursor thereof.

Another aspect of the invention is a pattern forming method comprising: contacting a compound having one of the following groups (iii) and (iv) to a surface of a base material including a polyimide having a polymerization initiating moiety in a skeleton thereof; irradiating radiation in a patterned shape to generate an active site in the patterned shape on the surface of the base material; and generating a graft polymer on the surface of the base material by graft polymerizing the compound by using the active site as a starting point to form one of the following patterns (III) and (IV) on the surface of the base material, wherein: the pattern (III) is obtained when the compound having the group (iii) is used, and the pattern (IV) is obtained when the compound having the group (iv) is used; the group (iii) is a polymerizable functional group and a polar group; the group (iv) is a polymerizable functional group and a functional group that interacts with either an electroless plating catalyst or a precursor thereof; the pattern (III) is a pattern including a region where the graft polymer is generated and a region where the graft polymer is not generated; and the pattern (IV) is a pattern including a region that interacts with either the electroless plating catalyst or the precursor thereof.

DETAILED DESCRIPTION OF THE INVENTION

Hereinafter, the present invention is described in detail.

The scope of the present invention has the constitutions described in the SUMMARY OF THE INVENTION described above.

In particular, a first preferred mode of the invention has been achieved upon finding that, by generating a graft polymer directly bonded to the base material substrate and having a polar group in the pattern shape using the active site as a starting point, the pattern can be easily formed on the polyimide base material surface.

Further, a second preferred mode of the invention has been achieved upon finding that the above-mentioned issues can be resolved through a process in which a metal ion or a metal salt is imparted to the graft polymer and the metal ion or the metal salt is reduced.

Furthermore, a third preferred mode of the invention has been achieved upon finding that the above-mentioned issues can be resolved through a process in which a region where a graft polymer directly bonded to the base material surface and having the functional group that interacts with the electroless plating catalyst or precursor thereof is generated in the pattern shape using the active site as a starting point, and an electroless plating is performed to the region.

More specifically, a surface graft formation method according to the first mode of the invention is characterized in that the graft polymer directly bonded to the base material surface and having the polar group is generated in the pattern shape on the surface of the base material including the polyimide having the polymerization initiating moiety in the skeleton thereof.

More preferred modes of the pattern forming method according to the first mode of the invention are methods described in (1-1) and (1-2), although the invention is not necessarily limited to those methods.

A pattern forming method characterized in that energy is applied to the surface of the base material including the polyimide having the polymerization initiating moiety in the skeleton thereof to thereby generate the active site on the base material surface, a polymer compound layer made of the polymer compound directly bonded to the base material surface and having the functional group whose hydrophilicity/hydrophobicity is changed in response to heat, acid or radiation is provided on the base material surface using the active site as a starting point, and the heat, acid or radiation is applied to the polymer compound layer in the pattern shape so that a pattern comprising a hydrophilic region and a hydrophobic region is formed on the base material surface (hereinafter, referred to as a "pattern forming method (1-1)").

A pattern forming method characterized in that a compound having the polymerizable functional group and the polar group is brought into contact with the surface of the base material including the polyimide having the polymerization initiating moiety in the skeleton thereof, the radiation is irradiated to the base material surface in the pattern shape to thereby generate the active site on the base material surface, and the graft polymer is generated on the base material surface using the active site as a starting point by means of graft polymerization so that a pattern comprising a region where the graft polymer is generated and a region where the graft polymer is not generated is formed (hereinafter, referred to as a "pattern forming method (1-2)").

When the pattern forming method (1-1) using the compound that can be directly bonded to the base material surface is used in the first mode of the invention, the layer including the polymer compound, wherein the region to which the energy such as the radiation including light exposure or heat is applied or the region to which the energy is not applied becomes hydrophilic, can be obtained on the base material surface depending on a polarity of a surface of the polymer compound having the functional group whose hydrophilicity/hydrophobicity is changed in response to heat, acid or radiation (hereinafter, referred to as a polarity conversion group). As a result, a pattern with a high resolution can be easily obtained in a large area. When the pattern forming method (1-2) using the compound that can be directly bonded to the base material surface is used, in the same manner as in the above-mentioned method, in the case of the pattern forming, the pattern forming layer is formed by making the compound having the polymerizable group and the polar group contact with the base material surface, irradiating the radiation in the pattern shape to thereby generate the active site on the base material surface, and combining the compound having the polymerizable group with the active site. As a result, a pattern with a high resolution can be obtained depending on the application of the energy, such as light exposure, heating or the like.

The polymer compound having the polarity conversion group, which is used in the pattern formation method (1-1), for example, is bonded to the base material at a terminal thereof directly or via a stem polymer compound. The compound having the polymerizable group and the polar group, which is used in the pattern forming method (1-2), is also directly bonded to the base material through light exposure or the like.

A metallic fine particle dispersion pattern forming method according to the second mode of the invention is characterized in comprising generating the graft polymer directly bonded to the base material surface and having the polar group in the pattern shape on the surface of the base material including the polyimide having the polymerization initiating moiety in the skeleton thereof, imparting the metal ion or the metal salt to the graft polymer (hereinafter, referred to as a "metal ion etc. imparting"), and forming a region to which the metallic fine particles are attached by reducing the metal ion or a metal ion included in the metal salt and thereby depositing the metallic fine particles (hereinafter, referred to as a "metallic fine particle deposition"). In the second mode of the invention, the polar group contained in the graft polymer represents a functional group having an affinity with respect to the metal ion or metal salt and includes a functional group to which the metal ion or the metal salt can be directly adsorbed, a functional group wherein the metal ion or the metal salt contained in a liquid can be unevenly distributed in a vicinity, or the like. A principal example of the polar group in the invention is a hydrophilic group.

More preferred modes of the metallic fine particle dispersion pattern forming method according to the second mode of the invention are methods described in (2-1) and (2-2), although the invention is not necessarily limited to those methods.

A metallic fine particle dispersion pattern forming method characterized in comprising applying energy to the surface of the base material including the polyimide having the polymerization initiating moiety in the skeleton thereof to thereby generate the active site on the base material surface, the polymer compound layer made of the polymer compound directly bonded to the base material surface and having the functional group whose hydrophilicity/hydrophobicity is changed in response to heat, acid or radiation is provided on the base material surface using the active site as a starting point, and the pattern comprised of the hydrophylic region and the hydrophobic region is formed on the base material surface by applying heat, acid or radiation to the polymer compound layer in the pattern shape, imparting the metal ion or the metal salt to the hydrophilic region, and forming the region to which the metallic fine particles are attached by reducing the metal ion or the metal ion in the metal salt and thereby depositing the metallic fine particle (hereinafter, referred to as a "metallic fine particle dispersion pattern forming method (2-1)").

A metallic fine particle dispersion pattern forming method characterized in comprising bringing the compound having the polymerizable functional group and the polar group into contact with the surface of the base material including the polyimide having the polymerization initiating moiety in the skeleton thereof, the radiation is irradiated in the pattern shape to thereby generate the active site on the base material surface, and the graft polymer is generated on the base material surface using the active site as a starting point by means of graft polymerization so that the pattern comprised of the region where the graft polymer is generated and the region where the graft polymer is not generated is formed, imparting the metal ion or the metal salt to the region where the graft polymer is generated, and forming the region to which the metallic fine particles are attached by reducing the metal ion or the metal ion included in the metal salt and thereby depositing the metallic fine particles (hereinafter, referred to as a "metallic fine particle dispersion pattern forming method (2-2)").

The metallic pattern forming method according to the second mode of the invention is characterized in that the metallic fine particle dispersion pattern obtained in the above-mentioned metallic fine particle dispersion pattern forming method is heated.

When the pattern forming method (1-1) or the metallic fine particle dispersion pattern forming method (2-1) is employed in the first and second modes of the invention, the layer including the polymer compound, wherein the region to which the energy such as the radiation including light exposure or heating is applied or the region to which the energy is not applied results in the hydrophilic region, can be obtained on the base material surface depending on the polarity of the surface of the polymer compound having the functional group whose hydrophilicity/hydrophobicity is changed in response to heat, acid or radiation (hereinafter, referred to as a polarity conversion group). Therefore, a pattern with a high resolution can be easily formed in a large area. When the pattern forming method (1-2) or the metallic fine particle dispersion pattern forming method (2-2) is employed, in the same manner as in the above-mentioned methods, the region where the graft polymer is generated (pattern forming layer) is formed by making the compound having the polymerizable functional group (polymerizable group) and the polar group contact with the base material surface at the time of the pattern forming, irradiating the radiation in the pattern shape to thereby generate the active site on the base material surface, and combining the compound having the polymerizable functional group (polymerizable group) and the polar group with the active site. Accordingly, a pattern with a high resolution can be obtained corresponding to the application pattern of the light exposure, heating or the like.

The polymer compound having the polarity conversion group used in the pattern forming method (1-1) and the metallic fine particle dispersion pattern forming method (2-1) is, for example, bonded to the medium at the terminal thereof directly or via a stem polymer compound. The polymer compound having the polymerizable functional group (polymerizable group) and the polar group used in the pattern formation method (1-2) and the metallic fine particle dispersion pattern forming method (2-2) is also directly bonded to the base material surface through light exposure or the like. In the second mode of the invention, in particular, the polyimide is used as the base material and the metal ion or the metal salt is imparted to the graft polymer directly bonded to the base material surface and having the polar group, and then, the metal ion or the metal ion in the metal salt is reduced so as to deposit the metal. Therefore, regions to which metallic fine particles are dispersedly adhered having a remarkable strength and abrasion resistance are continuously formed. As a result, the metallic fine particle dispersion pattern having the metallic fine particles dispersed therein at a high density and achieving a remarkable heat resistance, adhesion property relative to the base material surface and durability, irrespective of its thinness, can be formed through the simplified processess.

A metallic pattern forming method according to the third mode of the invention is characterized in comprising forming the region where the graft polymer directly bonded to the base material surface and having the functional group that interacts with the electroless plating catalyst or the precursor thereof (hereinafter, referred to as an "interaction-property region") is formed on the surface of the base material including the polyimide having the polymerization initiating moiety in the skeleton thereof in the pattern shape, imparting the electroless plating catalyst or the precursor thereof to the region, and conducting electroless plating and thereby forming the pattern-shaped metallic film.

The material in which the metallic pattern is formed through the application of the third mode of the invention may be used singly as a circuit substrate or the like or may be used as a multi-layer wiring substrate with a plurality of materials stacked on one another or the like, covering a wide range of usages. The invention, for example, is particularly advantageous for the formation of different kinds of electric elements such as a FPC substrate requiring minute wiring (one surface, both surfaces or a plurality of layers), TAB tape, semiconductor package and the like.

More preferred modes of the pattern forming method according to the third mode of the invention are methods described in (3-1) and (3-2), although the invention is not necessarily limited to those methods.

A metallic pattern forming method characterized in comprising applying energy to the surface of the base material including the polyimide having the polymerization initiating moiety in the skeleton thereof to thereby generate the active site on the base material surface, the polymer compound layer made of the polymer compound directly bonded to the base material surface and having the functional group whose structure is changed into the structure capable of interacting with the electroless plating catalyst or the precursor thereof or which ceases to interact with the electroless plating catalyst or precursor thereof, in response to heat, acid or radiation is provided using the active site as a starting point, and the heat, acid or radiation is applied to the polymer compound layer in the pattern shape so that the region that interacts with the electroless plating catalyst or the precursor thereof (interaction-property region) is formed on the base material surface in the pattern shape, providing the electroless plating catalyst or the precursor thereof at the region, and performing electroless plating and thereby forming the pattern-shaped metallic film (hereinafter, referred to as metallic pattern forming method (3-1)).

A metallic pattern forming method characterized in comprising bringing the compound having the polymerizable functional group or the functional group that interacts with the electroless plating catalyst or the precursor thereof into contact with the surface of the base material including the polyimide having the polymerization initiating moiety in the skeleton thereof, and radiation is irradiated thereto in the pattern shape to thereby form the active site in the pattern shape on the base material surface, the graft polymer is generated on the base material surface by means of graft polymerization using the active site as a starting point, and the region that interacts with the electroless plating catalyst or the precursor thereof (interaction-property region) is formed in the pattern shape, imparting the electroless plating catalyst or the precursor thereof to the region, and performing electroless plating and thereby forming the pattern-shaped metallic film (hereinafter, referred to as a metallic pattern forming method (3-2)).

In the metallic pattern forming method according to the third mode of the invention, the region where the graft polymer having the functional group that interacts with the electroless plating catalyst or the precursor thereof is directly chemically bonded in the pattern shape is selectively supplied with the electroless plating catalyst or the precursor thereof and subsequently subjected to the electroless plating. Therefore, it is presumed that a metallic pattern with a high resolution can be easily obtained, in comparison to a metallic pattern forming method according to a conventional technology wherein an etching process using a resist pattern is performed, because the metal such as copper or the like is formed into multiple layers so as to generate the metallic pattern. Another advantage in the present mode is that there is no waste liquid generated from the etching process.

In the case of the metallic pattern formed by means of the metallic pattern forming method according to the third mode of the invention, the substrate is subjected to a surface graft process (details will be given later). When the electroless plating catalyst or the precursor thereof is made to act on the surface graft layer so that the electroless plating is performed, a surface graft polymer chain formed as a result of the polymerization at the substrate interface has a high mobility and easily interacts with the electroless plating catalyst or the precursor thereof. Further, the electroless plating is advanced inward and upward in the surface graft layer because an electroless plating liquid can easily transmit through the layer because of the high mobility of the chain. As a result, the interface of the metallic film part relative to the substrate results in a hybrid state with the polymer directly bonded to the substrate, which appears to generate the adhesion property while unevenness is minimized at the substrate interface. It is further presumed that a metallic pattern having a high heat resistance can be formed because the graft polymer is directly introduced into the polyimide base material so as to deposit the metal therein.

(Hereinafter, the pattern forming method (1-1), the metallic fine particle dispersion pattern forming method (2-1) and the metallic pattern forming method (3-1) are collectively referred to as a "metallic (fine particle dispersive) pattern forming method (1)". The pattern forming method (1-2), the metallic fine particle dispersion pattern forming method (2-2) and the metallic pattern forming method (3-2) are collectively referred to as "metallic (fine particle dispersive) pattern forming method (2)". The metallic (fine particle dispersive) pattern forming methods (1) and (2) are referred to as a "metallic (fine particle dispersive) pattern forming method" or simply as a "pattern forming method".)

Hereinafter, respective elements in the metallic (fine particle dispersive) pattern forming methods are described in detail.

Pattern Forming

In the pattern forming according to the first and second modes of the invention, the graft polymer directly bonded to the base material surface and having the polar group is generated in the pattern shape on the surface of the base material including the polyimide having the polymerization initiating moiety in the skeleton thereof. In the pattern forming according to the third mode of the invention, the region where the polymer having the functional group that interacts with the electroless plating catalyst or the precursor thereof is directly chemically bonded in the pattern shape (interaction-property region) is formed.

First, the base material including the polyimide having the polymerization initiating moiety in the skeleton thereof, which is used in the respective modes of the metallic pattern forming method according to the invention, is described in detail.

Production of base material including polyimide having polymerization initiating moiety in skeleton thereof.

The base material according to the invention is a base material including the polyimide having the polymerization initiating moiety in the polymer skeleton thereof (hereinafter, sometimes simply referred to as a "polyimide base material"). The "polymer skeleton" in the invention includes the main chain and side chain(s) of the polyimide. In view of obtaining heat resistance, the polyimide preferably has the polymerization initiating moiety in main chain thereof.

The polymerization initiating moiety represents a moiety which can be activated by applied energy using a UV light or the like to thereby generate the active site (radical species) in the structure thereof. The active site can be generated in such modes that the active site is directly generated in the polymerization initiating moiety or that the generation of the active site is induced in the polymerization initiating moiety and the vicinity thereof by extracting hydrogen from the vicinity of the polymerization initiating moiety. The polyimide used as the base material in the invention is a polyimide including the polymerization initiating moiety in the skeleton thereof (hereinafter, referred to as a "specific polyimide").

The inclusion of such a moiety enables the generation of the graft polymer, which will be described later, on the base material surface in an easy and simplified manner.

In the invention, the polymerization initiating moiety included in the specific polyimide is most preferably included in the main chain skeleton thereof in terms of heat resistance and easy production.

The base material including the specific polyimide according to the invention can be prepared by implementing the following <1> to <3> in that order.
<1> Production of the polyimide precursor
<2> Molding of the polyimide precursor.
<3> Change of the structure of the polyimide precursor into a polyimide structure through a heating process The above-mentioned processes <1> to <3> are described below.

<1> Production of Polyimide Precursor

Description of Polyimide Precursor

The compound represented by the following Formula (I) is used as the polyimide precursor compound used for the production of the specific polyimide according to the invention.

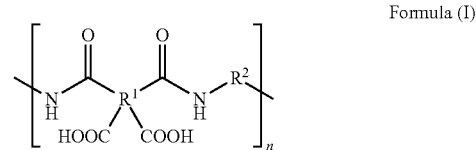

Formula (I)

In Formula (I), $R^1$ represents a tetravalent organic group, $R^2$ represents a bivalent organic group, and n represents an integer of at least one. At least one of $R^1$ and $R^2$ is a group including a structure having a polymerization initiation property. The moiety of the structure having the polymerization initiation property is the polymerization initiating moiety in the polyimide according to the invention. The structure having the polymerization property is preferably a structure having a photopolymerization initiation property.

The compound represented by Formula (I) can be obtained by reacting tetracarboxylic acid dianhydride represented by the following Formula (II) and a diamine compound represented by the following Formula (III) in an organic solvent. As additional elements, bivalent alcohols can be added.

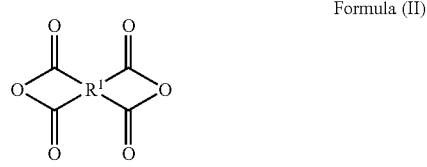

Formula (II)

Formula (III)

$R^1$ and $R^2$ shown in the above Formulas (II) and (III) are equivalent to $R^1$ and $R^2$ in Formula (I).

The tetracarboxylic acid dianhydride represented by Formula (II) is preferably a compound in which $R^1$ is selected from an aliphatic group containing 2 to 27 carbon atoms, a cyclic aliphatic group containing 4 to 10 carbon atoms, a monocyclic aromatic group, a condensed policyclic aromatic group or a group including the structure having the polymerization initiation property, or a compound in which $R^1$ is a non-condensed polycyclic aromatic group having aromatic groups directly combined with one another or a non-condensed polycyclic aromatic group having the aromatic groups combined with one another by a cross-linking agent. Among the aforementioned groups, $R^1$ is more preferably the group including the structure having the polymerization initiation property.

The tetracarboxylic acid dianhydride represented by Formula (II) may be used singly, or two or more kinds thereof of may be used in a combined manner.

When $R^1$ in Formula (II) is selected from the aliphatic group having 2 to 27 carbon atoms, cyclic aliphatic group having 4 to 10 carbon atoms, monocyclic aromatic group or condensed policyclic aromatic group, the monocyclic aromatic group or condensed policyclic aromatic group may be preferably selected in terms of the heat resistance of the polyimide.

When $R^1$ in Formula (II) is selected from the aliphatic group having 2 to 27 carbon atoms, cyclic aliphatic group having 4 to 10 carbon atoms, monocyclic aromatic group or condensed policyclic aromatic group, specific examples of the tetracarboxylic acid dianhydride represented by Formula (II) include pyromellitic acid anhydride, 2,3,6,7-tetracarboxynaphthalene anhydride, 1,4,5,8-tetracarboxynaphthalene anhydride, 1,2,5,6-tetracarboxynaphthalene anhydride, p-terphenyl-3,4,3",4"-tetracarboxylic acid anhydride, m-terphenyl-3,4,3",4"-tetracarboxylic acid anhydride, bicyclo(2,2,2) oct-7-ene-2,3,5,6-tetracarboxylic acid anhydride and the like.

When $R^1$ represents the non-condensed polycyclic aromatic group in which the aromatic groups are directly combined with one another or non-condensed polycyclic aromatic group in which the aromatic groups are combined with one another by a cross-linking agent, specific examples of the tetracarboxylic acid dianhydride represented by Formula (II) include ethylene tetracarboxylic acid dianhydride, cyclopentane tetracarboxylic acid dianhydride, pyromellitic acid dianhydride, 3,3',4,4'-biphenyl tetracarboxylic acid dianhydride, 2,2'3,3'-biphenyl tetracarboxylic acid dianhydride, 2,2-bis(3,4'-dicarboxyphenyl) dimethylmethane dianhydride, 2,2-bis(2,3-dicarboxyphenyl)dimethylmethane dianhydride, bis(3,4-dicarboxyphenyl)ether dianhydride, bis(3,4-dicarboxyphenyl)sulfone dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, 2,2-bis(3,4-dicarboxyphenyl)-1,1,1,3,3,3-hexafluorodimethylmethane dianhydride, 2,2-bis(2,3-dicarboxyphenyl)-1,1,1,3,3,3-hexafluorodimethylmethane dianhydride, 2,3,6,7-naphthalene tetracarboxylic acid dianhydride, 1,4,5,8-naphthalene tetracarboxylic acid dianhydride, 1,2,5,6-naphthalene tetracarboxylic acid dianhydride, 1,2,3,4-benzene tetracarboxylic acid dianhydride, 3,4,9,10-perylene tetracarboxylic acid dianhydride, 2,3,6,7-anthracene tetracarboxylic acid dianhydride, 1,2,7,8-phenanthrene tetracarboxylic acid dianhydride and the like.

Examples of the structure having the polymerization initiation property constituting the group including the structure having the polymerization initiation property represented by $R^1$ include (a) aromatic ketones, (b) onium salt compounds, (c) organic peroxides, (d) thiocompounds, (e) hexarylbiimidazole compounds, (f) ketoxime ester compounds, (g) borate compounds, (h) azinium compounds, (i) active ester compounds, (j) compounds having a carbon halogen bond, (k) pyridiums compounds, and the like.

When $R^1$ is a group including a structure having a polymerization initiation property, as the bonding of the carboxylic acid anhydride structure and $R^1$, two of which are included in Formula (II), the carboxylic acid anhydride structure may be bonded at any spot in the structure having the polymerization initiation property; or alternatively the carboxylic acid anhydride structure may be bonded via a linking group.

In terms of the heat resistance of the polyimide, (a) aromatic ketones are preferably selected in the case of the structure having the polymerization initiation property. Specific examples of (a) aromatic ketones are mentioned below. However, the invention is not limited thereto.

Aromatic Ketones

In the invention, preferable examples of (a) aromatic ketones as the structure having the polymerization initiation property include compounds having a benzophenone skeleton or a thioxanthone skeleton described on pp. 77 to 117 of "*RADIATION CURING IN POLYMER SCIENCE AND TECHNOLOGY*" J. P. Fouassier, J. F. Rabek (1993). For example, the following compounds can be mentioned.

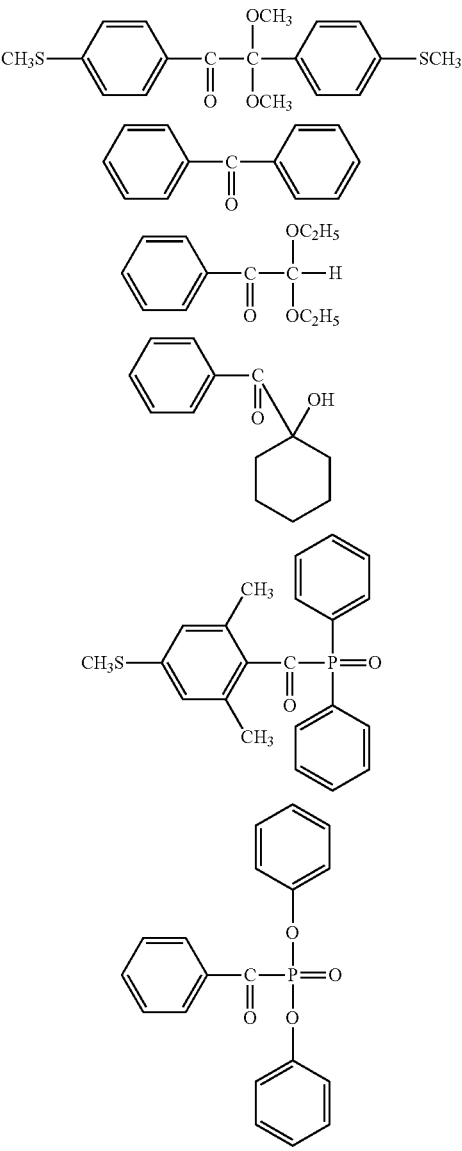

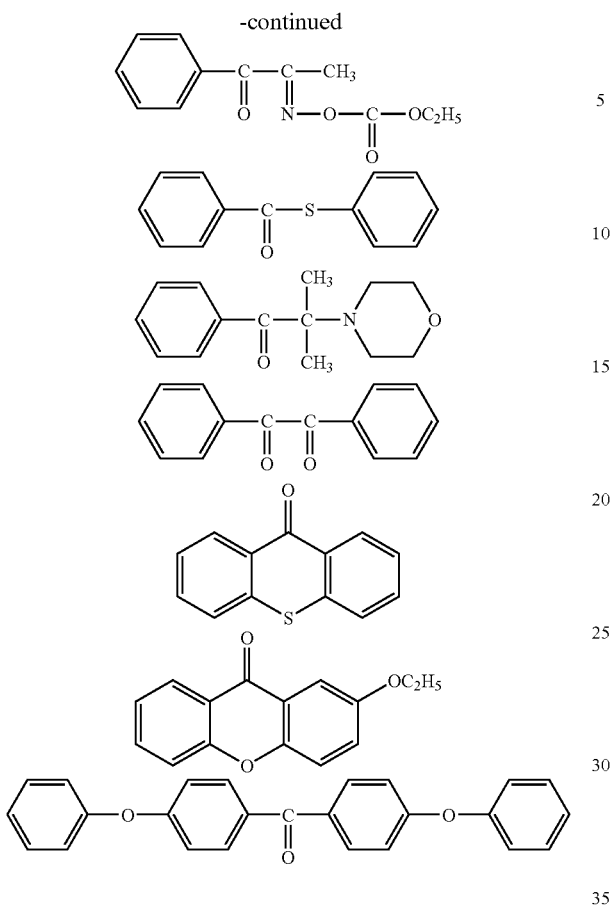

Particularly preferable examples of (a) aromatic ketones include α-thiobenzophenone compounds described in Japanese Patent Application Publication (JP-B) No. 47-6416 and benzoinether compounds described in JP-B No. 47-3981. For example, the following compound can be mentioned.

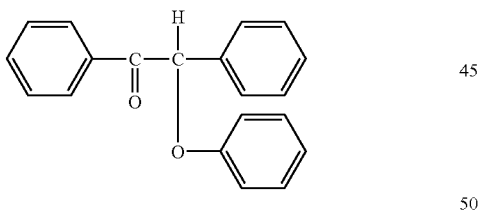

Preferable examples also include a substituent benzoin compounds described in JP-B No. 47-22326, such as the following compound.

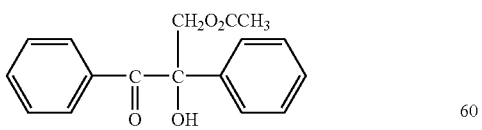

Preferable examples further include benzoin compounds described in JP-B No. 47-23664, aroylphosphonic acid esters described in JP-B No. 57-30704 and dialkoxybenzophenones described in JP-B No. 60-26483, such as the following compound.

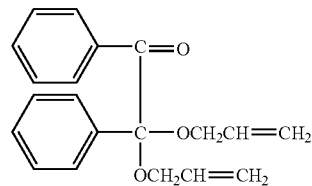

benzoin ethers described in JP-B Nos. 60-26403 and 62-81345, such as the following example.

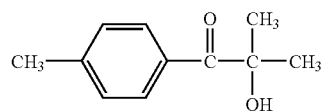

α-aminobenzophenones described in JP-B No. 1-34242, U.S. Pat. No. 4,318,791 and EP Patent No. 0284561A1, such as the following compounds.

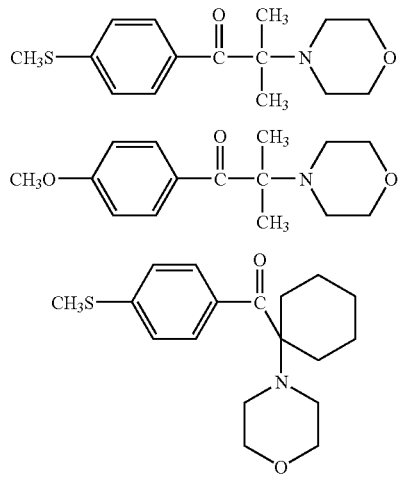

p-di(dimethylaminobenzoyl)benzenes described in JP-A No. 2-211452, such as the following compound.

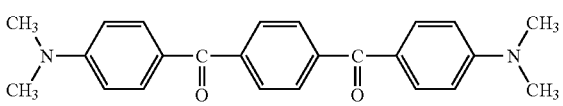

Preferable examples further include thio-substituent aromatic ketones described in JP-A 61-194062, such as the following compound.

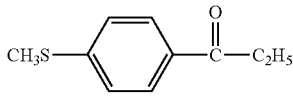

acylphosphine sulfides described in JP-B No. 2-9597, such as the following compounds.

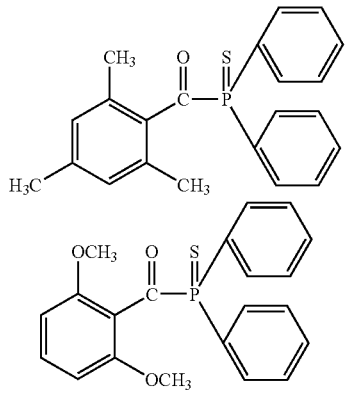

acylphosphines described in JP-B No. 2-9596, such as the following compounds.

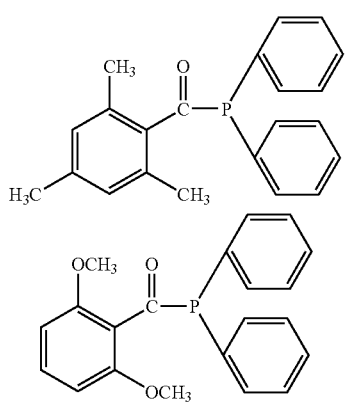

further, thioxanthones described in JP-B No. 63-61950 and coumarins and the like described in JP-B No. 59-42864.

Specific examples of the particularly preferred modes of the tetracarboxylic dianhydride represented by Formula (II), in which $R^1$ is the polymerization initiating group, are shown below. However, the invention is not limited to these examples.

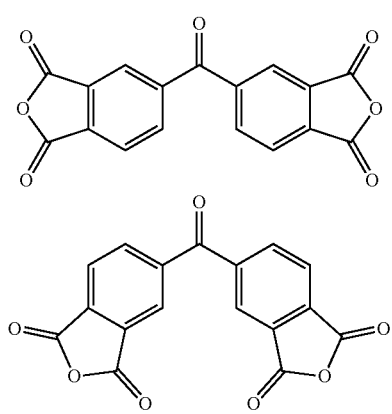

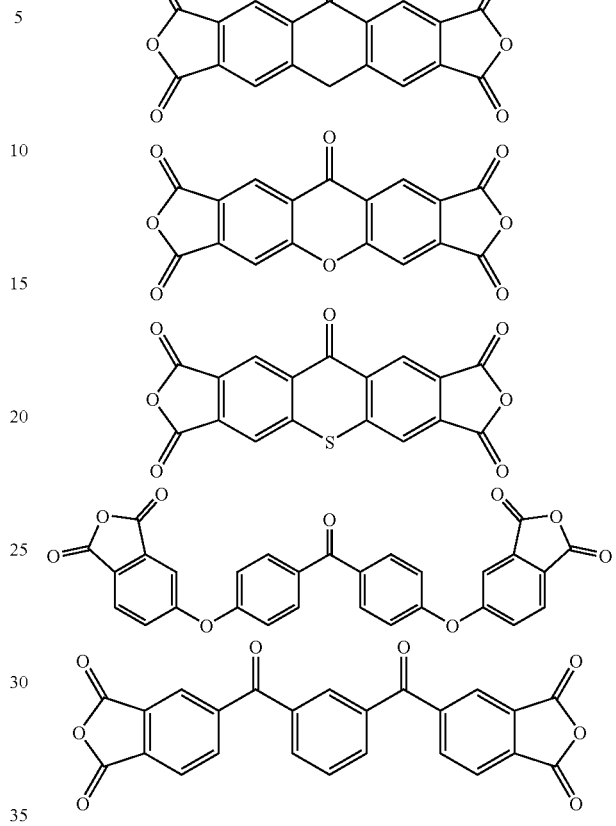

Diamine Compound Compound Represented by Formula (III)

As the diamine compound represented by Formula (III), any diamine compounds, in which $R^2$ is selected from an aromatic group, an aliphatic group, an aromatic group having aromatic groups mutually combined via a cross-linking agent and a group including the structure having the polymerization initiation property can be used. In particular, it is preferable to use a diamine compound in which $R^2$ is the group including the structure having the polymerization initiation property. Further, the diamine compound represented by Formula (III) may be used singly, or two or more kinds thereof of may be used in a combined manner.

Specific examples of the diamine compound represented by Formula (III) include m-phenylenediamine, p-phenylenediamine, benzidine, 4,4''-diaminoterphenyl, 4,4-diaminoquaterphenyl, 4,4''-diaminodiphenylether, 4,4'-diaminodiphenylmethane, diaminodiphenylsulfone, 2,2-bis(p-aminophenyl)dimethylmethane, 2,2-bis(p-aminophenyl) hexafluorodimethylmethane, 1,5-diaminonaphthalene, 2,6-diaminonaphthalene, 3,3'-dimethylbenzidine, 3,3'-dimethoxybenzidine, 3,3'-dimethyl-4,4-diaminodiphenylether, 3,3'-dimethyl-4,4'-diaminodiphenylmethane, 1,4-bis(p-aminophenoxy) benzene, 4,4-bis(p-aminophenoxy)biphenyl, 2,2-bis{4-p-aminophenoxy)phenyl}dimethylmethane, 2,3,5,6-tetramino-p-phenylenediamine, and the like.

Similarly as in $R^1$ in Formula (II), examples of the structure having the polymerization initiation property constituting the group including the structure having the polymerization initiation property represented by $R^2$ include (a) aromatic ketones, (b) onium salt compounds, (c) organic peroxides, (d) thiocompounds, (e) hexarylbiimidazole compounds, (f) ketoxime ester compounds, (g) borate compounds, (h) azinium compounds, (i) active ester compounds, (j) compounds having a carbon halogen bond, (k) pyridiums compound, and the like.

When $R^2$ is the group including the structure having the polymerization initiation property, as the bonding of the amino group and $R^2$, two of which are included in Formula (III), the amino group may be bonded at any spot in the structure having the polymerization initiation property; or alternatively the amino group may be bonded via a linking group.

In terms of the heat resistance of the polyimide, (a) aromatic ketones are preferably selected in the case of the structure having the polymerization initiation property. Specific examples of (a) aromatic ketones are the same as in the examples mentioned in reference to Formula (II). However, the invention is not limited thereto.

Specific examples of the diamine compound represented by Formula (III), in which $R^2$ is particularly preferably the group including the structure having the polymerization initiation property, are shown below. However, the invention is not limited thereto.

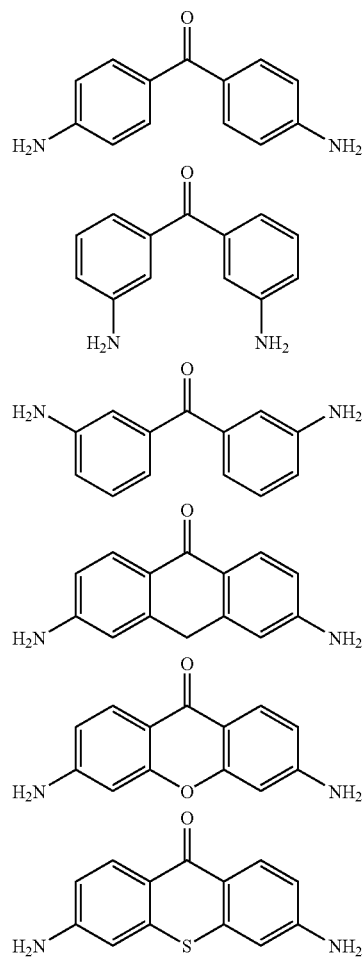

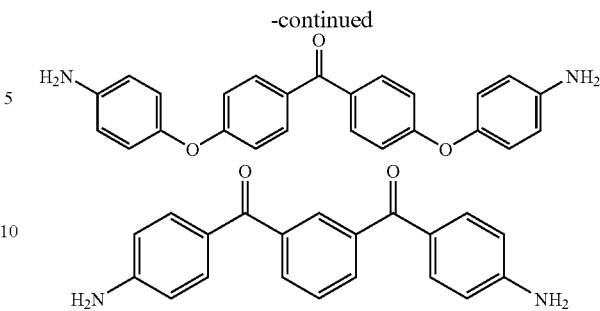

-continued

Method of Synthesizing Compound Represented by Formula (I)

The compound represented by Formula (I), which is the polyimide precursor compound, is synthesized using the tetracarboxylic acid dianhydride represented by Formula (II), the diamine compound represented by Formula (III) and, if desirable, a dialcohol compound. More specifically, the synthesis can be performed, for example, in such a manner that the diamine compound represented by Formula (III) is dissolved in a solvent, the tetracarboxylic acid dianhydride represented by Formula (II) is added thereto, and then, the solvent is heated at a reaction temperature selected from below freezing, room temperature and a temperature of 40 to 80° C. depending on what material is used.

Solvent

The solvent used in the synthesis can be appropriately selected with regard to a solubility of each constituent. Suitable examples include ethylene dichloride, cyclohexanone, cyclopentanone, 2-heptanone, methylisobutyl ketone, γ-butyrolactone, methyletyl ketone, methanol, ethanol, dimethylmidazolidinone, ethyleneglycolmonomethyl ether, ethyleneglycolmonoethyl ether, ethyleneglycoldimethyl ether, 2-methoxyethyl acetate, ethyleneglycol monoethylether acetate, propyleneglycol monomethylether (PGME), propyleneglycol monomethyletheracetate (PGMEA), tetraethyleneglycoldimethylether, triethyleneglycol monobutylether, triethyleneglycolmonomethylether, isopropanol, ethylenecarbonate, acetic ether, butyl acetate, methyl lactate, ethyl lactate, methyl methoxypropionate, ethyl ethoxypropionate, methyl, ethyl pyruvate, propyl pyruvate, N,N-dimethyl formamide, dimethyl acetamide, dimethyl sulfoxide, N-methylpyrrolidone, tetrahydrofuran, diisopropyl benzene, toluene, xylene, mesitylene, N-methyl-2-pyrrolidone, dimethylformamide, hexamethylphosphorous amide, and the like. These solvents can be used singly or in a combination of two or more.

Among these, examples of particularly preferable solvents include propyleneglycol monomethyletheracetate, propyleneglycolmonomethylether, 2-heptanone, cyclohexanone, γ-butyrolactone, ethyleneglycolmonomethyl ether, ethyleneglycol monoethylether, ethyleneglycol monoethylether acetate, propyleneglycol monomethylether, propyleneglycol monoethylether, ethylene carbonate, butyl acetate, methyl lactate, ethyl lactate, methyl methoxypropionate, ethyl ethoxypropionate, N-methylpyrrolidone, N,N-dimethyl formamide, tetrahydrofuran, methylisobutyl ketone, xylene, mesitylene, and diisopropyl benzene.

A weight-average molecular weight of the polyimide precursor compound represented by Formula (I) is generally approximately 1,000-10,000,000, preferably approximately 1,000-1,000,000, and more preferably approximately 2,000-1,000,000.

A volume of the group including the structure having the polymerization initiation property included in the polyimide precursor represented by Formula (I) as $R^1$ and/or $R^2$ is preferably 10 mole % to 90 mole % and more preferably 20 mole % to 90 mole % in terms of the graft polymerization reaction performed on the base material surface.

<2> Molding of Polyimide Precursor

Subsequent to the process <1>, the polyimide precursor is molded. As the polyimide precursor that is used, the compound represented by Formula (I) and obtained in <1> may be used alone, or a polyimide precursor having a different structure (compound including no group having the polymerization initiation property) may be jointly used. When different types of polyimide precursors are used, as the content ratio of the compound represented by Formula (I) and the different polyimide precursor included in the entire polyimide precursor, the compound represented by Formula (I) is preferably included in an amount of at least 50 mass %, and more preferably in an amount of at least 80 mass %.

There is no particular limitation to a shape of the molded polyimide precursor. However, a film shape or a plate shape is preferable in terms of manufacturing convenience.

Molding

As a method of the molding, any of biaxial stretching film molding, injection molding, extrusion molding, blow molding, compression molding, reaction molding, FRP molding, heat molding, roll sheet molding, calender molding, laminated molding and rotational molding can be applied. The polyimide precursor can be spread on a glass substrate or the like and dried to be thereby formed into a film shape.

<3> Change of Structure of Polyimide Precursor into Polyimide Structure by Heating Process A heating process is applied to the polyimide precursor molded in <2>. The heating process is performed at 100 to 450° C. for one minute to one hour, and the structure of the compound represented by Formula (I) (polyimide precursor) is thereby changed into the structure of the polyimide represented by the following Formula (IV). Thus, the medium including the polyimide having the polymerization initiating moiety in the skeleton thereof according to the invention can be obtained.

Formula (IV)

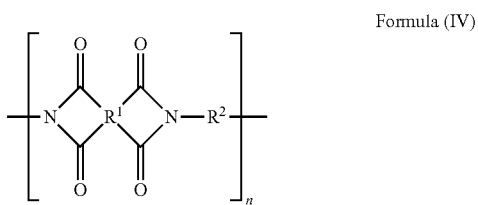

$R^1$ and $R^2$ and n in Formula (IV) and preferable ranges thereof are equivalent to $R^1$ and $R^2$ and n in Formula (I) are preferable ranges thereof.

Specific examples of the compound represented by Formula (IV), which is the polyimide precursor, are listed below. However, the invention is not limited to these examples.

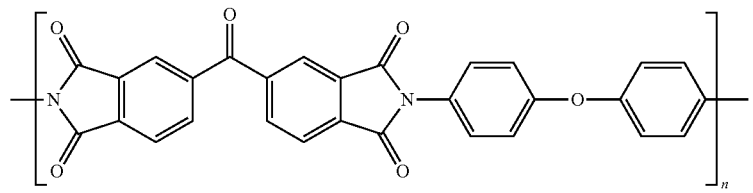

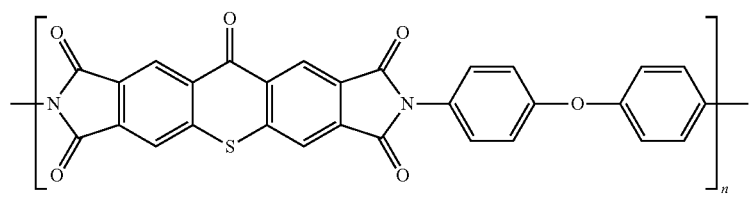

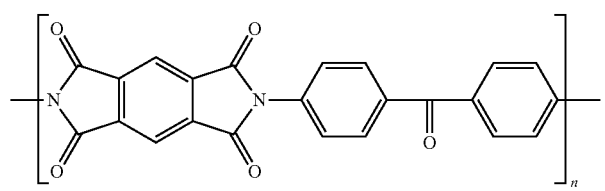

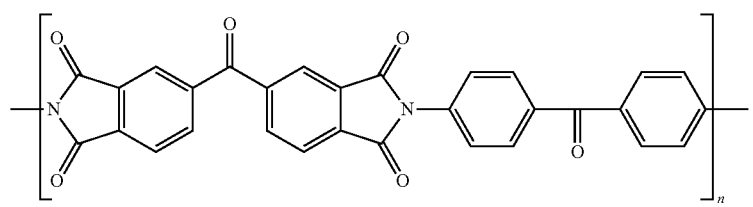

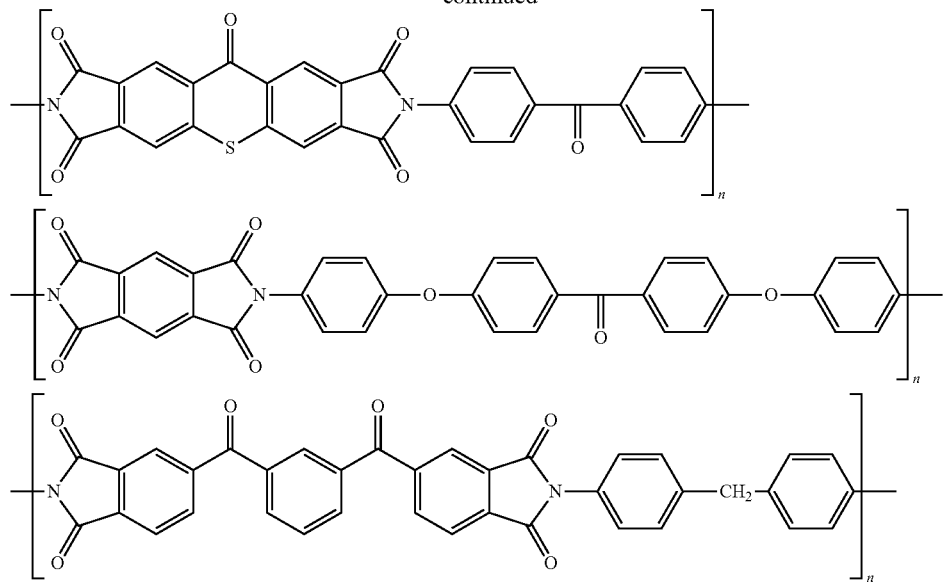

Pattern Forming

In the pattern forming, the region where the polymer directly bonded to the base material surface and having the polar group or the functional group that interacts with the electroless plating catalyst or the precursor thereof (hereinafter, the region where the graft polymer having the functional group that interacts with the electroless plating catalyst or the precursor thereof is generated in the pattern shape is referred to as an "interaction-property region") is generated in the pattern shape is formed on the surface of the polyimide base material obtained as described.

As described above, the preferred modes of the metallic (fine particle dispersive) pattern forming method according to the invention are the pattern forming method (1) and the pattern forming method (2). Hereinafter, the pattern forming in the pattern forming method (1) and the pattern forming method (2) are described in detail.

Pattern Forming by Means of Metallic (Fine Particle Dispersive) Pattern Forming Method In the pattern forming method (1), the polymer compound layer made of the polymer compound directly bonded to the base material surface and having the functional group whose hydrophilicity/hydrophobicity is changed, whose structure is changed into the structure that interacts with the electroless plating catalyst or the precursor thereof, or which ceases to interact with the electroless plating catalyst or the precursor thereof, in response to heat, acid or radiation (hereinafter, referred to as a "pattern forming layer"), is provided on the surface of the base material including the polyimide having the polymerization initiating moiety according to the invention, and heat, acid or radiation is applied to the polymer compound in the pattern shape so that the pattern comprised of the hydrophilic region and hydrophobic region according to the first or the second mode or the region where the graft polymer directly bonded to the base material surface and having the functional group that interacts with the electroless plating catalyst or the precursor thereof is generated in the pattern shape (interaction-property region) according to the third mode is formed on the base material surface.

More specifically, in the present method, the pattern forming layer is formed by generating the polymer compound having the functional group whose hydrophilicity/hydrophobicity is changed, whose structure is changed into the structure that interacts with the electroless plating catalyst or the precursor thereof, or which ceases to interact with the electroless plating catalyst or the precursor thereof, in response to heat, acid or radiation on the entire surface of the polyimide base material by means of the surface graft polymerization which will be described later. Thereafter, heat, acid or radiation is applied to the pattern forming layer in the pattern shape to thereby change the polarity of the functional group whose hydrophilicity/hydrophobicity is changed, change the functional group that does not interact with the electroless plating catalyst or the precursor thereof into the structure that interacts with the electroless plating catalyst or the precursor thereof, or make the functional group that interacts with the electroless plating catalyst or the precursor thereof cease to interact with the electroless plating catalyst or the precursor thereof in the energy-applied part of the polymer compound. As a result, the pattern comprised of the hydrophilic and hydrophobic regions or the region where the graft polymer having the functional group that interacts with the electroless plating catalyst or the precursor thereof is generated in the pattern shape (interaction-property region) is formed.

Hereinafter, the "functional group whose hydrophilicity/hydrophobicity is changed in response to heat, acid or radiation", the "functional group whose structure is changed into the structure that interacts with the electroless plating catalyst or the precursor thereof" and the "functional group that ceases to interact with the electroless plating catalyst or the precursor thereof in response to heat, acid or radiation" are appropriately referred to as a "polarity conversion group".

Surface Graft Polymerization

The pattern forming layer according to the pattern forming method (1) is formed by means generally called "surface graft polymerization". Graft polymerization is a method in which an active species is provided on a chain of the polymer compound to thereby further polymerize another monomer initiating the polymerization so that the graft polymer is synthesized. When the polymer compound provided with the active species forms a solid surface, it is specifically called surface graft polymerization. In the invention, the surface of the polyimide base material is the solid surface described above. A photo-graft method, in which the energy is provided through photoirradiation, is preferably employed as the method of the surface graft polymerization.

The pattern forming layer according to the metallic pattern forming method (1) can be formed at any desirable spot on the base material. For example, when a polyimide base material having a film shape or plate shape is used, the pattern forming layer may be on one surface of the base material or on both surfaces thereof. The formation of the metallic pattern on both surfaces of the base material can further increase density when the metallic pattern is applied to circuit wiring or the like.

In forming the pattern forming layer, when the polyimide base material having the film shape or plate shape is used, for example, the surface graft polymerization may be concurrently performed on both surfaces of the base material, or may be performed on one surface first and then performed on the other surface. As a result, because the pattern forming layer is provided at any desirable spot on the base material, a metallic pattern can be formed in accordance with the pattern forming layer when a plating process such as an electroless plating, which will be described later, is performed.

Energy Application in Surface Graft Polymerization

Regarding the energy application for generating the active site where the polymerization initiating moiety is present on the polyimide base material surface, heating or radiation such as light exposure, for example, can be applied. More specifically, the heating can be performed by means of a UV lamp, photoirradiation using a visible light beam, a hot plate or the like.

Examples of a light source include a mercury vapor lamp, metallic halide lamp, xenon lamp, chemical lamp, carbon ark light, and the like can be mentioned. As further choices, g rays, i rays and deep-UV light can also be used.

A length of time required for the energy application is generally between ten seconds and five hours but may vary depending on a desired generation volume of the graft polymer and light source.

Next, the functional group whose hydrophilicity/hydrophobicity is changed in response to heat, acid or radiation is described. There are two kinds of the functional group(s) in the invention, as follows:

(A) Hydrophilicity/hydrophobicity is changed in response to heat or acid; and (B) Hydrophilicity/Hydrophobicity is Changed in Response to Radiation (Light).

The functional groups whose hydrophilicity/hydrophobicity are changed in response to heat or acid is described in the following.

(A) Functional Groups Whose Hydrophilicity/Hydrophobicity is Changed in Response to Heat or Acid First, the (A) functional group whose hydrophilicity/hydrophobicity is changed in response to heat or acid is described. There are two types of polarity conversion groups whose hydrophilicity/hydrophobicity is changed in response to heat or acid, which are a hydrophobic functional group that changes into a hydrophilic functional group and a hydrophilic functional group that changes into a hydrophobic functional group.

(A-1) Hydrophobic Functional Group that Changes into Hydrophilic Functional Group Effective examples of the hydrophobic functional group changing into a hydrophilic functional group include publicly known functional groups described in references, such as alkylsulfonic acid esters, disulfones, and sulfoneimides described in Japanese Patent Application Laid-Open (JP-A) No. 10-282672, alkoxyalkyl esters described in EPO652483 and WO92/9934, t-butyl esters described in "Macromolecules", vol. 21, pp. 1477 by H. Ito, carboxylic acid esters protected by an acid decomposable group described in publications such as silyl esters and vinyl esters, and the like.

Further, iminosulfonate groups described in "Surface" vol. 133 (1995), pp. 374 by Masahiro Kadooka, β-ketone sulfonic acid esters described in "Polymer preprints, Japan" vol. 46 (1997), pp. 2045 by Masahiro Kadooka, and nitrobenzyl sulfonate compounds described in Japanese Patent Application Laid-Open (JP-A) No. 63-257750 can also be used. However, the invention is not limited to the mentioned functional groups.

Among these functional groups, ones that are particularly superior are a secondary alkylsulfonic acid ester group shown below, a tertiary carboxylic acid ester group, and an alkoxyalkyl ester group shown below.

In the invention, a secondary alkylsulfonic acid ester group, which is superior as the functional group whose hydrophobicity changes into hydrophilicity in response to heat or acid, is represented by the following Formula (A).

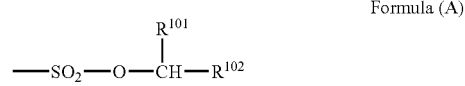

Formula (A)

($R^{101}$ and $R^{102}$ in Formula (A) represent a substituted or non-substituted alkyl group. Further, $R^{101}$ and $R^{102}$ may form a ring together with a secondary carbon atom (CH) to which $R^{101}$ and $R^{102}$ are bonded.)

In the invention, a secondary alkylsulfonic acid ester group, which is even more superior as the functional group whose hydrophobicity changes into hydrophilicity in response to heat or acid, is represented by the following Formula (A)'.

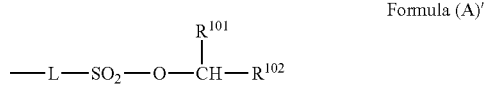

Formula (A)'

(In Formula (A)', L represents an organic group composed of a multivalent non-metal atom which is required for bonding to the polymer skeleton, and $R^{101}$ and $R^{102}$ are equivalent to $R^{101}$ and $R^{102}$ in Formula (A).)

$R^{101}$ and $R^{102}$ in Formula (A) (and Formula (A)') represents the substituted or non-substituted alkyl or substituted or non-substituted aryl group. Further, $R^{101}$ and $R^{102}$ may form a ring together with a secondary carbon atom (CH) to which $R^{101}$ and $R^{102}$ are bonded. When $R^{101}$ and $R^{102}$ represent the substituted or non-substituted alkyl group, examples of the alkyl group include a straight-chain, branched-chain or circular-chained alkyl group such as a methyl group, ethyl group, isopropyl group, t-butyl group and cyclohexyl group, and those which have 1 to 25 carbon atoms are favorably used. When $R^{101}$ and $R^{102}$ represent the substituted or non-substituted aryl group, examples of the aryl group include a carbocyclic aryl group and heterocyclic aryl group. As the carbocyclic aryl group, a phenyl group, naphthyl group, anthracenyl group, pyrenyl group or the like having 6 to 19 carbon atoms is used. As the heterocyclic aryl group, a pyridyl group, furyl group, quinolyl group in which benzene rings are condensed, benzofuryl group, thioxanthone group, carbazole group or the like having 3 to 20 carbon atoms and 1 to 5 heteroatoms is used.

When $R^{101}$ and $R^{102}$ represent the substituted alkyl group or substituted aryl group, examples of the substituted group include an alkoxy group having 1 to 10 carbon atoms such as a methoxy group or ethoxy group; a halogen atom such as a fluorine atom, chlorine atom or bromine atom; a halogen-substituted alkyl group such as a trifluoromethyl group or trichloromethyl group; an alkoxycarbonyl group or aryloxycarbonyl group having 2 to 15 carbon atoms such as a methoxycarbonyl group, ethoxycarbonyl group, t-butyloxycarbonyl group or p-chlorophenyloxycarbonyl group; a hydroxyl group; an acyloxy group such as acetyloxy, benzoyloxy and p-diphenylaminobenzoyloxy; a carbonate group such as a t-butyloxycarbonyloxy group; an ether group such as a t-butyloxycarbonylmethyloxy group or 2-pyranyloxy group; a substituted or non-substituted amino group such as an amino group, dimethylamino group, diphenylamino group, morpholino group or acetylamino group; a thioether group such as a methylthio group or phenylthio group; an alkenyl group such as a vinyl group or steryl group; a nitro group; a cyano group; an acyl group such as a formyl group, acetyl group or benzoyl group; an aryl group such as a phenyl group or naphtyl group; and a heteroaryl group such as pyridyl group, and the like. When $R^{101}$ and $R^{102}$ represent the substituted or non-substituted aryl group, in addition to the groups mentioned above, an alkyl group such as a methyl group or ethyl group can also be used as the substituent.

As $R^{101}$ and $R^{102}$, the substituted or non-substituted alkyl group, which is superior in maintaining stability over time, is preferably used. More specifically, an alkyl group substituted by an electron withdrawing group such as an alkoxy group, carbonyl group, alkoxycarbonyl group, cyano group or halogen group, or an alkyl group such as a cyclohexyl group or norbornyl group are particularly preferable. In terms of a physical property value, a compound which exhibits a chemical shift of a secondary methine hydrogen in a proton NMR in a magnetic field range lower than 4.4 ppm in heavy chloroform is preferably used, and a compound which exhibits the chemical shift in a magnetic field range lower than 4.6 ppm is more preferably used. The presumed reason why the alkyl group substituted by the electron withdrawing group is preferable is that a carbocation, which appears to be generated as an intermediate agent at the time of a heat decomposing reaction, is made unstable by the electron withdrawing group, and the decomposition is thereby controlled. More specifically, the structures represented by the following formulas are particularly preferable for the structure of $—CHR^{101}R^{102}$.

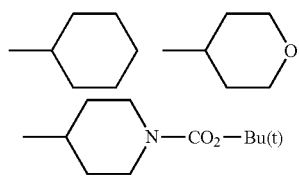

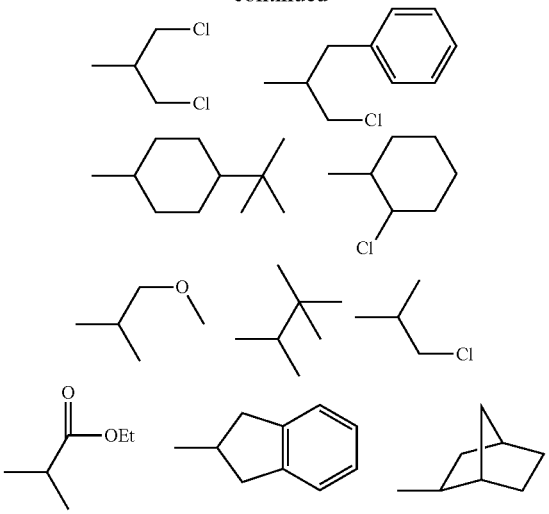

The multivalent linking group composed of the nonmetallic atom, which is represented by L in Formula (A)' consists of 1 to 60 carbon atoms, 0 to 10-nitrogen atoms, 0 to 50 oxygen atoms, 1 to 100 hydrogen atoms and 0 to 20 sulfur atoms. More specific examples of the linking group include combinations of two or more of those selected from the group consisting of a multivalent naphthalene, multivalent anthracene and the following structure units.

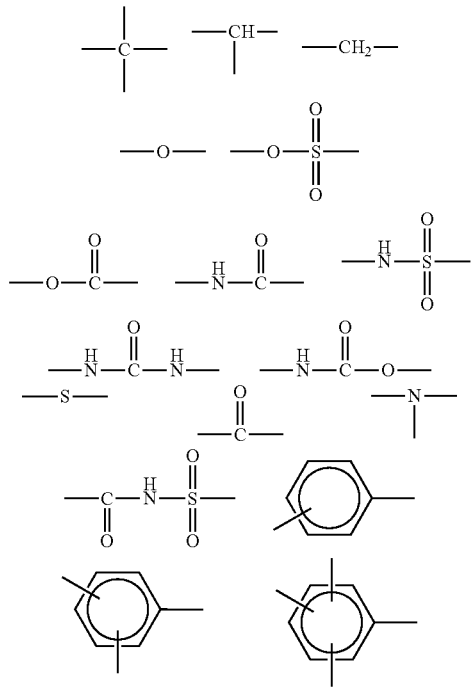

When the multivalent linking group has a substituent group, examples of the substituent group include an alkyl group having 1 to 20 carbon atoms such as a methyl group or ethyl group, an aryl group having 6 to 16 carbon atoms such as a phenyl group or naphthyl group, an acyloxy group having 1 to 6 carbon atoms such as a hydroxyl group, carboxyl group, sulfonamide group, N-sulfonylamide group or acetoxy group, an alkoxy group having 1 to 6 carbon atoms such as a methoxy group or ethoxy group, a halogen atom such as chlorine or bromine, an alkoxycarbonyl group having 2 to 7 carbon atoms such as a methoxycarbonyl group, ethoxycarbonyl group or cyclohexyloxycarbonyl group, a carbonate ester group such as a cyano group or t-butylcarbonate, and the like.

In the invention, an alkoxyalkyl ester group that is especially superior as the functional group whose hydrophobicity is changed to hydrophilicity in response to heat or acid is represented by the following Formula (B).

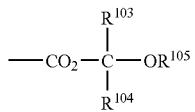

Formula B

In the above-mentioned formula, $R^{103}$ represents a hydrogen atom, $R^{104}$ represents a hydrogen atom or an alkyl group having at most 18 carbon atoms, and $R^{105}$ represents an alkyl group having at most 18 carbon atoms. Further, two of $R^{103}$, $R^{104}$ and $R^{105}$ may be bonded to thereby form a ring. In particular, it is preferable that $R^4$ and $R^5$ are bonded to thereby form a five- or six-member ring.

As described above, the secondary alkylsulfonic acid ester group represented by Formula (A) is particularly preferable as the hydrophobic functional group that changes into a hydrophilic functional group in response to heat or acid according to the invention. Specific examples of the functional groups represented by Formulas (A)-(B) and the tertiary carboxylic acid ester group (functional groups (1) to (13)) are shown below.

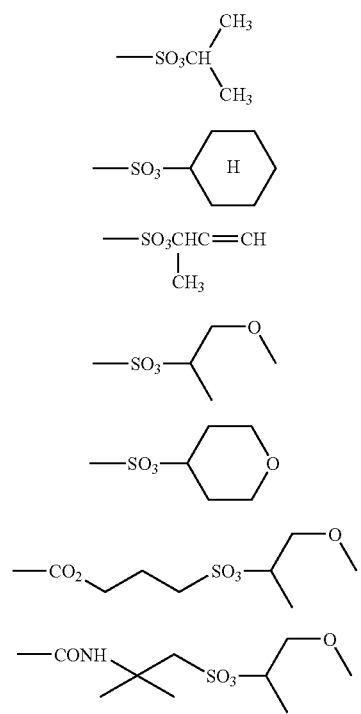

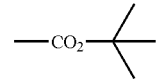

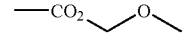

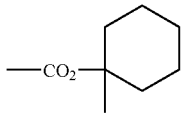

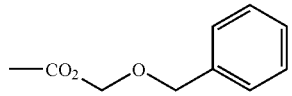

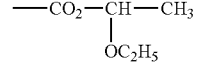

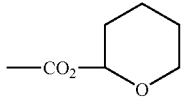

(A-2) Hydrophilic Functional Group that Changes into Hydrophobic Functional Group in Response to Heat or Acid Examples of the hydrophilic functional group that changes into a hydrophobic functional group in response to heat or acid according to the invention include a polymer including an onium base, and in particular, polymers including ammonium salt described in Japanese Patent Application Laid-Open (JP-A) No. 10-296895 and U.S. Pat. No. 6,190,830. A more specific example is (meta)acryloyloxyalkyltrimethyl ammonium or the like. Further, carboxylic acid groups and carboxylic acid bases represented by the following Formula (C) are also preferable examples. However, the invention is not limited to these mentioned examples.

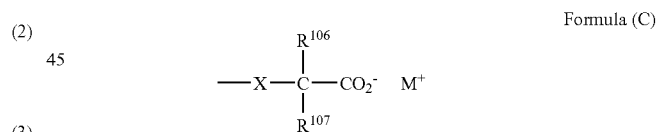

Formula (C)

(In the above formula, X represents —O—, —S—, —Se—, —NR$^{108}$—, —CO—, —SO—, —SO$_2$—, PO—, SiR$^{108}$R$^{109}$—, or —CS—; R$^{106}$, R$^{107}$, R$^{108}$ and R$^{109}$ each independently represent a monatomic group; and M represents an ion having a positive charge.)

Specific examples of $R^{106}$, $R^{107}$, $R^{108}$ and $R^{109}$ include —F, —Cl, —Br, —I, —CN, —R$^{110}$, —OCOR$^{110}$, —OCOOR$^{110}$, —OCONR$^{110}$R$^{111}$, —OCO$_2$R$^{110}$, —COR$^{110}$, COOR$^{110}$, —CONR$^{110}$R$^{111}$, —NR$^{110}$R$^{111}$, —NR$^{110}$—COR$^{111}$, —NR$^{110}$—COOR$^{111}$, —NR$^{110}$—CONR$^{111}$R$^{112}$, —SR$^{110}$, —SOR$^{110}$, —SO$_2$R$^{110}$, —SO$_3$R$^{110}$ and the like.

$R^{110}$, $R^{111}$ and $R^{112}$ each denote a hydrogen atom, alkyl group, aryl group, alkenyl group or alkynyl group.

More specifically, among those mentioned above, the hydrogen atom, alkyl group, aryl group, alkynyl and alkenyl group are preferable for $R^{106}$, $R^{107}$, $R^{108}$ and $R^{109}$.

M+ represents the ion having the positive charge, specific examples of which include a sodium ion, kalium ion, ammonium ion, lithium ion and the like, and further include a hydrogen ion.

Specific examples of the functional group represented by Formula (C), (functional groups (14) to (31)), are shown below.

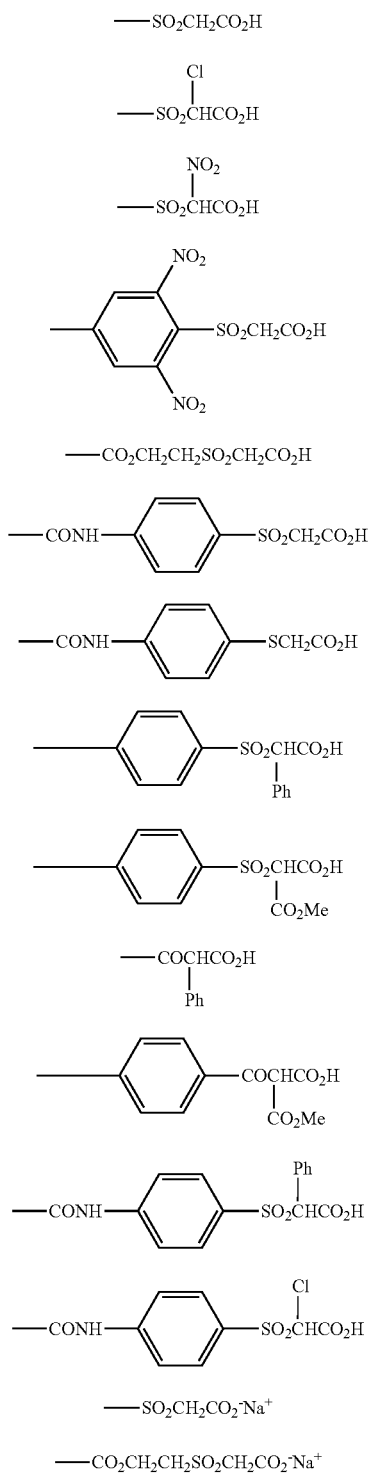

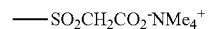

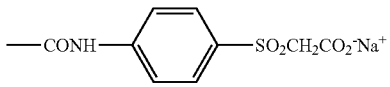

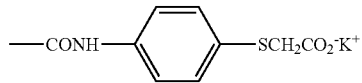

The polymer compound having the polarity conversion group according to the invention may be a homopolymer composed of a monomer or a copolymer composed of at least two monomers each having any of the above-mentioned functional groups. A copolymer including a monomer other than the monomers having any of the foregoing functional groups may be used as far as the effect of the invention is not undermined.

Specific examples of the monomer having any of the above-mentioned functional groups are shown below.

The following are specific examples of the monomer having any of the functional groups represented by Formulas (A) or (B) (exemplified monomers (M-1) to (M-15)).

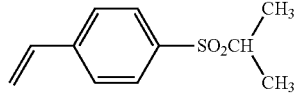

M-1

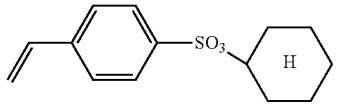

M-2

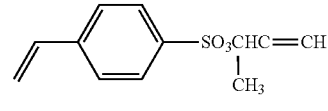

M-3

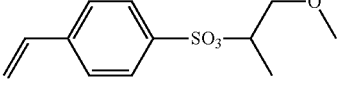

M-4

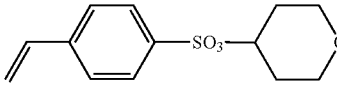

M-5

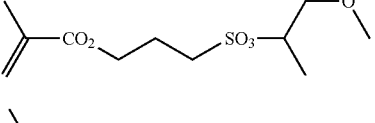

M-6

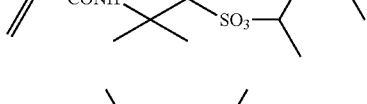

M-7

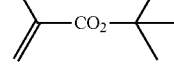

M-8

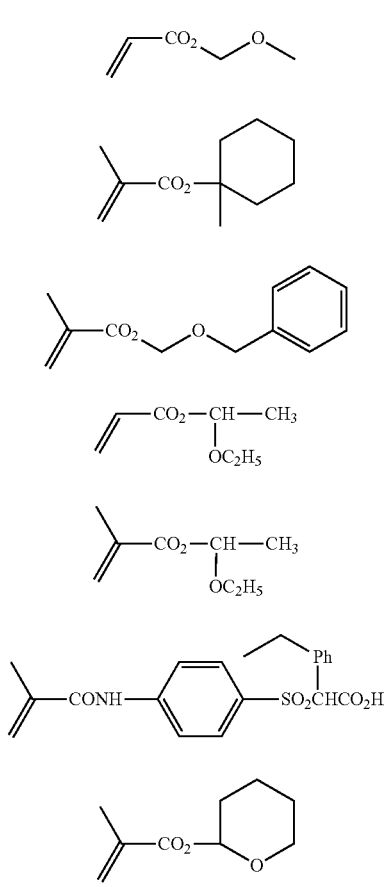

The following are specific examples of the monomer having the functional group represented by Formula (C) (exemplified monomers (M-16) to (M-33)).

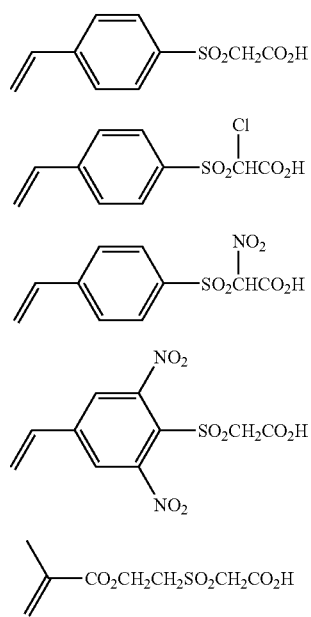

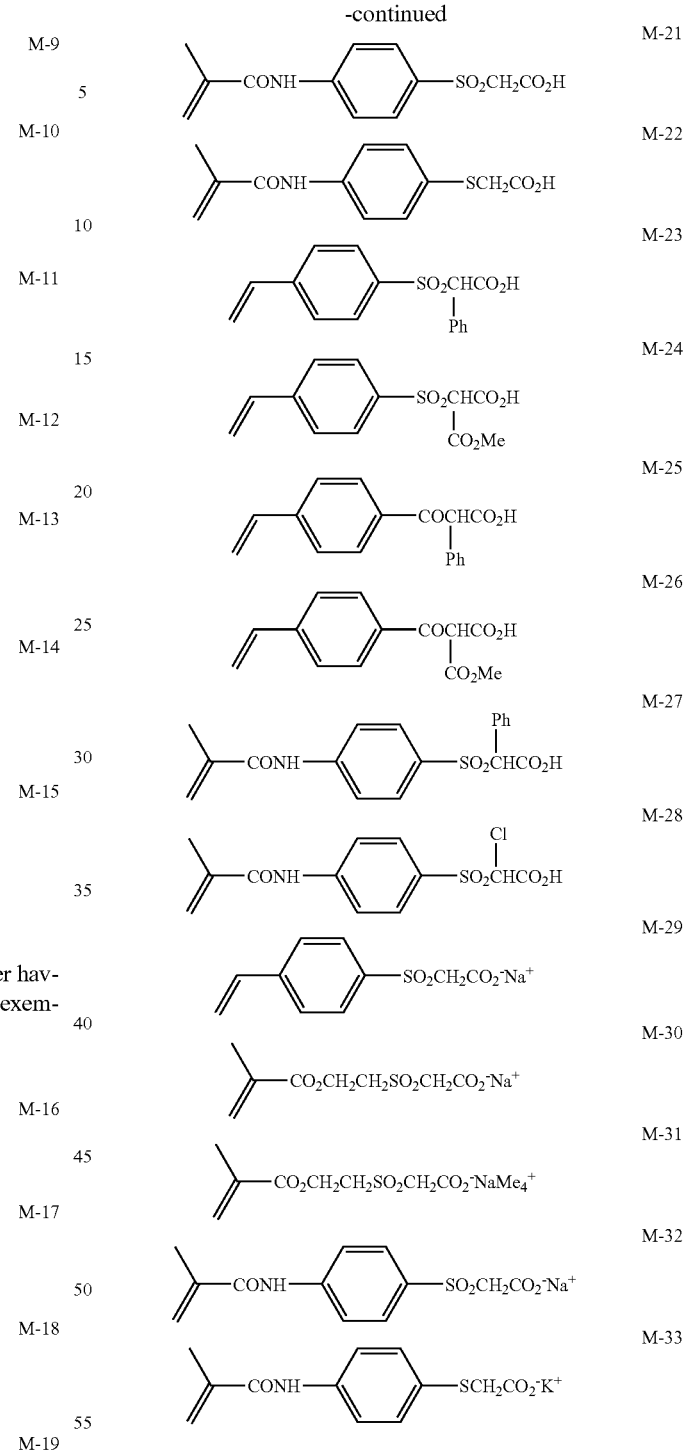

Photo-Thermal Converting Material

When the applied energy is a light energy such as IR laser, a photo-thermal converting material for converting the light energy into a thermal energy is preferably included in a pattern forming material. The photo-thermal converting material may be included in the pattern forming layer or medium, or may be included in a layer separately provided for including the photo-thermal converting material.

As the photo-thermal converting material usable in the invention, any substance can be used as long as it is capable of absorbing a UV light, visible light beam, infrared ray, white light or the like and converting them into heat. For example, carbon black, carbon graphite, pigments, phthalocyanine compound pigments, iron powder, black lead powder, purple powder, lead oxide, silver oxide, chrome oxide, iron sulfide, chrome sulfide, and the like can be mentioned. The especially preferably substances are dyes, pigments or metallic fine particles having a maximum absorption wavelength in the range of 760 nm to 1200 nm, which is a range of exposure wavelength of an infrared laser used for an energy application.

As the dye, commercially available dyes and publicly known dyes described in documents (for example, "Dye Handbook" 1970 edition, edited by the Society of Synthetic Organic Chemistry, Japan). More specifically, dye such as azo dyes, metallic complex salt azo dyes, pyrazolone azo dyes, anthraquinone dyes, phthalocyanine dyes, carbonium dyes, quinoneimine dyes, methine dyes, cyanine dyes, or metallic thiolate complexes can be mentioned. Preferable examples of dyes include, for example: cyanine dyes described in JP-A 58-125246, 59-84356, 59-202829, 60-78787; methine dyes described in Publication of Japanese Patent Application Laid-Open (JP-A) Nos. 58-173696, 58-181690, 58-194595 and the like; naphthoquinone dyes described in JP-A No. 58-112793, 58-224793, 59-48187, 59-73996, 60-52940, No. 60-63744 and the like; squarylium dyes described in JP-A No. 58-112792 and the like; and cyanine dyes described in GB Patent No. 434,875, and the like.

Near infrared absorbing sensitizers described in U.S. Pat. No. 5,156,938 are also preferably used. Further, preferable examples include substituted arylbenzo (thio)pyrylium salts described in U.S. Pat. No. 3,881,924, trimethine thiopyrylium salts described in Japanese Patent Application Laid-Open (JP-A) No. 57-142645 (U.S. Pat. No. 4,327,169), pyrylium compounds described in JP-A Nos. 58-181051, 58-220143, 59-41363, 59-84248, 59-84249, 59-146063, and 59-146061, cyanine dyes described in JP-A No. 59-216146, pentamethine thiopyrylium salts described in U.S. Pat. No. 4,283,475, pyrylium compounds described in JP-B Nos. 5-13514 and 5-19702, and the like. As another preferable example of the dye, near infrared absorbing dyes represented by either Formulas (I) or (II) described in the specification of U.S. Pat. No. 4,756,993 can also be mentioned. As the most preferable examples of the dyes, cyanine dyes, squarylium dyes, pyrylium salts, and nickel thiolate complexes can be mentioned.

As usable pigments, commercially available pigments and pigments described in: the Color Index (C. I.) Handbook, "*Latest Pigments Handbook*", 1977 edition, edited by the Society of Pigment Technology, Japan; "*Latest Applied Technology of Pigment*", 1986 edition, published by CMC; and "*Printing Ink Technology*", 1984 edition, published by CMC can be used. Examples of kinds of the pigments include black pigments, yellow pigments, orange pigments, brown pigments, red pigments, purple pigments, blue pigments, green pigments, fluorescent pigments, metallic powder pigments, and polymer-bound dye. Specific examples of usable pigments include insoluble azo pigments, azo lake pigments, condensed azo pigments, chelate azo pigments, phthalocyanine compound pigments, anthraquinone compound pigments, perylene compound pigments, perinone compound pigments, thioindigo compound pigments, quinacridone compound pigments, dioxazine compound pigments, isoindolinone compound pigments, quinophthalone compound pigments, dyeing lake pigments, azine pigments, nitroso pigments, nitro pigments, natural pigments, fluorescent pigments, inorganic pigments, carbon black, and the like. Among the mentioned pigments, carbon black is preferably used.

Examples of the usable metallic fine particle include a metallic fine particles composed of Au, Ag, Pt, Cu, Ni, Zn, Pd, Cr, Fe, Pb or the like, or a metallic fine particles composed of an oxide or sulfide of any of these metals. Specific examples thereof include iron powder, black lead powder, purple powder, lead oxide, silver oxide, chrome oxide, iron sulfide, chrome sulfide and the like.

When the photo-thermal converting material is used, in view of the sensitivity, a ratio of an amount of the photo-thermal converting material is preferably 0.01 to 50 mass % and more preferably 0.1 to 10 mass % relative to the total solid content of the layer including the photo-thermal converting material. When a dye is used as the photo-thermal converting material, a preferable ratio of an amount of the dye is 0.5 to 10 mass % relative to the total solid content of the layer including the dye. When a pigment, is used as the photo-thermal converting material, a preferable ratio of an amount of the pigment is 3.1 to 10 mass % relative to the total solid content of the layer including the pigment. When a metallic fine particle is used as the photo-thermal converting material, a preferable ratio of an amount of the metallic fine particle is 0.01 to 50 mass %, and more preferably 0.1 to 30 mass % relative to the total solid content of the layer including the metallic fine particle.

Acid Generating Substance

As a method for imparting an acid to the pattern forming layer (polymer layer) formed on the base material by means of the surface graft polymerization described above in order to convert the polarity, an acid generating substance may be included in the pattern forming layer, or the acid generating substance may be included in a layer separately provided for including the acid generating substance.

As the acid generating substance, a compound, which generates the acid in response to beat or light, is used. In general, examples include a light initiating agent for photo-cation polymerization, a light initiating agent for photo-radical polymerization, a photo-discharging agent or color-changing agent for dyes, a publicly known compound that generates acid by means of light which is used for a microresist or the like, a mixture of the above-mentioned substances, and the like. An appropriate substance can be selected from the above-mentioned and used.

Examples of the acid generating substance include: diazonium salts described in S. I. Schlesinger, *Photogr. Sci. Eng.*, 18,387 (1974), T. S., Bal et al., *Polymer,* 21, 423 (1980) or the like; ammonium salts described in JP-A No. 3-140140 or the like; phosphonium salts described in U.S. Pat. No. 4,069,055 or the like; iodonium salts described in JP-A Nos. 2-150848, 2-296514 or the like; sulfonium salts described in J. V. Crivello et al., *Polymer* J. 17, 73 (1985), U.S. Pat. No. 3,902,114, EP Patent Nos. 233,567, 297,443 or 297,442, U.S. Pat. Nos. 4,933,377, 4,491,628, 5,041,358, 4,760,013, 4,734,444, or 2,833,827, and DE Patent Nos. 2,904,626, 3,604,580, or 3,604,581;

selenonium salts described in J. V. Crivello et al., *Macromolecules,* 10 (6), 1307 (1977) or the like; onium salts such as arsonium salts described in C. S. Wen et al., Teh, *Proc. Conf. Rad. Curing ASIA*, pp. 478, Tokyo, Oct. (1988) or the like; organic halogen compounds described in JP-A No. 63-298339 or the like; organic metal/organic halogen compounds described in JP-A No. 2-161445 or the like; photo acid-generating agents having an o-nitrobenzyl protecting group described in S. Hayase et. at., *J. Polymer Sci.*, 25,753 (1987), JP-A No. 60-198538, 53-133022 or the like; compounds generating sulfonic acid through photo-decomposition, typical examples of which include iminosulfonates and the like described in JP-A Nos. 64-18143, 2-245756 and 3-140109; and disulfone compounds described in JP-A No. 61-166544 or the like.

The acid generating substance can be used at a ratio of 0.01 to 100 mass %, and preferably at a rate of 10 to 100 mass %, relative to the entire solid moiety of the layer including the acid generating substance from the standpoint of sensitivity.

(B) Functional Group Whose Hydrophilicity/Hydrophobicity is Changed in Response to Light In some of the functional groups whose polarity is changed, the polarity is changed in response to photoirradiation of at most 700 nm. The (B) functional group whose polarity is changed in response to light (polarity conversion group: polarity conversion group reacting to light of at most 700 nm) is characterized in that the polarity thereof is changed at a high sensitivity because decomposition, ring opening or a dimerizing reaction is generated, not through long wavelength exposure using infrared rays or the like, but directly through the photoirradiation of a predetermined wavelength. The functional group whose polarity is changed in response to photoirradiation of at most 700 nm is described below.

There are two kinds of the (B) functional group whose polarity is changed in response to light: (B-1) a hydrophobic functional group that changes into a hydrophilic functional group in response to light; and (B-2) a hydrophilic functional group that changes into a hydrophobic functional group in response to light.

(B-1) Hydrophobic Functional Group that Changes into Hydrophilic Functional Group in Response to Light As the hydrophobic functional group that changes into a hydrophilic group in response to light, for example, functional groups represented by the following Formulas (1)-(7) can be used.

It is preferable that Formulas (1)-(7) further include an organic group L including a multivalent non-metal atom required for the bonding to the polymer skeleton at a left-end bonding hand thereof. The multivalent linking group composed of the non-metal atom represented by L is equivalent to the above-described L. Among such functional groups, a substituted or non-substituted bivalent benzene ring group or an alkyl group having 1 to 8 carbon atoms is preferable. When the multivalent linking group has a substituent group, the substituent group is equivalent to the above-described L.

In the invention, an example of the hydrophobic functional group that changes into a hydrophilic functional group in response to light is represented by Formula (1).

The alkyl group represented by $R^{201}$ and $R^{202}$ preferably has 1 to 8 carbon atoms, examples of which include a methyl group, ethyl group, propyl group, butyl group, pentyl group, hexyl group, heptyl group, octyl group, isopropyl group, isobutyl group, s-butyl group, t-butyl group, cyclohexyl group, isopentyl group, neopentyl group, 1-methylbutyl group, isohexyl group, 2-ethylhexyl group, 2-methylhexyl group, cyclopentyl group and the like. $R^{201}$ and $R^{202}$ may be bonded to each other via a unit of $-(CH_2)_n-$ (n is an integer from 1 to 4).

It is preferable that, among the mentioned examples, $R^{201}$ and $R^{202}$ constitute a ring structure in which they are bonded to each other via the unit of $-(CH_2)_n$ and $-$ (n is an integer from 1 to 4).

The alkyl group represented by $R^{201}$ and $R^{202}$ may be substituted or non-substituted, and as a substituent to be introduced, a group of univalent non-metal atoms excluding hydrogen is used. Preferable examples thereof include a halogen atom such as F, Br, Cl or I, hydroxyl group, alkoxy group, amino group, formyl group, acyl group, carboxyl group, alkoxycarbonyl group, aryloxycarbonyl group, carbamoyl group, phenyl group, biphenyl group, naphthyl group, tolyl group, xylyl group, mesityl group, cumenyl group, chlorophenyl group, bromophenyl group, chloromethylphenyl group, hydroxyphenyl group, methoxyphenyl group, ethoxyphenyl group, phenoxyphenyl group, acetoxyphenyl group and the like.

The aromatic ring group represented by $R^{201}$ and $R^{202}$ preferably has 6 to 14 carbon atoms, and examples thereof include a phenyl group, biphenyl group, naphthyl group, and mesityl group. Among the mentioned examples, the phenyl group and naphthyl group are preferably used.

Further, the aromatic ring group represented by $R^{201}$ and $R^{202}$ may be substituted or non-substituted, and as a substituent to be introduced, a group of univalent non-metal atoms excluding hydrogen is used. Preferable examples include a halogen atom such as F, Br, Cl or I, hydroxyl group, alkoxy group, amino group, formyl group, acyl group, carboxyl group, alkoxycarbonyl group, aryloxycarbonyl group and the like.

As more specific examples of $R^{201}$ and $R^{202}$, those having a structure at a terminal thereof including a bonding carbonyl group and a nitrogen atom bonded to the carbonyl group, which are represented by the following formulas, are particularly preferable.

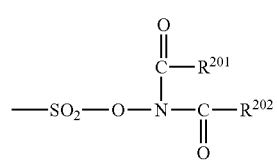

Formula (1)

($R^{201}$ and $R^{202}$ in Formula (1) each independently represent an alkyl group or aromatic ring group. $R^{201}$ and $R^{202}$ may be bonded to each other to thereby form a ring.)

$R^{201}$ and $R^{202}$ in Formula (1) each independently represent the alkyl group or aromatic ring group. $R^{201}$ and $R^{202}$ may be bonded to each other to thereby form a ring.

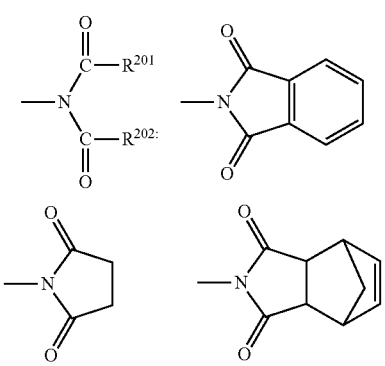

-continued

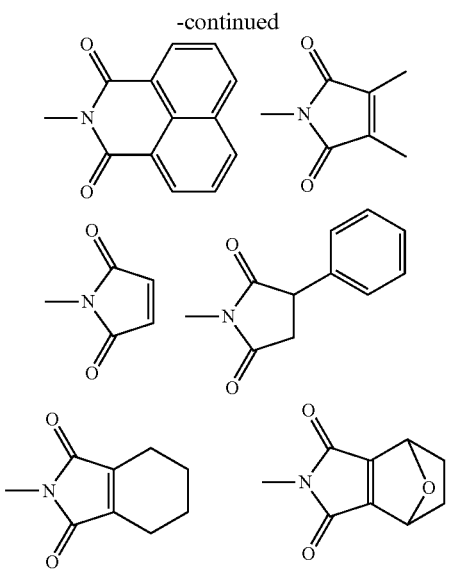

In the invention, an example of the hydrophobic functional group that changes into a hydrophilic group in response to light can be represented by the following Formula (2).

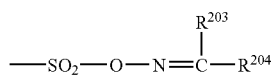

Formula (2)

($R^{203}$ and $R^{201}$ in Formula (2) each independently represent a univalent substituent group. $R^{203}$ and $R^{204}$ may be bonded to each other to thereby form a ring.)

$R^{203}$ and $R^{204}$ in Formula (2) each independently represent a univalent substituent group, and more specifically represent an alkyl group, hydroxyl group, alkoxy group, amino group, formyl group, acyl group, carboxyl group, cyano group or aromatic ring group.

When $R^{203}$ and $R^{204}$ are the akyl group, it is preferable that the number of carbon atoms is in the range of 1 to 8. Specific examples thereof include a methyl group, ethyl group, propyl group, butyl group, pentyl group, hexyl group, heptyl group, octyl group, isopropyl group, isobutyl group, s-butyl group, t-butyl group, isopentyl group, neopentyl group, 1-methylbutyl group, isohexyl group, 2-ethylhexyl group, 2-methylhexyl group, cyclopentyl group and the like. $R^{203}$ and $R^{204}$ may be bonded to each other via the unit of —$(CH_2)_n$— (n is an integer from 1 to 4).

Among the mentioned examples, $R^{203}$ and $R^{204}$ are preferably the methyl group, the ring structure in which they are bonded to each other via the unit of —$(CH_2)_n$— (n is an integer from 1 to 4) or the cyano group.

The alkyl group, hydroxyl group, alkoxy group, amino group, formyl group, acyl group, carboxyl group or cyano group represented by $R^{203}$ and $R^{204}$ may be substituted or non-substituted. As an introduced substituent group, a group of univalent non-metal atoms except for hydrogen is used. Preferable examples thereof include a halogen atom such as F, Br, Cl or I, hydroxyl group, alkoxy group, amino group, formyl group, acyl group, carboxyl group, alkoxycarbonyl group, aryloxycarbonyl group, carbamoyl group, phenyl group, biphenyl group, naphthyl group, tolyl group, xylyl group, mesityl group, cumenyl group, chlorophenyl group, bromophenyl group, chloromethylphenyl group, hydroxyphenyl group, methoxyphenyl group, ethoxyphenyl group, phenoxyphenyl group, acetoxyphenyl group and the like.

It is preferable that the aromatic ring group represented by $R^{203}$ and $R^{204}$ has 6 to 14 carbon atoms, examples of which include a phenyl group, biphenyl group, naphthyl group and mesityl group. Among the mentioned examples, the phenyl group and naphthyl group are preferably used.

The aromatic ring group represented by $R^{203}$ and $R^{204}$ may be substituted or non-substituted. As an introduced substituent group, a group of univalent non-metal atoms except for hydrogen is used. Preferable examples thereof include a halogen atom such as F, Br, Cl or I, hydroxyl group, alkoxy group, amino group, formyl group, acyl group, carboxyl group, alkoxycarbonyl group, aryloxycarbonyl group and the like.

It is more preferable that $R^{203}$ and $R^{204}$ are aromatic ring group(s), which may be substituted or non-substituted and has at least a nitro group and 6 to 14 carbon atoms.

As more specific examples of the above-mentioned $R^{203}$ and $R^{204}$, those having a structure at a terminal thereof including (—N=C) in Formula (2), which are represented by the following formulas, are particularly preferable.

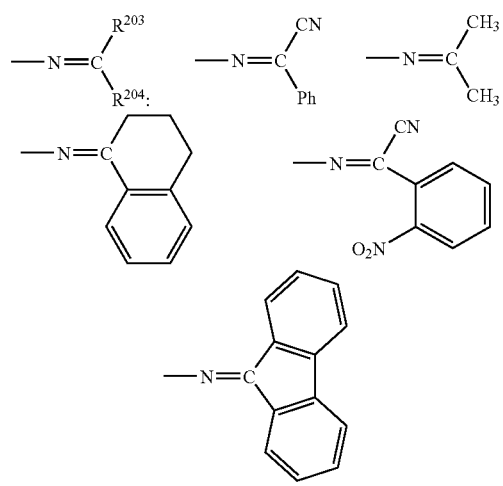

In the invention, an example of the hydrophobic functional group, what changes into a hydrophilic group in response to light, is represented by the following Formula (3).

Formula (3)

(In Formula (3), $R^{205}$ and $R^{206}$ each independently represent an alkyl group or aromatic ring group.)

Preferable examples of the alkyl group represented by $R^{205}$ and $R^{206}$ include a straight-chain alkyl group having 1 to 25 carbon atoms such as a methyl group, ethyl group, propyl group, butyl group or pentyl group, and a branched-chain alkyl group having 1 to 8 carbon atoms such as isopropyl group, t-butyl group, s-butyl group, isopentyl group or neopentyl group. Among the mentioned examples, the methyl group, ethyl group, isopropyl group and t-butyl group are more preferably used.

The alkyl group represented by $R^{205}$ and $R^{206}$ may be substituted or non-substituted. As an introduced substituent group, a group of univalent non-metal atoms except for hydrogen is used. Preferable examples thereof include a halogen atom such as F, Br, Cl or I, hydroxyl group, alkoxy group, amino group, formyl group, acyl group, carboxyl group, alkoxycarbonyl group, aryloxycarbonyl group, carbamoyl group, phenyl group, biphenyl group, naphthyl group, tolyl group, xylyl group, mesityl group, cumenyl group, chlorophenyl group, bromophenyl group, chloromethylphenyl group, hydroxyphenyl group, methoxyphenyl group, ethoxyphenyl group, phenoxyphenyl group, acetoxyphenyl group and the like.

The aromatic ring group represented by $R^{205}$ and $R^{206}$ includes a carbocyclic aromatic ring group and a heterocyclic aromatic ring group. The carbocyclic aromatic ring group preferably has 6 to 19 carbon atoms, and is more preferably a phenyl group, naphthyl group, acetolacenyl group, pyrenyl group, biphenyl group, xylyl group, mesityl group or the like including 1 to 4 benzene rings. The polycyclic aromatic ring group preferably has 3 to 20 carbon atoms and includes 1 to 5 heteroatoms, and is more preferably a pyridyl group, furyl group, quinolyl group in which benzene rings are condensed, benzofuryl group, thioxanthone group, carbozole group or the like.

The aromatic ring group represented by $R^{205}$ and $R^{206}$ may be substituted or non-substituted. As an introduced substituent group, a group of univalent non-metal atoms except for hydrogen is used. Preferable examples thereof include a halogen atom such as F, Br, Cl or I, hydroxyl group, alkoxy group, amino group, formyl group, acyl group, carboxyl group, alkoxycarbonyl group, aryloxycarbonyl group and the like.

The hydrophobic functional group that changes into a hydrophilic group in response to light can be represented by Formula (4).

$$-SO_2-R^{207} \qquad \text{Formula (4)}$$

(In Formula (4), $R^{207}$ represents an alkyl group or aromatic ring group.)

$R^{207}$ in Formula (4) represents an alkyl group or aromatic ring group.

The alkyl group represented by $R^{207}$ preferably has 1 to 8 carbon atoms, examples of which include a methyl group, ethyl group, propyl group, butyl group, pentyl group, hexyl group, heptyl group, octyl group, isopropyl group, isobutyl group, s-butyl group, t-butyl group, isopentyl group, neopentyl group, 1-methylbutyl group, isohexyl group, 2-ethylhexyl group, 2-methylhexyl group and cyclopentyl group.

The alkyl group represented by $R^{207}$ may be substituted or non-substituted. As an introduced substituent group, a group of univalent non-metal atoms except for hydrogen is used. Preferable examples thereof include a halogen atom such as F, Br, Cl or I, hydroxyl group, alkoxy group, amino group, formyl group, acyl group, carboxyl group, alkoxycarbonyl group, aryloxycarbonyl group, carbamoyl group, phenyl group, biphenyl group, naphthyl group, tolyl group, xylyl group, mesityl group, cumenyl group, chlorophenyl group, bromophenyl group, chloromethylphenyl group, hydroxyphenyl group, methoxyphenyl group, ethoxyphenyl group, phenoxyphenyl group, acetoxyphenyl group and the like.

The aromatic ring group represented by $R^{207}$ preferably has 6 to 14 carbon atoms, and for example, phenyl group, biphenyl group, naphthyl group or mesityl group may be used. Among the mentioned examples, the phenyl group and naphtyl group are preferable.

The aromatic ring group represented by $R^{207}$ may be substituted or non-substituted. As an introduced substituent group, a group of univalent non-metal atoms except for hydrogen is used. Preferable examples thereof include a halogen atom such as F, Br, Cl or I, hydroxyl group, alkoxy group, amino group, formyl group, acyl group, carboxyl group, alkoxycarbonyl group, aryloxycarbonyl group and the like.

As a more specific example of $R^{207}$, a structure represented by the following formulas is more preferable.

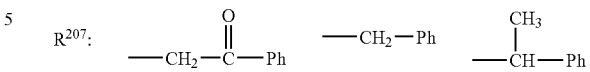

As the polarity conversion group according to the invention, publicly known functional groups described in documents, which are represented by the following Formulas (5) to (7), for example, can be used.

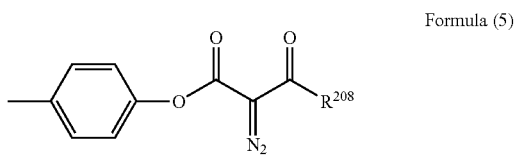

Formula (5)

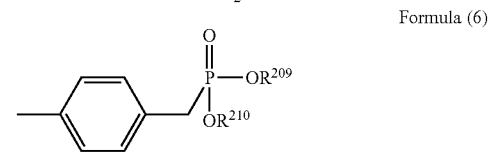

Formula (6)

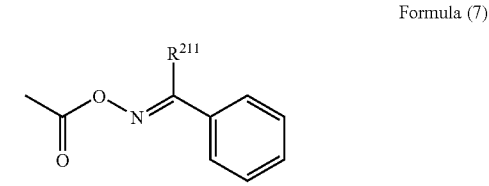

Formula (7)

Formula (5) represents a group included in a quinonediazide polymer described on p. 2195 of "*SPIE*" (1994) by P. Jagannathan. In Formula (5), $R^{208}$ represents a straight-chain, branched-chain or circular alkyl group having 1 to 18 carbon atoms, aralkyl group having 7 to 12 carbon atoms, alkenyl group having 2 to 8 carbon atoms, alkynyl group having 2 to 8 carbon atoms, aromatic group having 6 to 18 carbon atoms, or group including aromatic groups mutually bonded by a cross-linking agent. These groups may further contain a substituent group.

Formula (6) represents a group included in a phosphonic acid polymer described on p. 110 of "*Macromol*" (1995) by M. L. Schilling. In Formula (6), $R^{209}$ and $R^{210}$ each independently represent an alkyl group having 1 to 5 carbon atoms.

Formula (7) represents a group included in a polymer including an oximester group described on p. 2181 of "*J. Polym. Sci., Chem. Ed.*", (1996) by M. Tsunooka. In Formula (7), $R^{211}$ represents straight-chain, branched-chain or cyclic alkyl group having 1 to 18 carbon atoms, aralkyl group having 7 to 12 carbon atoms, alkenyl group having 2 to 8 carbon atoms, alkynyl group having 2 to 8 carbon atoms, aromatic group having 6 to 18 carbon atoms, or group including aromatic groups mutually bonded by a cross-linking agent. These groups may further contain a substituent group.

(B-2) Hydrophilic Functional Group that Changes into Hydrophobic Functional Group in Response to Light As an example of the (B-2) hydrophilic functional group which changes into a hydrophobic group in response to light, a bispyridinioethylene group can be used.

The polymer compound having the functional group whose polarity is changed in response to light according to the invention may be a homopolymer using a monomer having any of the above-described functional groups or a copolymer composed of at least two different monomers. Unless the effect of the invention is diminished, the polymer compound may be a copolymer combining the above-mentioned monomer and any other monomer. Further, the polymer compound having any of the above-described functional groups may be reacted with a graft polymer and thereby introduced.

Pattern Writing

The pattern-shape writing according to the present mode is performed through the irradiation of radiation such as light, application of acid or heating. As a mode of the photoirradiation, the pattern forming under heating by scanning exposure using a laser beam or the like in the infrared range is also possible in the case of concomitantly using the photo-thermal converting material.

An example of a method employed for the pattern forming is to execute the writing under heating, application of acid or irradiation such as exposure. For example, photoirradiation by means of an infrared-ray laser, UV-ray lamp, visible light beam or the like, thermal recording by means of a thermal head, and the like, are possible. Examples of a light source of the above-described means include a cold cathode lantern, metal halide lamp, xenon lamp, chemical lamp, carbon ark light and the like. As the radiation, infrared rays can be used. Further, g rays and i rays are also usable.

As specific examples of generally adopted methods, direct image-wise recording by means of a thermal head or the like, scanning exposure by means of an infrared-ray laser, high-illuminance flash exposure by means of a xenon discharge lamp, exposure using an infrared-ray lamp, exposure using a UV-light lamp and the like can be preferably used.

When the polarity conversion group that reacts to light of at most 700 nm is used, the polarity is converted in the pattern forming layer. More specifically, any photoirradiation means capable of decomposing, ring-opening or dimerizing the polarity conversion group to thereby change the hydrophilicity/hydrophobicity can be used. For example, the photoirradiation using the UV-light lamp, visible light beam or the like is applicable, and a light source thereof is exemplified by the cold cathode lantern, metal halide lamp, xenon lamp, chemical lamp, carbon ark light and the like.

In order to implement direct pattern forming using digital data of a computer, the polarity is preferably converted by means of laser exposure. Examples of a usable laser include a gas laser such as a carbonate gas laser, nitrogen laser, Ar laser, He/Ne laser, He/Cd laser or Kr laser, a solid laser such as a liquid (dye) laser, ruby laser or Nd/YAG laser, a semiconductor laser such as a GaAs/GaAlAs or InGaAs laser, and an excimer laser such as a KrF laser, XeCl laser, XeF laser or $Ar_2$.

Pattern Forming by Means of Metallic (Fine Particle Dispersive) Pattern Forming Method (2)

In the pattern forming method (2), the compound having the polymerizable functional group and polar group, according to the first and second modes, and the compound having the polymerizable functional group and the functional group that interacts with the electroless plating catalyst or the precursor thereof, according to the third mode, are respectively made to contact the surface of the base material including the polyimide including the polymerization initiating moiety in the skeleton thereof and subjected to irradiation in the pattern shape so as to generate the graft polymer on the base material surface in the pattern shape so that the pattern composed of the region where the graft polymer is generated and the region where the graft polymer is not generated is formed according to the first and second modes, and the pattern-shaped region that interacts with the electroless plating catalyst or the precursor thereof (interaction-property region) is formed according to the third mode.

The base material used in the present mode includes the polyimide including the polymerization initiating moiety in the skeleton thereof as described above.

In the description below, the "compound having the polymerizable functional group and the functional group that interacts with the electroless plating catalyst or the precursor thereof" is referred to as the polymerizable compound including the interaction-property group for convenience.

In general, a compound having a polar group mostly exhibits hydrophily. Therefore, the compound having the polymerizable functional group and polar group according to the invention is preferably a compound having the polymerizable functional group and a hydrophilic group.

In the description below, the "compound having the polymerizable functional group and hydrophilic group" is referred to as the hydrophilic compound having the polymerizable group, and a mode of forming the region where the graft polymer is generated (hydrophilic pattern layer) and the region where the graft polymer is not generated using the hydrophilic compound having the polymerizable group is exemplified. Formation of interaction-property region in pattern shape by means of surface graft.

In the metallic (fine particle dispersive) pattern forming method (2), the hydrophilic compound having the polymerizable group or the compound including the interaction-property group is made to contact the polyimide base material surface and subjected to the energy application so that the polymerizable group of the compound and the polyimide base material are chemically bonded to each other. As a result, the hydrophilic region superior in strength and durability and having a high hydrophilicity (in the first and second modes) or the region that interacts with the electroless plating catalyst or the precursor thereof (namely, an interaction-property region) (in the third mode) can be formed in the pattern shape.

The chemical bonding can be realized through a surface graft polymerization method, which conforms to means called the surface graft polymerization, which was described in reference to the pattern forming layer in the metallic (fine particle dispersive) pattern forming method (1). In the metallic (fine particle dispersive) pattern forming method (1), the grafted polymer compound has the polarity conversion group. However, in the present mode, the hydrophilic compound having the polymerizable group or the polymer compound including the interaction-property group is brought into contact with the base material surface to be thereby directly bonded to the active site generated on the base material surface.

The above-mentioned contact can be made by dipping the medium in an aquiform composition including the hydrophilic compound having the polymerizable group or the compound including the interaction-property group. However, in terms of easy handling and manufacturing efficiency, a layer whose main component is the composition including the hydrophilic compound having the polymerizable group or the compound including the interaction-property group is preferably formed on the base material surface through a coating process, which will be described later.

The pattern forming layer in the metallic pattern forming method (3-2) can be formed at any desirable spot on the base material. For example, when the polyimide base material having the film shape or plate shape is used, the pattern forming layer may be formed on one surface of the base material or on both surfaces thereof.

In forming the interaction-property region, when the polyimide base material having the film shape or plate shape is used, for example, the surface graft polymerization can be performed concurrently on both surfaces of the base material in the pattern shape, or the surface graft polymerization can be first performed on one surface thereof in the pattern shape, and then on the other surface thereof in the pattern shape. In such a manner, when a plating process, such as the electroless plating, is implemented, the metallic pattern is formed on one surface or both surfaces of the polyimide base material.

The formation of the surface graft through the energy application is described below.

The region where the graft polymer is generated and the interaction-property region are formed by means of a method called surface graft polymerization. In the graft polymerization, energy is applied to the chain of the polymer compound through a publicly known method using light, heat, electron ray or the like so that the active species is provided thereon to thereby further polymerize another polymerizable compound initiating the polymerization and thereby synthesize the graft polymer. When the polymer compound provided with the active species forms a solid surface, it is specifically called surface graft polymerization. In the invention, the surface of the polyimide base material is the solid surface.

In the present mode, because the polyimide constituting the base material includes the polymerization initiating moiety in the skeleton thereof, the active site can be easily formed with low energy. Therefore, the surface having a higher hydrophilicity (first and second modes) or the interaction-property region (third mode) can be easily and simply formed in the pattern shape on the base material surface.

Among the methods of forming the surface graft, the photo-graft method in which the energy is applied through photoirradiation is preferably employed.

Hydrophilic Compound Having Polymerizable Group and Polymerizable Compound Including Interaction-Property Group The hydrophilic compound having the polymerizable group and the polymerizable compound including the interaction-property group refer to a polymer in which an ethylene addition-polymerizable unsaturated group (polymerizable group) such as a vinyl group, aryl group or (meta)acrylic group is introduced as a polymerizable group into a monomer described below having the hydrophilic group or interaction-property group or into a homopolymer/copolymer obtained by using at least one of the following monomers having the hydrophilic group or interaction-property group. The polymer has the polymerizable functional group at least at a terminal or side chain thereof. The polymer having the polymerizable functional group at the terminal thereof is preferable, and the polymer having the polymerizable functional group at the terminal and at a side chain thereof is more preferable.

The hydrophilic compound having the polymerizable functional group and the polymerizable compound including the interaction-property group can be synthesized as follows.

Examples of the synthesizing methods include i) a method in which a monomer having the hydrophilic group or interaction-property group and a monomer having the polymerizable group are copolymerized, ii) a method in which the monomer having the hydrophilic group or interaction-property group and a monomer having a double-bond precursor are copolymerized and then treated with a base or the like to introduce a double bond, and iii) a method in which the monomer having the hydrophilic group or interaction-property group and the monomer having the polymerizable group are reacted with each other to thereby introduce a double bond (the polymerizable group). Among the mentioned methods, ii) the method in which the monomer having the hydrophilic group or interaction-property group and the monomer having the double-bond precursor are copolymerized and then treated with a base or the like to introduce a double bond, and iii) method in which the monomer having the hydrophilic group or interaction-property group and the monomer having the polymerizable group are reacted with reach other to thereby introduce the polymerizable group) are preferably employed in terms of a synthetic aptitude.

Specific examples of the monomer used for synthesizing the hydrophilic compound having the polymerizable group and the polymerizable compound including the interaction-property group include (meta) acrylic acid or alkali metal salt and amine salt thereof, itaconic acid or alkali metal salt and amine salt thereof, styrene sulfonic acid salt and the like. More specifically, 2-hydroxyethyl(meta)acrylate, (meta) acrylamide, N-monomethylol(meta)acrylamide, N-dimethylol(meta)acrylamide, allylamine or halogenated hydroacid salt thereof, 3-vinylpropionic acid or alkali metal salt and amine salt thereof, vinylsulfonic acid or alkali metal salt and amine salt thereof, 2-sulfoethyl(meta)acrylate, polyoxyethyleneglycol mono(meta)acrylate, 2-acrylamide-2-methylpropane sulfonic acid, acidphosphoxypolyoxy ethyleneglycol mono(meta)acrylate, N-vinylpyrrolidone (the following structure), styrene sulfonic acid sodium, vinylbenzoic acid or the like can be used. In general, a monomer including a functional group such as a carboxyl group, sulfonic acid group, phosphorous acid group, amino group, hydroxyl group, amide group, phosphine group, imidazole group, pyridine group or ether group (or salts thereof when a salt structure can be formed) can be used.

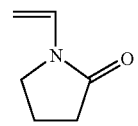

As the monomer having the polymerizable group that can be copolymerized with the monomer having the hydrophilic group or interaction-property group, allyl(meta)acrylate and 2-allyloxyethyl methacrylate, can be used.

As the monomer having the double-bond precursor, 2-(3-chloro-1-oxopropoxy)ethylmethacrylate and compounds described in Japanese Patent Application Laid-Open (JP-A) No. 2003-335814 (i-1 to i-60) can be used. Among the mentioned substances, the following compound (i-1) is preferably used. Compound (i-1)

Compound (i-1)

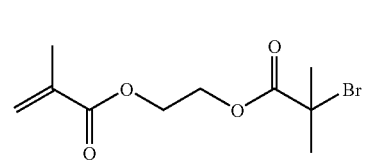

Further, examples of the monomer having the polymerizable group, which is used to introduce the unsaturated group utilizing the reaction with the functional group such as a carboxyl group or amino group or salt thereof, hydroxyl group, epoxy group or the like in the polymer having the hydrophilic group or interaction-property group, include (meta)acrylic acid, glycidyl(meta)acrylate, allylglycidyl ether, 2-isocyanatether (meta)acrylate and the like.

Next, iii) the method in which the monomer having the hydrophilic group or interaction-property group and the monomer having the double-bond precursor are copolymerized and treated with the base or the like to introduce the double bond, is described in detail.

As the synthesizing method, a method described in JP-A No. 2003-335814 can be employed.

Base Used for Elimination Reaction

Preferable examples of the base used for introducing a double bond through the treatment with the base include hydrides, hydroxides, or carbonates of alkali metals, organic amine compounds, and metallic alkoxide compounds.

Preferable examples of the hydrides, hydroxides, or carbonates of alkali metals include sodium hydride, calcium hydride, potassium hydride, sodium hydroxide, potassium hydroxide, calcium hydroxide, potassium carbonate, sodium carbonate, potassium hydrocarbonate, sodium hydrocarbonate and the like.

Preferable examples of the organic amine compound include trimethylamine, triethylamine, diethymethyllamine, tributylamine, triisobutylamine, trihexylamine, trioctylamine, N,N-dimethylcyclohexylamine, N,N-dieyhylcyclohexylamine, N-methyldicyclohexylamine, N-ethyldicyclohexylamine, pyrrolidine, 1-methylpyrrolidine, 2,5-dimethylpyrrolidine, piperidine, 1-methylpiperlidine, 2,2,6,6-tetramehylpiperidine, piperazine, 1,4-dimethylpiperazine, quinuclidine, 1,4-diazabicyclo [2,2,2]-octane, hexamethylenetetramine, morpholine, 4-methylmorpholine, pyridine, picoline, 4-dimethylaminopyridine, lutidine, 1,8-diazabicyclo [5,4,0]-7-undecene (DBU), N,N'-dicyclohexylcarbodiimide (DCC), diisopropylethylamine, Schiff base, and the like.

Preferable examples of the metallic alkoxide compounds include sodium methoxide, sodium ethoxide, potassium t-butoxide and the like.

The above-mentioned bases can be used singly or in a combination of two or more of them.

An amount of the base used may be equal to, more than, or less than an amount of the double-bond precursor included in the compound.

A temperature in the elimination reaction may be set to room temperature, a cooling temperature or a heating temperature. A preferable temperature ranges from −20° C. to 100° C.

A macromonomer can also be used as the hydrophilic compound having the polymerizable group and the polymerizable compound including the interaction-property group. The macromonomer can be produced by means of, for example, different types of production methods proposed in the second chapter of "*Synthesis of Macromonomers*" in "*Chemistry and Industry of Macromonomers*" (edited by Yuya Yamashita.) published by IPC Press on Sep. 20, 1989. Examples of the effective macromonomer include a macromonomer induced from a monomer including a carboxyl group such as acrylic acid or methacrylic acid, a sulfonic acid compound macromonomer induced from a monomer such as 2-acrylamide-2-methylpropane sulfonic acid, vinylstyrene sulfonic acid or salts thereof, an amide compound macromonomer induced from a (meta)acrylamide, N-vinylacetamide, N-vinylformamide or N-vinylcarboxylic acid amide monomer, a macromonomer induced from a monomer including a hydroxyl group such as hydroxyethylmethacrylate, hydroxyethylacrylate or glycerolmonomethacrylate, and a macromonomer induced from a monomer including an alkoxy group or ethyleneoxide group such as methoxyethylacrylate, methoxypolyethyleneglycolacrylate or polyethyleneglycolacrylate. Further, a monomer having a polyethyleneglycol chain or polypropyleneglycol chain can also be effectively used as a macromonomer used in the present mode.

An effective molecular weight of the macromonomers ranges from 250 to 100,000, and preferably from 400 to 30,000.

A solvent used for the described composition including the hydrophilic compound having the polymerizable group or the polymerizable compound including the interaction-property group is not specifically limited as far as the the hydrophilic compound having the polymerizable group or the polymerizable compound including the interaction-property group, and the hydrophilic monomer, which are the main constituents, can be dissolved in the solvent. As an option, a surfactant may be added to the solvent.

Examples of the usable solvent include an alcohol solvent such as methanol, ethanol, propanol, ethyleneglycol, glycerin or propyleneglycolmonomethylether, a ketone solvent such as acid, for example, acetic acid, acetone or cyclohexanone, an amide solvent such as formamide or dimethylacetoamide, and the like.

Any surfactant can be added when necessary as far as it can be dissolved in the solvent. Examples of the usable surfactant include an anionic surfactant such as n-dodecylbenzene sodium sulfonic acid, a cationic surfactant such as n-dodecyltrimethyl ammonium chloride, a nonionic surfactant such as polyoxyethylene nonylphenoletehr (as an example of a commercially available product, trade name name: "EMULGEN 910, manufactured by Kao Corporation"), polyoxyethylene sorbitan monolaurate (as an example of a commercially available product, trade name: TWEEN 20), or polyoxyethylene laurylehter, and the like.

The composition in a liquid state can be directly contacted in an arbitrary manner. A coating amount in the case of forming the region where the graft polymer is generated (hydrophilic pattern layer) or the interaction-property region according to the first and second modes through a coating process is preferably 0.1 to 10 g/m$^2$, and more preferably 0.5 to 5 g/m$^2$, based on a solid component in order to obtain a uniform coating film and to sufficiently exert the interaction with the plating catalyst or the precursor thereof in the third mode.

Formation of Region where Graft Polymer is Generated (Hydrophilic Pattern Layer) and Interaction-Property Region Next, the formation of the region where the graft polymer is generated (hydrophilic pattern layer) and the interaction-property region is described.

There is no particular limitation to the energy application method in the method of forming the hydrophilic pattern layer and the interaction-property region. Any method, such as irradiation of light or heating, can be adopted as far as energy capable of generating the active site on the polyimide base material surface and bonding the active site to the hydrophilic compound having the polymerizable group or the polymerizable compound including the interaction-property group can be applied. However, active light is preferably irradiated in order to obtain a simplified device structure and reduce costs.

When the irradiation of active light is used in the pattern-shape exposure, either scanning exposure based on the digital data or pattern exposure using a lithographic film can be used. Regarding the method of forming the interaction-property region in the pattern shape, the respective writing methods described in the description of the formation of the pattern forming layer in the pattern forming method (1) can also be preferably applied in the present mode.

When the energy is applied in the above-mentioned manner, the active site generated on the polyimide base material surface and the hydrophilic compound having the polymerizable group or the polymerizable compound having the interaction-property group are polymerized, and a graft chain having a high mobility is thereby formed. As a preferable mode, when the hydrophilic compound having the polymerizable group at the terminal and side chain thereof or the polymerizable compound including the interaction-property group is used, the graft chain (hydrophilic graft chain in the first and second modes) is further bonded to the polymerizable group at the side chain of the graft chain bonded to the base material or a particular polymerization initiating layer, and a branched graft chain structure is thereby formed. In such a manner, a density and mobility of the formed graft can be remarkably improved, and a higher hydrophilicity can be obtained in the first and second modes, while a more intensified interaction with the electroless plating catalyst or the precursor thereof can be generated in the third mode.

Graft Pattern Material

According to the conductive pattern forming method according to the invention so far described, the graft pattern material according to the invention, in which the graft polymer directly bonded to the polymerization initiating moiety present on the base material surface and having the polar group is present in the pattern shape on the surface of the base material including the polyimide including the polymerization initiating moiety in the skeleton thereof, can be obtained.

In case of the graft pattern material obtained by means of the conductive pattern forming method according to the first mode of the invention, the polyimide base material surface superior in heat resistance has an improved quality as a result of the surface graft. Therefore, the material interacting with the polar group of the graft polymer is attached or the like with respect to the base material surface, whereby the material required to be heat resistant can exert different functions other than the heat resistance. The described graft pattern material is preferably used as a conductive pattern material according to the invention, which will be described later.

Conductive Pattern Forming Method

Next, the conductive pattern forming method according to the invention is described.

The conductive pattern forming method according to the invention, in which the described pattern forming method according to the invention is applied to a conductive pattern forming method, is characterized in comprising generating the graft polymer directly bonded to the base material surface and having the polar group in the pattern shape on the surface of the base material including the polyimide having the polymerization initiating moiety in the skeleton thereof and attaching a conductive material to the graft polymer.

According to the invention, it is preferable that heating be further implemented after the attaching the conductive material to the graft polymer.

The mechanism in the conductive pattern forming method according to the invention, which has not been clearly identified, is presumed to be as follows.

The graft structure (graft polymer), in which the graft polymer having the polar group is directly chemically bonded, is formed in the pattern shape on the polyimide base material surface according to the present mode. In the invention, the conductive material is attached to the graft polymer thus solidly bonded to the base material surface so as to form the conductive pattern. Therefore, when any mechanical operation causing abrasion or the like is applied thereto, the adhesion property between the base material and the conductive pattern and durability can be improved because the conductive pattern is prevented from being stripped from the base material together with the graft polymer attached thereto. Further, a conductive film achieving a high heat resistance can be formed because the graft polymer is directly introduced into the polyimide base material and the conductive material is attached thereto.

As another advantage, the implementation of the heating after the attaching the conductive material leads to a further improved conductivity. It is presumed that the advantage can be obtained because the heating causes melting and adhesion in the conductive material, which improves the adhesion property in the conductive material and reduces voids in the conductive material.

The following methods described in (1) and (2) are preferable modes of the conductive pattern forming method according to the invention, although the invention is not limited to those modes.

(1) A conductive pattern forming method characterized in comprising applying the energy to the surface of the base material including the polyimide having the polymerization initiating moiety in the skeleton thereof to thereby generate the active site on the base material surface, the polymer compound layer made of the polymer compound directly bonded to the base material surface and having the functional group whose hydrophilicity/hydrophobicity is changed in accordance with heat, acid or radiation is provided using the active site as a starting point, and the heat, acid or radiation is applied to the polymer compound layer in the pattern shape so that the pattern composed of the hydrophilic region and hydrophobic region is formed on the base material surface (hereinafter, referred to as a "pattern forming process (A)"), and attaching the conductive material to the hydrophilic region or the hydrophpboc region (hereinafter, referred to as a "conductive material attaching"). (Hereinafter, referred to as a "conductive pattern forming method (1)") In the present mode, it is preferable that the heating be further implemented after the attaching the conductive material to the graft polymer.

(2) A conductive pattern forming method characterized in comprising bringing the compound having the polymerizable functional group and the polar group into contact with the surface of the base material including the polyimide having the polymerization initiating moiety in the skeleton thereof and subjected to irradiation in the pattern shape so as to generate the active site on the base material surface, and the graft polymer is generated on the base material surface by means of graft polymerization using the active site as a starting point so that the pattern composed of the region where the graft polymer is generated and the region where the graft polymer is not generated is formed (hereinafter, referred to as a "pattern forming process (B)"), and attaching the conductive material to the region where the graft polymer is generated (hereinafter, referred to as a "conductive material attaching"). (Hereinafter referred to as a "conductive pattern forming method (2)").

In the present mode, it is preferable that heating be further implemented after the attaching the conductive material to the graft polymer.

The conductive pattern forming methods (1) and (2) according to the preferable modes of the pattern forming method according to the invention are respectively described below.

Conductive Pattern Forming Method (1)

The present mode is characterized in comprising the pattern forming process (A) and the conductive material attaching. In the present mode, it is preferable that the heating be further implemented after the conductive material attaching.

According to the present mode, the conductive pattern which is highly heat resistant and superior in adhesion property relative to the base material surface and durability can be formed on the polyimide base material surface. The respective processes according to the present mode are described below.

Conductive Pattern Forming Process (A)

The content of the description of the "pattern forming in the pattern forming method (1)" in the pattern forming method (1) is applied to the pattern forming process (A) according to the present mode in the same manner.

Conductive Material Attaching

In the conductive material attaching, the conductive material is attached to the hydrophilic region formed by means of the pattern forming process (A).

Conductive Material

Any substance attachable to the polar group of the graft polymer according to the invention can be used as the conductive material. Among such substances, a conductive fine particle is preferably used.

The conductive fine particle usable in the present mode is not subjected to any particular limitation as far as it is conductive, and any fine particle made of publicly known conductive materials can be arbitrarily selected and used. For example, a metallic fine particle such as Au, Ag, Pt, Cu, Rh, Pd Al or Cr, an oxide semiconductor fine particle such as $In_2O_3$, $SnO_2$, ZnO, Cdo, $TiO_2$, $CdIn_2O_4$, $Cd_2SnO_2$, $Zn_2SnO_4$ and $In_2O_3$—ZnO, a fine particle in which impurities suitable for the above-described substances are used as dopant materials, a spinel-shaped compound fine particle such as MgInO or CaGaO, a conductive nitride fine particle such as TiN, ZrN or HfN, a conductive boride fine particle such as LaB, a conductive polymer fine particle as an organic material, and the like can be preferably used. An organic element may be adsorbed to the above fine particles as a dispersant.

Relationship Between Types of Polar Group and Conductive Fine Particle

When the graft polymer generated by means of the surface grafting has an anionic property as in a carboxyl group, sulfonic acid group, phosphonic acid group or the like, the pattern portion selectively has a negative charge, to which a conductive fine particle having a positive charge (cationic) is adsorbed. As a result, a conductive region (wiring) is formed.

Examples of the cationic conductive fine particle include metallic (oxide) fine particles having positive charge. The fine particle having positive charge on the surface thereof at a high density can be produced by means of methods described by T. Yonezawa et al., which are described on p. 1061 of *Chemistry Letters.*, 1999 by T. Yonezawa, p. 5218 of *Langumuir*, 2000, vol. 16 by T. Yonezawa, and p. 2911 of *Polymer Preprints*, Japan, vol. 49 (2000) by T. Yonezawa. Yonezawa et al. show that a metallic-particle surface, which is chemically modified at a high density by means of the functional group having the positive charge, can be formed through the utilization of a metallic monosulfur bond.

When the generated graft polymer has the cationic group, on the other hand, as in an ammonium group described in JP-A No. 10-296895, the pattern portion selectively has a positive charge, to which a conductive fine particle having a negative charge is adsorbed. As a result, the conductive region (wiring) is formed. Examples of the negatively charged metallic particle include a gold or silver particle obtained by reducing citric acid.

A diameter of the conductive fine particle is preferably in the range of 0.1 nm to 1000 nm, and more preferably in the range of 1 nm to 100 nm, from the standpoint of conductive performance, melting/adhesion power under heating, and strength of the conductive region.

In the case of obtaining a transparent wiring substrate, the diameter of the conductive fine particle is preferably in the range of 0.2 nm to 100 nm, and more preferably in the range of 1 nm to 10 nm, in order to assure light transmittance.

In the case of the conductive fine particle as described above, it is preferable that a maximum amount of the conductive fine particle attachable to the polar group (hydrophilic group) of the graft polymer is bonded in view of durability. In order to assure conductivity, a dispersion concentration of a fluid dispersion is preferably in the range of approximately 0.001 to 20 mass %.

As a method of making the conductive fine particle adsorb to the hydrophilic group, a fluid, in which the conductive fine particle having an electric charge on the surface thereof is dissolved or dispersed, is spread on the surface where the graft polymer pattern is formed, or the pattern-formed base material is dipped in the solution or the fluid dispersion. In either of the spreading and dipping methods, in order to supply an excessive amount of conductive fine particles and introduce them through sufficient ion bonds relative to the hydrophilic group, a length of time required for the solution or fluid dispersion and the base material surface where the graft polymer pattern is formed to contact each other is preferably approximately 10 seconds to 24 hours, and more preferably approximately 1 to 180 minutes.

In the present mode, the conductive fine particle used is not limited to one type, and plural types of conductive particles can be combined when necessary. Alternatively, a plurality of materials can be mixed in advance and then used in order to obtain a desired conductivity.

Heating

In the present mode, it is preferable that heating is performed after the conductive material attaching. The heating is performed so that the melting and adhesion is generated in the attached conductive material. As a result, the adhesion property is improved in the conductive material while the conductivity is increased. Particularly when the conductive material is the conductive fine particle, the heating is performed so that the conductive fine particles, when adsorbed in a coarse state, can be melted and thereby mutually adhered. As a result, the adhesion property between the conductive fine particles can be improved, and a favorable conductivity can be achieved because voids between the conductive fine particles are reduced.

A temperature in the heating is preferably 50° C. to 500° C., more preferably 100° C. to 300° C., and particularly preferably 150° C. to 300° C.

Conductive Pattern Forming Method (2)

The present mode is characterized in comprising the pattern forming process (B) and the conductive material attaching. In the present mode, it is preferable that the heating be further implemented after the conductive material attaching.

According to the present mode, the conductive pattern which is highly heat-resistant and superior in adhesion property relative to the base material surface and durability can be formed on the polyimide base material surface. The respective steps according to the present mode are described below.

Conductive Pattern Forming Process (B)

The content of the description of the "pattern forming in the pattern forming method (2)" in the pattern forming method (2) is applied to the pattern forming process (B) according to the present mode in the same manner.

Conductive Material Attaching

The content of the description of the "conductive material attaching" in the conductive pattern forming method (1) is applied to the conductive material attaching according to the present mode in the same manner.

The content of the description of the "heating" in the conductive pattern forming method (1) is applied to the heating according to the present mode in the same manner.

The conductive material according to the invention is produced through the application of the above-described conductive pattern forming method according to the invention, and is characterized in that the graft polymer directly bonded to the polymerization initiating moiety present on the base material surface and having the polar group to which the conductive material is attached is provided in the pattern shape on the surface of the base material including the polyimide having the polymerization initiating moiety in the skeleton thereof.

In the conductive pattern material produced by means of the conductive pattern forming method according to the invention, a solid and uniform conductive pattern, which is highly heat resistant and is prevented from being stripped by, for example, a mechanical operation causing abrasion, is formed at a desired region on the base material surface. Further, a fine conductive pattern can be formed from the present conductive pattern material through simplified processes as in the conductive pattern forming method according to the invention described above.

The above-mentioned conductive pattern material can be used for the formation of different types of circuits and is capable of forming a nano-scale conductive region through the selection of pattern forming means. Therefore, there is an expectation that the conductive pattern material can be widely used covering circuit formations of a micro machine, very large scale integration, wiring substrates and the like. The conductive pattern material can be suitably used for a flexible wiring substrate for which heat resistance is demanded.

Imparting Metal Ion or Metal Salt

The second mode of the invention includes, subsequent to the pattern forming, imparting a metal ion or metal salt to the generated graft polymer, and the metal ion or a metal ion included in the metal salt is reduced so as to from the region to which the pattern-shape metallic fine particles are attached.

A method of imparting the metal ion or metal salt can be appropriately selected depending on the polar group included in the graft polymer. To be more specific, an appropriate method can selected from: (1) a method of adsorbing the metal ion to the hydrophilic region when the hydrophilic compound forming the hydrophilic region (region where the graft polymer is formed) has an acidic group; (2) a method of impregnating the hydrophilic region with the metal salt or a solution including the metal salt when the hydrophilic compound forming the hydrophilic region has a high hydrophilicity relative to the metal salt such as in the case of polyvinylpyrrolidone; and (3) a method of dipping the hydrophilic region in the solution including the metal salt or a solution in which the metal salt is dissolved so that the hydrophilic region is impregnated with the solution including the metal ion and/or metal salt. The method described in (1) is preferable because the metal ion can be introduced into the graft polymer through an ion bond.

Metal Ion and Metal Salt

Next, the metal ion and metal salt are described.

In the invention, the metal salt is not particularly limited as far as it can be dissolved in a suitable solvent and dissociated into the metal ion and base (anion) to be thereby provided onto the hydrophilic surface. For example, $M(NO_3)_n$, $MCl_n$, $M_{2/n}(SO_4)$, $M_{3/n}(PO_4)$ (M represents a n-valency metal atom) and the like can be used. As the metal ion, the above-described metal ion, from which the metal salt is dissociated, can be suitably used. Specific examples thereof are Ag, Cu, Al, Ni, Co, Fe and Pd. Ag and Co are preferably used respectively for the conductive film and magnetic film.

In a case where 1) the method of adsorbing the metal ion to the hydrophilic region when the hydrophilic compound forming the hydrophilic region has the acidic group, is employed in imparting the metal ion or metal salt to the hydrophilic region, the metal salt is dissolved in an appropriate solvent, and the solution including the dissociated metal ion is spread on the substrate surface where the hydrophilic region is present, or the substrate having the hydrophilic region may be dipped in the solution. Because the solution including the metal ion is made to contact the substrate, the metal ion can be adsorbed to the acid group in an ionic manner. In order to perform the adsorption sufficiently, a concentration of the metal ion or metal salt in the contact solution is preferably in the range of 1 to 50 mass %, and more preferably in the range of 10 to 30 mass %. A length of time required for the contact is preferably in the range of approximately 1 to 24 hours.

In a case where (2) the method of impregnating the hydrophilic region with the metal salt or the solution including the metal salt when the hydrophilic compound forming the hydrophilic region has a high hydrophily relative to the metal salt such as in the case of polyvinylpyrrolidone is employed in imparting the metal ion or metal salt to the hydrophilic region, the metal salt made into a fine particle shape is directly adsorbed to the hydrophilic region, a fluid dispersion which is prepared using an appropriate solvent capable of dispersing the metal salt is spread on the substrate surface on which the hydrophilic region is present, or the substrate having the hydrophilic region may be dipped in the fluid. The hydrophilic region formed according to the invention has a remarkable water retentivity resulting from the graft polymer. Such a remarkable retentivity is effectively used to thereby impregnate the hydrophilic region with the fluid dispersion in which the metal salt is dispersed. In order to perform the impregnation of the fluid dispersion sufficiently, the concentration of the metal ion or metal salt in the contact fluid dispersion is preferably in the range of 1 to 50 mass %, and more preferably in the range of 10 to 30 mass %. The length of time required for the contact is preferably in the range of approximately 1 to 24 hours.

In a case where 3) the method of dipping the hydrophilic region in the solution including the metal salt or the solution in which the metal salt is dissolved so that the hydrophilic region is impregnated with the solution including the metal ion and/or metal salt is employed in imparting the metal ion or metal salt to the hydrophilic region, the fluid dispersion which is prepared using the appropriate solvent capable of dispersing the metal salt or the solution including the dissociated metal ion resulting from dissolving the metal salt in the appropriate solvent is spread on the substrate surface on which the hydrophilic region is present, or the substrate having the hydrophilic region may be dipped in the solution. According to the present method, as in the earlier method, the hydrophilic region may be impregnated with the fluid dispersion or the solution using the high water retentivity when the hydrophilic region is formed from the graft polymer. In order to perform the impregnation of the fluid dispersion or solution sufficiently, the concentration of the metal ion or metal salt in the contact fluid dispersion is preferably in the range of 1 to 50 mass %, and more preferably in the range of 10 to 30 mass %. The length of time required for the contact is preferably approximately in the range of approximately 1 to 24 hours.

Reducing Agent

In the invention, any reducing agent having a physical property capable of reducing the used metal salt compound and thereby depositing the metal can be used for reducing the metal salt or metal ion present in the hydrophilic region through the adsorption or impregnation so as to form the metallic (fine particle) film. For example, hypophosphite, tetrahydroborate, hydrazine and the like can be used.

An appropriate reducing agent can be selected from the above examples in consideration of a relationship with respect to the metal salt and metal ion. For example, when an aqueous solution including silver nitrate or the like is used as an aqueous solution including the metal salt for supplying the metal salt/ion, sodium tetrahydroborate is suitably used. When an aqueous solution including palladium dichloride is used, hydrazine is suitably used.

The reducing agent may be added, for example, in such a manner that the base material surface on which the hydrophilic region is present is provided with the metal ion or metal salt and washed with water so as to remove any excess metal salt or metal ion, and the base material having the processed surface is dipped in ion-exchanged water or the like, to which the reducing agent is added, or in such manner that an aqueous solution including the reducing agent in a predetermined concentration is directly spread or dropped on the base material surface, or the like. Regarding an amount of the reducing agent to be added, an amount equal to or exceeding the amount of the metal ion is preferably added, and an amount at least ten times as much as the amount of the metal ion is more preferably added.

The presence of the metallic (fine particle) film, which is uniform and highly strong because of the added reducing agent, can be confirmed through visual observation of a metallic luster on the surface. Further, a structure of the film can be confirmed through observation of the surface by means of a transmission electron microscope or AFM (Atomic Force Microscope). A thickness of the metallic (fine particle) film can be easily confirmed through a common procedure such as observation of a cross-sectional surface thereof using an electron microscope, or the like.

Relationship Between Polarity of Surface Graft Polymerization and Metal Ion or Metal Salt in the Case of Polarity Conversion In the case of the pattern forming layer having the anionic graft polarity conversion functional group such as alkylsulfonic acid ester group represented by Formula (1) specifically exemplified earlier, a light-exposed region alone selectively has the negative charge, to which the metal ion having the positive charge is adsorbed, and the adsorbed metal ion is reduced so that the region where the metallic fine particle is deposited (when continuous layers are formed, the conductive region is wiring) is formed. When such a pattern forming mechanism is employed, the light-exposed region alone is polarity-converted and thereby has a metal ion adsorbing power. Therefore, a plurality of different regions comprising the metallic fine particle (for example, wiring or the like) can be sequentially formed on a single substrate.

To describe the present mode by using a metallic fine particle dispersion pattern (1) having the polarity conversion group on the base material surface as an example, the substrate is exposed to light so that the exposed region is converted into the hydrophilic region, and then, a metal ion is adsorbed to the hydrophilic region and reduced to thereby form a first region to which the metallic fine particle is adsorbed. At that time, a polarity conversion group of an unexposed portion is not subjected to any influence. Therefore, the image-wise exposure is performed on the base material again so that the polarity of the exposed portion is converted so as to form a hydrophilic region, and a different metal ion is adsorbed to the region and reduced. Then, the metal is deposited and a second region to which the metallic fine particle is adsorbed can be thereby formed. Thus, a pattern having a plurality of metallic (fine particle) films can be formed on the same medium through phased image-wise exposure.

Relationship Between Polarity of Hydrophilic Group and Metal Ion or Metal Salt in the Case of Hydrophilic Compound Bonding When the hydrophilic pattern layer obtained in the metallic fine particle dispersion pattern (1) has the anionic property such as in the case of a carboxyl group, sulfonic acid group or phosphonic acid group, the pattern portion selectively has the negative charge, to which the metal ion having the positive charge is adsorbed. Then, the adsorbed metal ion is reduced to thereby form the metallic (fine particle) film region (for example, wiring or the like).

In contrast, when the obtained hydrophilic pattern layer has the cationic group such as in the case of an ammonium group described in JP-A No. 10-296895, the pattern portion selectively has the positive charge, and the pattern portion is impregnated with the solution including the metal salt or the solution in which the metal salt is dissolved so that the metal ion included in the impregnated solution or the metal ion in the metal salt is reduced to thereby form the metallic (fine particle) film (wiring or the like) region.

It is preferable that a maximum amount of metal ions, which can be bonded (adsorbed) to the polarity conversion group or the hydrophilic group of the hydrophilic surface, are bonded in order to improve durability.

As a method of imparting the metal ion to the portion in which the metal ion is polarity-converted or the hydrophilic group, for example, the fluid in which the metal ion or metal salt is dissolved or dispersed may be spread on the base material surface which is polarity-converted in the image-wise manner through light exposure, the polarity-converted base material surface may be dipped in the fluid in which the metal ion or metal salt is dissolved or dispersed, or the like. In either of the spreading and dipping methods, an excess amount of metal ions are supplied to thereby sufficiently enhance the ion-bonding introduction relative to the polarity conversion group. Therefore, a length of time required for the solution or fluid dispersion and the base material surface to contact each other is preferably approximately 10 seconds to 24 hours, and more preferably approximately 1 to 180 minutes.

The metal ion used is not necessarily limited to one type, and plural types of metal ions can be used in combination. Alternatively, a plurality of substances can be mixed in advance and then used in order to obtain a desired conductivity.

It is seen that the pattern portions of the metallic fine particle dispersion pattern produced according to the invention are densely dispersed in the surface graft film from observing the surface and cross-sectional surface by means of an SEM and AFM. A size of the produced metallic fine particle is 1 µm to 1 nm in diameter.

Metallic Pattern Forming Method

The metallic pattern forming method according to the invention is characterized in that the metallic fine particle dispersion pattern obtained by means of the method of forming the metallic fine particle dispersion pattern according to the invention is heated.

More specifically, the metallic pattern forming method according to the invention further includes the heating subsequent to the depositing the metallic fine particle in the metallic fine particle dispersion pattern forming method according to the invention. As a result, the metallic pattern, which is superior in conductivity, heat resistance, adhesion property relative to the base material surface and durability, can be formed on the polyimide base material surface.

A heating temperature in the heating is preferably at least 100° C., more preferably at least 150° C., and particularly preferably approximately 200° C. The heating temperature is preferably at most 400° C. in consideration of the processing efficiency and dimensional stability of the base material. A heating time length is preferably at least 10 minutes, and more preferably approximately 30 to 60 minutes. The mechanism of the effect obtained by the heating process has not been clarified, but, presumably serves to improve conductivity because some metallic fine particles, which are disposed in close vicinity, are melted and adhered to one another.

The metallic fine particle dispersion pattern forming method and the metallic pattern forming method according to the invention are expected to be applicable to the formation of different types of products such as a high-density magnetic disk, magnetic tape, magnetic sheet, magnetic disk and the like, covering a wide range of applications. They can also be used for the formation of different types of circuits. These methods are capable of forming a fine conductive region through the selection of the pattern forming means and are expected to be applicable to a wide range application including the formation of circuits such as micro machines and very large scale integration.

Imparting Electroless Plating Catalyst or Precursor Thereof to Interaction-Property Region According to the third mode of the invention, imparting the electroless plating catalyst or precursor thereof to the interaction-property region formed in the pattern forming is further included.

Electroless Plating Catalyst

The electroless plating catalyst used in the present process is mainly a 0-valency metal, examples of which include Pd, Ag, Cu, Ni, Al, Fe, Co and the like. In the invention, Pd and Ag are preferable in terms of easy handling and superiority of catalyst capability. As a method of securing the 0-valency metal in the interaction-property region, for example, metallic colloid in which a charge is adjusted so as to interact with the interaction-property group in the interaction-property region is applied to the interaction-property region. In general, the metallic colloid can be produced by reducing the metal ion in a solution in which a charged surfactant or a charged protective agent is present. The charge of the metallic colloid can be adjusted by the used surfactant or protective agent. When the metallic colloid in which the charge is thus adjusted is made to interact with the interaction-property group of the graft pattern, the metallic colloid (electroess plating catalyst) can be selectively adsorbed onto the graft pattern.

Precursor of Electroless Plating Catalyst

As the precursor of the electroless plating catalyst used in the present process any substance can be employed without limitation as far as the substance can serve as the electroless plating catalyst through a chemical reaction, and the 0-valency metal ion used in the electroless plating catalyst is mostly used. The metal ion, which is the precursor of the electroless plating catalyst, results in the 0-valency metal serving as the electroless plating catalyst through a reduction reaction. The metal ion, which is the precursor of the electroless plating catalyst, is imparted to the base material, and then, may be changed into the 0-valency metal through another reduction reaction before being dipped in an electroless plating catalyst plating bath to thereby constitute the electroless plating catalyst, or may be dipped in the electroless plating bath as the precursor of the electroless plating catalyst to be thereby changed into metal (electroless plating molten medium) by a reducing agent in the electroless plating bath.

The metal ion, which is the precursor of the electroless plating catalyst, is actually imparted to the graft pattern in the state of the metal salt. As the metal salt that is used any substance can be employed without limitation as far as the substance can be dissolved in an appropriate solvent and dissociated into the metal ion and base (anion). Specific examples of the metal salt are $M(NO_3)_n$, $MCl_n$, $M_{2/n}(SO_4)$, $M_{3/n}(PO_4)$ (M represents an n-valency metal atom) and the like. As the metal ion, the metal ion, into which the metal salt is dissociated, is suitably used. Specific examples of the metal ion include an Ag ion, Cu ion, Al ion, Ni ion, Co ion, Fe ion, Pd ion and the like. The Ag ion and Pd ion are preferably used in terms of catalyst capability.

As a method of imparting the metallic colloid as the electroless plating catalyst or the metal salt as the electroless plating precursor onto the graft pattern, the metallic colloid is dispersed in an appropriate dispersion medium or the metal salt is dissolved in an appropriate solvent so as to prepare a solution including the dissociated metal ion, and the solution is spread on the base material surface on which the graft pattern is present, or the base material having the graft pattern may be dipped in the solution. When the solution including the metal ion is brought into contact with the base material, the metal ion can be adsorbed to the interaction-property group on the interaction-property region utilizing an inter-ion interaction or a dipole-ion interaction, or the interaction-property region can be impregnated with the metal ion. In order to thoroughly perform the adsorption or impregnation, the concentration of the metal ion or concentration of the metal salt in the solution brought into contact, is preferably in the range of 0.01 to 50 mass %, and more preferably in the range of 0.1 to 30 mass %. A length of time required for the contact is preferably approximately one minute to 24 hours, and more preferably approximately five minutes to one hour.

Performing Electroless Plating and Thereby Forming Metallic Film in Pattern Shape In the present invention, the electroless plating is performed to the interaction-property region in the base material to which the electroless plating catalyst or precursor thereof is imparted, and the metallic film is thereby formed in the pattern shape. More specifically, when the electroless plating is performed in the present invention, the high-density metallic pattern (metallic pattern) in accordance with the graft pattern obtained in the above-mentioned process is formed on the graft pattern. The formed metallic pattern has a remarkable conductivity and adhesion property.

Electroless Plating

The electroless plating is an operation for depositing metal through a chemical reaction using a solution in which a metal ion, which is desirably deposited as plating, is dissolved.

In the electroless plating implemented in the present invention, for example, the base material, to which the electroless plating catalyst is imparted in the pattern shape, is washed with water so as to remove any excess electroless plating catalyst (metal) and dipped in the electroless plating bath. A generally known electroless plating bath can be used for the electroless plating bath in the present invention.

Further, when the base material, to which the precursor of the electroless plating catalyst is imparted in the pattern shape, is dipped in the electroless plating bath in the state in which the precursor of the electroless plating catalyst is adsorbed to or impregnated into the graft pattern, the medium is washed with water so as to remove any excess precursor (metal salt) and dipped in the electroless plating bath. In this case, the precursor is reduced and subsequently subjected to the electroless plating in the electroless plating bath. As mentioned earlier, a generally known electroless plating bath can be used for the electroless plating bath in the present invention.

A composition of the general electroless plating bath mainly includes a metal ion for plating, a reducing agent, and an additive for improving the stability of the metal ion (stabilizer). In addition to the foregoing components, the plating bath may further include a publicly known additive, such as a stabilizer for the plating bath.

Generally known types of the metal used for the electroless plating bath include copper, tin, lead, nickel, gold, palladium and rhodium. Among these, copper and gold are preferably used in terms of conductivity.

Further, there are different reducing agents and additives, which are optimal for the metals mentioned above. For example, a copper electroless plating bath includes $Cu(SO_4)_2$ as copper salt, HCOH as reducing agent, and a chelating agent as an additive such as EDTA or Rochelle salt serving as a stabilizer for the copper ion. A plating bath used for the electroless plating of CoNiP includes cobalt sulfate and nickel sulfate as the metal salt thereof, hypophsphite sodium as a reducing agent, and sodium malonate, sodium malate or sodium succinate as complexing agent. A palladium electroless plating bath includes $(Pd(NH_3)_4)Cl_2$ as metal ion, $NH_3$ or $H_2NNH_2$ as a reducing agent, and EDTA as stabilizer. These plating baths may include substances other than those mentioned.

A thickness of the metallic film thus formed can be controlled by the concentration of the metal salt or metal ion in the plating bath, time length of dipping in the plating bath, or temperature in the plating bath, but is preferably at least 0.5 μm, and more preferably at least 3 μm, in terms of conductivity. A length of time required for dipping in the plating bath is preferably approximately one minute to 12 hours, and more preferably approximately one minute to one hour.

It is seen through cross-sectional observation by means of an SEM that the fine particles of the electroless plating catalyst and plating metal are densely dispersed in the surface graft film in the metallic film part of the metallic pattern obtained as described, and further that relatively large particles are deposited on the fine particles. Because the interface is in the hybrid state consisting of the graft polymer and fine particles, the adhesion property is favorable despite the unevenness being at most 10 nm or below at the interface between the base material (organic element) and inorganic substance (electroless plating catalyst or plating metal).

Electroplating

In the metallic pattern forming method according to the invention, electroplating (electroplating process) may be included after performing electroless plating and thereby forming the metallic film in the pattern shape.

In the electroplating, the metallic film formed in performing electroless plating can be used as an electrode so as to further perform the electroplating after the electroless plating. As a result, a metallic film having an arbitrary thickness can be additionally easily formed based on the metallic pattern having the superior adhesion property relative to the medium. When the electroplating is added, the pattern-shaped metallic film can be arranged to have an arbitrary thickness depending on the purpose thereof, which is favorable for applying the metallic pattern according to the invention to various applications such as a wiring pattern.

A publicly known method of performing electroplating can be applied to the implementation of the electroplating according to the invention. Metals usable in the electroplating in the present invention include copper, chrome, lead nickel, gold, silver, tin, zinc, and the like. Copper, gold and silver are preferable and copper is more preferable in terms of conductivity.

A thickness of the metallic film obtained by the electroplating differs depending on the use thereof and can be controlled by adjusting a concentration of the metal included in the plating bath, dipping time or current density. A film thickness when used for general electric wiring is preferably at least 0.5 μm, and more preferably at least 3 μm, in terms of conductivity.

The electroplating according to the invention not only enables the formation of the pattern-shaped metallic film in an arbitrary thickness corresponding to the purpose thereof as described above, but also serves to perform packaging and the like of an IC or the like, for example, when the gold plating is carried out. The plating having such a purpose can be performed using a material selected from nickel, palladium, gold, silver, tin, solder, rhodium, white gold and compounds thereof with respect to the metallic pattern surface formed from copper or the like.

Punching

The metallic pattern forming according to the invention may further include punching in order to provide an opening portion such as the formation of a through-hole via or the like to thereby achieve a higher density in a circuit comprising the metallic pattern and high-density packaging of packaging parts. Through the implementation of the punching, a hole, into which a lead of an IC or the like can be inserted, can be made when the metallic pattern is formed on one surface of the base material. When the metallic pattern is formed on both surfaces of the base material, a conductivity processing is further implemented after the punching so that side walls of the hole formed in the punching are made conductive to thereby connect the metallic patterns formed on both surfaces of the base material by the conductive material.

The punching is performed in order to form the through-hole or the like in a print wiring substrate as a means of assuring inter-layer conductivity when a circuit substrate is formed into a multiplicity of layers, such as in the formation of circuit wiring on both surfaces of a base material and in stacking a plurality of base materials in which the circuit wiring is formed on one another, in a case where a higher density is pursued in the circuit wiring and packaging of the packaging parts.

Any available punching method, which can be used for, for example, the formation of the through-hole when the print wiring substrate is manufactured, can be employed without limitation. Specifics of the formed hole, such as a shape or size thereof, can be appropriately set.

Examples of a processing method for the formation of the hole include a drilling process and a processing method using a laser such as a carbon dioxide laser, UV laser or excimer laser which has been more often used in recent years. The laser process has a remarkable advantage in that an extremely fine process can be implemented with high precision. When the laser process is employed, it is preferable that any smear, which is possibly left an internal walls of the through-hole, is removed through a chemical treatment or plasma treatment after the through-hole is formed. However, when any material in which the metallic pattern is formed according to the invention is used for TAB, the punching for packaging an IC is preferably implemented using a drill.

The punching may be implemented at any stage in the metallic pattern forming according to the invention. For example, the punching may be carried out after the formation of the metallic pattern, prior to the formation of the graft polymer in the pattern shape, or after the formation of the graft polymer in the pattern shape. However, the punching is preferably carried out after the formation of the graft polymer in the pattern shape when a conductivity processing, which is described below, is necessarily carried out after the punching, because the plating of the hole and graft polymer pattern can be simultaneously carried out.

Conductivity Processing

In the invention, conductivity processing with respect to the hole formed in the punching may be further included after the punching. The conductivity processing may be separately carried out apart from the other methods/processes so far described, or another process (electroless plating or the like) can include the conductivity processing.

In the conductivity processing, the hole formed in the punching is made conductive by embedding the conduction material inside the hole. Specific examples of the conductive material include a metallic material, which is a metal element such as copper, nickel, chrome, titanium, aluminum, molybdenum, tungsten, zinc, tin, indium, gold or silver, or alloy thereof (nichrome or the like), a conductive polymer material such as polypyrrole or polythiophene, a non-metallic inorganic conductive material such as graphite or conductive ceramic, and the like.

As a method of embedding the conductive material in the hole, the electroless plating method or spreading method can be adopted because those methods are capable of uniformly and easily providing conductivity to a micro-sized space such as an inner surface of the hole.

More specifically, for example, when the conductivity processing is carried out by embedding the metallic material in the hole, it is preferable that a catalyst is imparted into the hole and the chemical metal plating method (electroless plating method) is carried out. The electroless plating is conveniently carried out at the same time as the implementation of the electroless plating with respect to the graft polymer in the above-mentioned electroless plating.

When the conductivity processing is carried out by embedding the metallic material in the hole, the electroless plating method or spreading method can be adopted. In the electroless plating method, an appropriate oxidant is imparted to the inside of the hole, and the base material is thereafter dipped in a solution including a pyrrole or a thiophene monomer, an example of which is a pyrrole solution. The spreading method uses a solution prepared by dissolving the conductive polymer material, such as polypyrrole or 1,4-dioxythiophene, in a solvent. The solution is spread on the graft layer and the hole provided on the base material.

When the conductivity processing is carried out by embedding the non-metallic inorganic conductive material, such as graphite, in the hole, the electroless plating method in the absence of any catalyst is preferably adopted. To describe such a method using the graphite plating as an example, the surface of the hole is treated using the above-described treatment fluid, and then, the multi-layer body is dipped in a graphite-dispersive fluid. A typical example of a graphite plating fluid that can be adopted in the above-mentioned process is DIRECT PLATING®, which is a graphite plating fluid manufactured by MEC CO., LTD. The graphite plating fluid is a set in which pre-treatment fluid (trade name: MEC S PROCESS SP-6560, manufactured by MEC CO., LTD) and graphite-dispersive fluid (trade name: MEC S PROCESS SP-6601, manufactured by MEC CO., LTD) are combined.

Corrsoion Prevention Process

In the invention, a corrosion prevention process can be carried out to the formed metallic pattern.

Any corrosion prevention process generally available in the manufacturing of a print wiring substrate is applicable to the corrosion prevention process employed in the invention. For example, a method of plating zinc on the substrate, a method of spreading a fluxing agent on the substrate, a method of spreading a solder resist on the substrate or the like can be adopted.

Other Process

When a process such as the punching is implemented with respect to the base material together with the metal included therein after the metallic pattern is formed by means of the carbon dioxide laser, the surface treatment and the shape of the surface of the metallic film (metallic pattern) formed on the base material often cause a great deal of influence on the absorption of the carbon dioxide laser. For this reason, a surface area of the metallic film may be increased by roughening the surface through a CZ process or the like so that the absorption of the carbon dioxide laser can be increased. To describe the CZ process, the base material on which the metallic film formed from copper or the like is dipped in a fluid including formic acid and hydrochloric acid and thereafter washed with water to remove the treatment fluid so that the surface of the metallic film is roughened. A length of time required for the process is preferably at least two minutes and less than ten minutes.

The metallic pattern obtained by means of the metallic pattern forming method according to the invention is described below.

The metallic pattern formed according to the invention is a metallic pattern in which the metallic film is locally provided on the base material having the surface unevenness of at most 100 nm, and is characterized in that the adhesion property between the base material and the metallic film is favorable. More specifically, the metallic pattern formed according to the invention is characterized in that superior adhesion property is achieved between the base material and the metallic film while the base material surface is smooth.

The unevenness of the surface is represented by a value measured by cutting the medium or the formed metallic pattern vertically relative to a plane of the medium and observing the cross-sectional surface by means of an SEM.

The value representing the adhesion property between the medium and metallic film is obtained by a method in which a copper plate (0.1 mm) is adhered to the surface of the metallic pattern using an epoxy compound adhesive (trade name: ARALDITE, manufactured by Chiba Geigy Co., Ltd.) and dried at 140° C. for four hours, and then subjected to a 90-degree stripping test based on a publicly known test method for a copper-mixed multilayer plate used for a print wiring plate.

In a general metallic pattern, a metallic pattern having a superior high-frequency property can be obtained when the unevenness of the base material surface, that is, the interface between the metallic film and base material surface, is set to at most 100 nm. However, in the case of a conventional metallic pattern, when the unevenness of the base material surface is reduced, the adhesion property between the base material surface and metallic film is also reduced. Therefore, there is no choice but to roughen the base material surface through different methods and provide the metallic film on the roughened surface, and the interface unevenness in the conventional metallic pattern is generally at least 1000 nm.

However, in the case of the metallic pattern formed according to the invention, the metallic film and the polymer directly chemically bonded to the base material are in the hybrid state, which enables the adhesion property between the base material and the metallic film to be maintained.

The metallic pattern formed according to the invention is characterized in that the base material having the surface whose unevenness is at most 100 nm is selected. The unevenness is more preferably selected from the range of 25 to 100 nm, and even more preferably from the range of 50 to 100 nm.

Thus, the metallic pattern formed according to the invention is superior in terms of the adhesion property between the base material and the metallic film while the unevenness is minimized at the base material interface.

Hereinafter, particularly preferable aspects of the invention are listed. However, the invention is not necessarily limited to these aspects.

(1) The pattern forming method comprising generating the graft polymer directly bonded to the base material surface and having the polar group on the surface of the base material including the polyimide having the polymerization initiating moiety in the skeleton thereof in the pattern shape.

(2) The pattern forming method comprising:
  generating the active site on the base material surface by applying energy to the surface of the base material including the polyimide having the polymerization initiating moiety in the skeleton thereof;
  providing the polymer compound layer made of the polymer compound directly bonded to the base material surface and having the functional group whose hydrophilicity/hydrophobicity is changed in response to heat, acid or radiation using the active site as a starting point; and
  forming the pattern composed of the hydrophilic region and the hydrophobic region on the base material surface by applying heat, acid or radiation to the polymer compound layer in the pattern shape.

(3) The pattern forming method comprising:
  contacting the compound having the polymerizable functional group and the polar group with the surface of the base material including the polyimide having the polymerization initiating moiety in the skeleton thereof;
  generating the active site on the base material surface by irradiating the radiation in the pattern shape; and
  forming the pattern composed of the region where the graft polymer is generated and the region where the graft polymer is not generated by generating the graft polymer on the base material surface by means of graft polymerization using the active site as a starting point.

(4) The graft pattern material having the graft polymer directly bonded to the polymerization initiating moiety present on the base material surface and having the polar group in the pattern shape on the surface of the base material including the polyimide having the polymerization initiating moiety in the skeleton thereof.

(5) The graft pattern material characterized in that:
  the polymer compound layer made of the polymer compound directly bonded to the polymerization initiating moiety present on the base material surface and having the functional group whose hydrophilicity/hydrophobicity is changed in response to heat, acid or radiation is provided on the surface of the base material including the polyimide having the polymerization initiating moiety in the skeleton thereof; and
  the heat, acid or radiation is applied to the polymer compound layer in the pattern shape to thereby form the pattern composed of the hydrophilic region and the hydrophobic region on the base material surface.

(6) The graft pattern material characterized in that:
  the compound having the polymerizable functional group and the polar group is made to contact with the surface of the base material including the polyimide having the polymerization initiating moiety in the skeleton thereof; and
  the radiation is irradiated in the pattern shape to thereby generate the graft polymer directly bonded to the polymerization initiating moiety present on the base material surface by means of graft polymerization so that the pattern composed of the region where the graft polymer is generated and the region where the graft polymer is not generated is formed.

(7) The conductive pattern forming method comprising:
  generating the graft polymer directly bonded to the base material surface and having the polar group in the pattern shape on the surface of the base material including the polyimide having the polymerization initiating moiety in the skeleton thereof; and
  attaching the conductive material to the graft polymer.

(8) The conductive pattern forming method described in the preferred mode (7), further comprising the heating after the conductive material is attached to the graft polymer.

(9) The conductive pattern forming method comprising:
  generating the active site on the base material surface by applying energy to the surface of the base material including the polyimide having the polymerization initiating moiety in the skeleton thereof;
  providing the polymer compound layer made of the polymer compound directly bonded to the base material surface and having the functional group whose hydrophilicity/hydrophobicity is changed in response to heat, acid or radiation using the active site as a starting point;
  applying the heat, acid or radiation to the polymer compound layer in the pattern shape to thereby form the pattern composed of the hydrophilic region and the hydrophobic region on the base material surface; and
  attaching the conductive material to the hydrophilic region or the hydrophobic region.

(10) The conductive pattern forming method described in the preferred mode (9), further comprising the heating after the conductive material is attached to the hydrophilic region or the hydrophobic region.

(11) The conductive pattern forming method comprising:
  contacting the compound having the polymerizable functional group and the polar group with the surface of the base material including the polyimide having the polymerization initiating moiety in the skeleton thereof;
  generating the active site on the base material surface by irradiating the radiation in the pattern shape;

forming the pattern composed of the region where the graft polymer is generated and the region where the graft polymer is not generated by generating the graft polymer on the base material surface by means of graft polymerization using the active site as a starting point; and attaching the conductive material to the region where the graft polymer is generated.

(12) The conductive pattern forming method described in the preferred mode (11), further comprising the heating after the conductive material is attached to the region where the graft polymer is generated.

(13) The conductive pattern material characterized in that the graft polymer directly bonded to the polymerization initiating moiety present on the base material surface and having the polar group to which the conductive material is attached is provided in the pattern shape on the surface of the base material including the polyimide having the polymerization initiating moiety in the skeleton thereof.

(14) The conductive pattern material characterized in that:
the polymer compound layer made of the polymer compound directly bonded to the polymerization initiating moiety present on the base material surface and having the functional group whose hydrophilicity/hydrophobicity is changed in response to heat, acid or radiation is provided on the surface of the base material including the polyimide having the polymerization initiating moiety in the skeleton thereof; and
the conductive material is attached to the hydrophilic region or the hydrophobic region by applying the heat, acid or radiation to the polymer compound layer in the pattern shape after the pattern composed of the hydrophilic region and the hydrophobic region is formed.

(15) The conductive pattern material characterized in that the compound having the polymerizable functional group and the polar group is made to contact with the surface of the base material including the polyimide having the polymerization initiating moiety in the skeleton thereof, the radiation is irradiated thereto in the pattern shape so that the graft polymer directly bonded to the polymerization initiating moiety present on the base material surface is generated by means of graft polymerization, and the conductive material is attached to the region where the graft polymer is generated after the pattern composed of the region where the graft polymer is generated and the region where the graft polymer is not generated is formed.

(16) The metallic fine particle dispersion pattern forming method comprising:
generating the graft polymer directly bonded to the base material surface and having the polar group in the pattern shape on the surface of the base material including the polyimide having the polymerization initiating moiety in the skeleton thereof;
imparting the metal ion or metal salt to the graft polymer; and
reducing the metal ion or the metal ion included in the metal salt and thereby depositing the metallic fine particle so that the region to which the metallic fine particles are attached is formed.

(17) The metallic fine particle dispersion pattern forming method described in the preferred mode (16), further comprising heating the metallic fine particle dispersion pattern.

(18) The metallic fine particle dispersion pattern forming method comprising:
generating the active site on the base material surface by applying the energy to the surface of the base material including the polyimide having the polymerization initiating moiety in the skeleton thereof;
providing the polymer compound layer made of the polymer compound directly bonded to the base material surface and having the functional group whose hydrophilicity/hydrophobicity is changed in response to heat, acid or radiation using the active site as a starting point;
applying the heat, acid or radiation to the polymer compound layer in the pattern shape to thereby form the pattern composed of the hydrophilic region and the hydrophobic region on the base material surface;
imparting the metal ion or metal salt to the hydrophilic region; and
reducing the metal ion or the metal ion included in the metal salt and thereby depositing the metallic fine particle so that the region to which the metallic fine particles are attached is formed.

(19) The metallic fine particle dispersion pattern forming method described in the preferred mode (18), further comprising heating the metallic fine particle dispersion pattern.

(20) The metallic fine particle dispersion pattern forming method comprising:
contacting the compound having the polymerizable functional group and the polar group with the surface of the base material including the polyimide having the polymerization initiating moiety in the skeleton thereof;
generating the active site on the base material surface by applying the radiation in the pattern;
forming the pattern composed of the region where the graft polymer is generated and the region where the graft polymer is not generated on the base material surface by generating the graft polymer on the base material surface by means of graft polymerization using the active site as a starting point;
imparting the metal ion or metal salt to the region where the graft polymer is generated; and
reducing the metal ion or the metal ion included in the metal salt and thereby depositing the metallic fine particle so that the region to which the metallic fine particles are attached is formed.

(21) The metallic fine particle dispersion pattern forming method described in the preferred mode (20), further comprising heating the metallic fine particle dispersion pattern.

(22) The metallic pattern forming method comprising:
forming the region where the graft polymer directly bonded to the base material surface and having the functional group that interacts with the electroless plating catalyst or precursor thereof is generated in the pattern shape on the surface of the base material including the polyimide having the polymerization initiating moiety in the skeleton thereof;
imparting the electroless plating catalyst or precursor thereof to the formed region; and
forming the pattern-shaped metallic film by implementing electroless plating.

(23) The metallic pattern forming method described in the preferred mode (22), characterized in that the base material including the polyimide has the film shape or plate shape, and the metallic pattern is formed on both surfaces of the base material.

(24) The metallic pattern forming method described in the preferred mode (22), further comprising the punching.

(25) The metallic pattern forming method described in the preferred mode (24), further comprising the conductivity processing in which the conductivity processing is carried out with respect to the hole formed in the punching after the punching.

(26) The metallic pattern forming method comprising:
applying energy to the surface of the base material including the polyimide having the polymerization initiating moiety in the skeleton thereof to thereby generate the active site;
providing the polymer compound layer made of the polymer compound directly bonded to the base material surface and having the functional group whose structure is changed into the structure that interacts with the electroless plating catalyst or the precursor thereof or the functional group that ceases to interact with the electroless plating catalyst or the precursor thereof in response to heat, acid or radiation using the active site as a starting point;
applying the heat, acid or radiation to the polymer compound layer in the pattern shape to thereby form the region that interacts with the electroless plating catalyst or precursor thereof in the pattern shape on the base material surface;
imparting the electroless plating catalyst and precursor thereof to the formed region; and
forming the pattern-shaped metallic film by implementing electroless plating.

(27) The metallic pattern forming method described in the preferred mode (26), characterized in that the base material including the polyimide has the film shape or plate shape, and the metallic pattern is formed on both surfaces of the base material.

(28) The metallic pattern forming method described in the preferred mode (26), further comprising the punching.

(29) The metallic pattern forming method described in the preferred mode (28), further comprising the conductivity processing in which the conductivity processing is carried out with respect to the hole formed in the punching after the punching.

(30) The metallic pattern forming method comprising:
contacting the compound having the polymerizable functional group and the functional group that interacts with the electroless plating catalyst or precursor thereof with the surface of the base material including the polyimide having the polymerization initiating moiety in the skeleton thereof;
generating the active site in the pattern shape on the base material surface by irradiating the radiation in the pattern shape;
forming the region that interacts with the electroless plating catalyst or precursor thereof in the pattern shape by generating the graft polymer on the base material surface by means of graft polymerization using the active site as a starting point;
imparting the electroless plating catalyst and precursor thereof to the formed region; and
forming the pattern-shaped metallic film by implementing electroless plating.

(31) The metallic pattern forming method described in the preferred mode (30), characterized in that the base material including the polyimide has the film shape or plate shape, and the metallic pattern is formed on both surfaces of the base material.

(32) The metallic pattern forming method described in the preferred mode (30), further comprising the punching.

(33) The metallic pattern forming method described in the preferred mode (32), further comprising the conductivity processing in which the conductivity processing is carried out with respect to the hole formed by the punching.

EXAMPLES

Hereinafter, the present invention is described in detail referring to examples. However, the invention is not limited to the described examples.

Example 1-1

Synthesis of Polyimide Precursor (Polyamic Acid)

4,4'-diaminodiphenylether (5.75 g: 28.7 mmol) was dissolved in N-methylpyrrolidone (30 ml) in the presence of nitrogen and agitated at a room temperature for approximately 30 minutes.

3,3'4,4'-benzophenone tetracarboxylic acid dianhydride (9.25 g: 28.7 mmol) was added to the above solution at 0° C. and agitated for five hours. The reaction fluid was reprecipitated and a polyimide precursor was obtained. A molecular weight (Mw) thereof by means of GPC was 28,000. The details of the measurement conditions were as follows. Further, the structure thereof was confirmed by means of $^1$H-NMR and FT-1R.

Measurement of Weight Average Molecular Weight (Mw)

The weight average molecular weight was measured by means of a gel permeation chromatography (GPC) method under the following conditions.

Test material: 0.01 g of the test material was dissolved in 2 cc of tetrahydrofuran and filtrated.
Standard polystyrene: Standard polystyrene TSK, manufactured by TOSOH CORPORATION was used.
Device: Fast gel permeation chromatogram (trade name: HCL-8220GPC, manufactured by TOSOH CORPORATION)
Column: TSK-gel (trade name: GMX, manufactured by TOSOH CORPORATION)
Measurement temperature: 40° C., speed of flow: 1 cc/min Production of Polyimide Substrate The polyamic acid synthesized in the above-mentioned method was dissolved in DMAc (manufactured by Wako Pure Chemical Industries, Ltd.) and formed into a solution of 20 wt %. The solution was spread on a glass substrate using a rod bar #36, dried at 100° C. for five minutes, heated at 250° C. for 30 minutes so as to solidify, and then was stripped off from the glass substrate. As a result, a polyimide substrate (thickness of 15 μm) was obtained.

Pattern Forming

A pattern forming material was obtained by applying a coating fluid having the following composition on the polyimide film prepared according to the above-mentioned method using a rod bar #18. A thickness of the film formed on the substrate was 0.8 μm.

Composition of Coating Fluid
polymer including a polymerizable group 0.25 g
(synthesized in the following method)
cyclohexanone 8.0 g Method of Synthesizing Polymer Including Polymerizable Group 58.6 g of 2-hydroxyethylmethacrylate was put in a three-mouth flask having a 500 ml capacity and 250 ml of acetone was added thereto and then agitated. 39.2 g of pyridine and 0.1 g of p-methoxyphenol were further added thereto, and then cooled down in a cooling bath using ice water. After a temperature of the mixed fluid reached 5° C. or below, 114.9 g of 2-bromoisobutanoic acid bromide was dropped therein by means of a dropping funnel over a period of three hours. After the dropping was completed, the mixed fluid was removed from the cooling bath and further agitated for three hours. The reaction mixed fluid was charged into 750 ml of water and agitated for one hour. The mixed fluid combined with water was extracted three times using 500 ml of acetic ether by means of separating funnel. An organic layer was washed sequentially with 500 ml of 1M hydrochloric acid, 500 ml of an aqueous solution of saturated sodium hydrocarbonate, and 500 ml of saturated salt water. The organic layer was provided with 100 g of magnesium sulfate, and dehydrated and dried, and then, filtrated. 120.3 g of a monomer A was obtained by vacuum-distilling the solvent.

Next, 40 g of N,N-dimethylacetamide was charged into a three-mouth flask having a 1000 ml capacity and heated to 70° C. in the presence of nitrogen. 40 g of the N,N-dimethylacetamide solution including 12.58 g of the monomer A, 27.52 g of methacrylic acid and 0.921 g of a thermal polymerization initiating agent (trade name: V-601, manufactured by Wako Pure Chemical Industries, Ltd.) was dropped therein over a period of 2.5 hours. After the dropping was completed, the solution was heated to 90° C. and further agitated for two hours. The reaction solution was cooled down to room temperature and charged into 3.5 L of water so that a polymer compound was deposited. The deposited polymer compound was filtrated, washed with water and dried, and as a result, 30.5 g of the polymer compound was obtained. A weight average molecular weight of the obtained polymer compound was measured by means of a gel permeation chromatography method (GPC) in which a standard material was polystyrene, and the obtained result was 124.000.

26.0 g of the obtained polymer compound and 0.1 g of p-methoxyphenol were charged into a three-mouth flask having a 200 ml capacity and dissolved in 60 g of N,N-dimethylacetamide and 60 g of acetone, and then cooled down in the cooling bath using ice water. After a temperature of the mixed fluid reached 5° C. or below, 60.4 g of 1,8-diazabicyclo [5.4.0]-7-undecene (DBU) was dropped therein over a period of one hour by means of a dropping funnel. After the dropping was completed, the fluid was removed from the cooling bath and further agitated for eight hours. The reaction fluid was charged into 2 L of water in which 17 ml of concentrated hydrochloric acid was dissolved, and a polymer including a polymerizable group was thereby deposited. The deposited polymer having the polymerizable group was filtrated, washed with water and dried. Then, 15.6 g of the polymer was obtained.

Pattern exposure was carried out with respect to the obtained film using a 1.5 kW high-pressure mercury-vapor lamp for one minute. The film obtained thereafter was washed with saturated baking soda water, and a graft pattern material having a graft polymer pattern in which the exposed part turned hydrophilic was obtained.

Adhesion of Conductive Material

The substrate on which the graft pattern was formed was dipped in a conductive material fluid dispersion (positive-charged Ag fluid dispersion) produced according to the following method, and the substrate surface was sufficiently washed with running water so as to remove any excess Ag fluid dispersion thereon. Then, a conductive pattern material 1 to which the conductive material was adhered in a pattern shape was obtained.

Method of Synthesizing Conductive Material 3 g of bis(1,1-trimethylammonium decanoylaminoethyl) disulfide was added to 50 ml of an ethanol solution of silver hyperchloride (5 mM), and 30 ml of a solution of hydrogenated sodium boron (0.4M) was slowly dropped therein while intensive agitation was carried out so as to reduce an ion. Then, a fluid dispersion of a silver particle coated with quaternary ammonium was obtained. An average diameter of the silver particle was 5 nm according to measurement by means of an electron microscope.

Example 1-2

The conductive pattern material 1 obtained in Example 1-1 was heated for one hour at 300° C., and a conductive pattern material 2 was thereby produced.

Example 1-3

Pattern Forming

A polyimide substrate, which was the same as the polyimide substrate produced in Example 1-1, was dipped in an aqueous solution including acrylic acid (10 wt %) and sodium periodic acid ($NaIO_4$, 0.01 wt %) and subjected to photoirradiation using a 1.5 kW high-pressure mercury-vapor lamp for ten minutes in an argon atmosphere. A film obtained as a result of the photoirradiation was washed with ion-exchanged water, and a substrate, in which acrylic acid was grafted, was obtained.

Next, an aqueous solution consisting of one liter of water, 40 g of N-ethyl-N'(3-dimethylaminopropyl)carbodiimide hydrochloride and 6 g of N-hydroxysuccinimide was prepared, and the substrate in which acrylic acid was grafted was dipped in the aqueous solution so that ester exchange was performed. Thereafter, 6 g of 2-nitrobenzylphenol was further added thereto and thereby reacted. Thus, a pattern forming material having a pattern forming layer made of a polymer having a photodecomposable functional group was obtained.

The obtained pattern forming material was subjected to image-wise exposure using a laser emitting a blue light having a 400 nm wavelength (beam diameter being 20 μm), and a graft pattern material was produced.

Adhesion of Conductive Material

The graft pattern material was dipped in a positive-charged Ag fluid dispersion, which was a conductive material produced in the same manner as in Example 1-1, and the surface thereof was sufficiently washed with running water to thereby remove any excess Ag dispersive fluid. A conductive pattern material 3 to which the conductive material was adhered in a pattern shape was obtained.

Method of Producing Conductive Material 3 g of bis(1,1-trimethyl ammonium decanoylaminoethyl) disulfide was added to 50 ml of the ethanol solution of silver hyperchloride (5 mM), and 30 ml of the solution of hydrogenated sodium boron (0.4M) was slowly dropped therein while intensive agitation was carried out so as to reduce an ion. Then, a fluid dispersion of a silver particle coated with quaternary ammonium was obtained. An average diameter of the silver particle was 5 nm according to a measurement by means of an electron microscope.

Example 1-4

The conductive pattern material 3 obtained in Example 1-3 was heated for one hour at 300° C., and a conductive pattern material 4 was thereby obtained.

Example 1-5

Pattern Forming

A polyimide substrate, which was produced in the same manner as in Example 1-1 was dipped in a t-butylacrylate solution (30 mass %, solvent: propyleneglycol monomethylether (MFG)) and subjected to exposure using a 1.5 kW high-pressure mercury-vapor lamp for 30 minutes in an argon atmosphere.

A film obtained as a result of the photoirradiation was sufficiently washed with propyleneglycol monomethylether (MFG), and a pattern forming material in which poly-t-butylacrylate was grafted was obtained.

The obtained pattern forming material was coated with a solution having the following composition. A thickness of the film formed on the substrate was 0.5 μm.

Composition of Coating Fluid
triphenylsulfoniumtriflate 0.05 g
methylethylketone (MEK) 1 g Next, the obtained film was subjected to pattern exposure for one minute using a 400 W high-pressure mercury-vapor lamp, and heated for two minutes at 90° C. The film obtained thereafter was washed with methylethylketone (MEK). Thus, a graft pattern material, in which a functional group of the exposed part was polarity-converted into a hydrophilic group, was produced.

Adhesion of Conductive Material

The graft pattern produced as described above was dipped in a positive-charged Ag dispersive fluid, which was a conductive material produced in the same manner as in Example 1-1, and the surface thereof was washed with running water to thereby remove any excess Ag fluid dispersion. In this manner, a conductive pattern material 5 to which the conductive material was adhered in a pattern shape was obtained.

Example 1-6

The conductive pattern material 5 obtained in Example 1-5 was heated for 15 minutes at 300° C., and a conductive pattern material 6 was thereby obtained.

Evaluation

1. Evaluation of Conductivity

A surface conductivity in an Ag fine particle attached part of each of the obtained conductive pattern materials 1-1 to 1-6 was measured by means of a four-probe method.

Evaluation of Abrasion Resistance

The surfaces of the obtained conductive pattern materials 1-1 through 1-6 were reciprocatingly rubbed 50 times by hand using a cloth (trade name: BEMCOT, manufactured by Asahi Kasei Corporation) moisturized with water. After the rubbing was completed, the surfaces were observed at a magnification of 100,000 times using a transmission electron microscope (trade name: JEM-200CX, manufactured by JEOL), and the abrasion resistances of the surfaces of the six conductive pattern materials were evaluated as follows. Any material showing a favorable result in the present evaluation test is a conductive pattern material that is superior in terms of adhesion property and durability.

2. Evaluation Criteria
A: No change was observed.
B: Changes such as stripping of the conductive pattern or the like were observed.

3. Evaluation of Heat Resistance

The conductive pattern materials 1-1 to 1-6 were heated for one hour at 300° C., and then, the abrasion resistance test was carried out to thereby evaluate the respective heat resistances. The evaluation criteria in the evaluation of the heat resistance were the same as in the evaluation of the abrasion resistance.

4. Measurement of Pattern Width

Widths of the patterns formed in the obtained conductive pattern materials 1-1 to 1-6 were measured by means of an optical microscope (trade name: OPTIPHOTO-2, manufactured by Nikon Corporation).

The results of the above-mentioned measurements are shown in Table 1.

TABLE 1

| | No. of conductive pattern material | Surface resistance ($\Omega/\square$) | Abrasion resistance | Heat resistance | Pattern width (μm) |
|---|---|---|---|---|---|
| Example 1-1 | Conductive pattern material 1 | 120 | A | A | 20 |
| Example 1-2 | Conductive pattern material 2 | 10 | A | A | 20 |
| Example 1-3 | Conductive pattern material 3 | 130 | A | A | 25 |
| Example 1-4 | Conductive pattern material 4 | 12 | A | A | 25 |
| Example 1-5 | Conductive pattern material 5 | 100 | A | A | 25 |
| Example 1-6 | Conductive pattern material 6 | 11 | A | A | 25 |

As shown in the Table 1, all of the conductive pattern materials according to Examples 1-1 to 1-6 are superior in terms of the adhesion property between the substrate and the pattern formed from the graft polymer, durability and heat resistance, and it was confirmed that very fine patterns were formed.

Further, as shown in the results of Examples 1-2, 1-4 and 1-6, it was also confirmed that the heating, which was further included, contributed to the improvement of the conductivity.

Example 2-1

A graft pattern material (graft pattern material A) having a graft polymer pattern, in which an exposed part turned hydrophilic, was obtained from a pattern forming material (pattern forming material A) obtained according to the same composition and method as in Example 1-1, by means of the same method as in Example 1-1.

Formation of Metallic Fine Particle Dispersive Film

The obtained graft pattern (10 cm×10 cm) was dipped in an aqueous solution of 15 mass % of silver nitrate (Wako Pure Chemical Industries, Ltd.) for 12 hours and washed with distilled water. Then, the substrate was dipped in 100 mL of distilled water, and 30 mL of 0.2M sodium tetrahydroborate was dropped therein for reduction. A thin-layered Ag metallic fine particle dispersion pattern A was uniformly formed on the base material surface.

Example 2-2

The metallic fine particle dispersion pattern A produced in Example 2-1 was heated for 15 minutes at 300° C., and the fine particles were further melted and adhered to one another, whereby a metallic pattern A was formed on the base material surface.

Example 2-3

Pattern Forming

A graft pattern material (graft pattern materials B) (10 cm×produced 10 cm) produced according to the same composition and procedure as in Example 1-3 was treated with the aqueous solution of silver nitrate, washed and reduced according to the same composition and method as in Example 2-1, whereby a thin-layered Ag metallic fine particle dispersion pattern B was uniformly formed on the base material surface.

Example 2-4

The thin-layered Ag metallic fine particle dispersion pattern B obtained in Example 2-3 was heated at 300° C. for one hour. Then, the fine particles were further melted and adhered to one another, whereby a metallic pattern B was formed on the base material surface.

Example 2-5

Pattern Forming

A graft pattern material (graft pattern material C) (10 cm×10 cm) produced according to the same composition and procedure as in Example 1-5 was treated with an aqueous solution of silver nitrate, washed and reduced according to the same composition and method as in Example 2-1, whereby a thin-layered Ag metallic fine particle dispersion pattern C was uniformly formed on the base material surface.

Example 2-6

The metallic fine particle dispersion pattern C obtained in Example 2-5 was heated for 15 minutes at 300° C. Then, the Ag metallic fine particle were further melted and adhered to one another, and a metallic pattern C was formed on the base material surface.

Evaluation

Measurement of Fine Line Width of Metallic (Fine Particle Dispersive) Pattern

Fine line widths of the metallic patterns obtained in Examples 2-1 to 2-6 were measured by means of an optical microscope (trade name: OPTIPHOTO-2, manufactured by Nikon Corporation).

The obtained measurement results were 20 μm in Examples 2-1 and 2-2, 25 μm in Examples 2-3 and 2-4, and 25 μm in Examples 2-5 and 2-6.

Evaluation of Metallic (Fine Particle Dispersive) Pattern

The metallic patterns obtained in Examples 2-1 to 26 were observed by means of an SEM.

Accordingly, it was confirmed that silver nano-particles were dispersed in samples of the metallic fine particle patterns in Examples 2-1, 2-3 and 2-5. Further, it was confirmed that the fine particles were mutually meltingly adhered in the samples of the metallic patterns in Examples 2-2, 2-4 and 2-6.

Example 3-1

A graft pattern material (graft pattern material A) having a graft polymer pattern in which an exposed part turned hydrophilic was obtained from a pattern forming material (pattern forming material A) obtained according to the same composition and method as in Example 1-1, according to the same method as in Example 1-1.

Electroless Plating

The graft pattern material A was dipped in an aqueous solution of 0.1 mass % of palladium nitrate (Wako Pure Chemical Industries, Ltd.) for one hour and thereafter washed with distilled water. Then, the graft pattern material A was dipped in an electroless plating bath having the following composition for 20 minutes at 40° C. As a result, a metallic pattern A was obtained.

| Constituents of electroless plating bath | |
|---|---|
| Electroless copper plating fluid (60 ml/l) (trade name: OPC KAPPA HT1, manufactured by OKUNO CHEMICAL INDUSTRIES CO., LTD.) | 6 mL |
| Electroless copper plating fluid (12 ml/l) (trade name: OPC KAPPA HT2, manufactured by OKUNO CHEMICAL INDUSTRIES CO., LTD.) | 12 mL |
| Electroless copper plating fluid 100 ml/l (trade name: OPC KAPPA HT3, manufactured by OKUNO CHEMICAL INDUSTRIES CO., LTD.) | 100 mL |
| Water | 83 mL |

Example 3-2

The metallic pattern produced in Example 3-1 was further subjected to an electroplating bath having the following composition for 15 minutes, whereby a metallic pattern B was obtained.

| Constituents of electroplating bath | |
|---|---|
| Copper sulfate | 38 g |
| Sulfuric acid | 95 g |
| Hydrochloric acid | 1 mL |
| Copper sulfate plating gloss agent (trade name: Copper Gleam PCM, manufactured by Meltex Inc.) | 3 mL |
| Water | 500 g |

Example 3-3

A graft pattern material (graft pattern material C) was obtained according to the same composition and procedure as in Example 1-3. Thereafter, electroless plating was carried out in the same manner as in Example 3-1, and a metallic pattern C was thereby obtained.

Example 3-4

A graft pattern material (graft pattern material D) was obtained according to the same composition and procedure as in Example 1-5. Thereafter, electroless plating was carried out in the same manner as in Example 3-1, and a metallic pattern D was thereby obtained.

Example 3-5

In the same manner as in Example 3-1, an interaction-property region was formed in a pattern shape on one surface (front surface) of a polyimide base material, and an interaction-property region was further formed in a pattern shape on the other surface (reverse surface). Then, a graft pattern material E, in which the interaction-property regions were formed in the pattern shapes on both surfaces of the base material, was obtained. After that, electroless plating was carried out in the same manner as in Example 3-1, and further, electroplating was carried out in the same manner as in Example 3-2. As a result, a metallic pattern E, in which the both surfaces of the polyimide base material were plated, was obtained.

Example 3-6

The metallic pattern obtained in Example 3-2 was galvanized for one minute by means of a zinc vitriol bath having the following composition under the conditions of a fluid temperature of 40° C. and a current density of 15 A/dm$^2$. As a result, a metallic pattern F was obtained. The galvanizing carried out in the present example is a rust prevention treatment.

| Composition of zinc vitriol bath | |
|---|---|
| Sulfuric acid | 70 g/L |
| Zinc | 20 g/L |

Example 3-7

Punching was carried out, by means of an NC drill, with respect to a graft pattern material G produced in the same manner as the graft pattern material E in which the interaction-property region was formed on both surfaces of the base material in Example 3-5 so that the graft patterns formed on both surfaces of the base material were connected to each other.

Next, the graft pattern material G subjected the punching processes was dipped in a fluid A having the following composition for five minutes.

| Composition of Fluid A | |
|---|---|
| Stannous chloride | 10 g |
| Hydrochloric acid | 40 mL |
| Water | 1000 mL |

Next, the graft pattern material G was dipped in a fluid B having the following composition for ten minutes.

| Composition of Fluid B | |
|---|---|
| Palladium chloride | 0.1 g |
| Hydrochloric acid | 1 mL |
| Water | 1000 mL |

Thereafter, electroless plating was carried out for ten minutes in the same manner as in Example 3-1 so that a metallic pattern was formed on both surfaces (front and reverse), and a through-hole connecting the metallic patterns formed on both surfaces of the base material was formed. Next, electroplating was carried out for 15 minutes in the same manner as in Example 3-2. As a result, a metallic pattern G was obtained.

Evaluation (Measurement of Fine Line Width of Metallic Pattern)

Fine line widths of the metallic patterns obtained in Examples 3-1 to 3-7 were measured by means of an optical microscope (trade name: OPTIPHOTO-2, manufactured by Nikon Corporation). The measurement results are shown in the following Table 2.

Measurement of Metallic Film Thickness

The metallic patterns obtained in Examples 3-1 to 3-7 were cut vertically relative to the plane of the substrate by means of a microtome. Then, the cross-sectional surfaces were observed by means of an SEM so as to measure a thickness of each metallic film. The measurement results show an average of measurement at three points per sample, and are shown in the following Table 2.

Evaluation of Unevenness at Substrate Interface

When the metallic patterns obtained in Examples 3-1 to 3-7 were cut vertically relative to the plane of the substrate by means of the microtome and the cross-sectional surfaces were observed by means of an SEM, an unevenness in the substrate interface were confirmed. Next, three random observation points on the substrate interface were chosen for each sample, and a size of unevenness was represented by a difference between a height of a highest projection and a depth of a lowest recess at each observation point. An average of value at the three observation points was obtained. The measurement results are shown in Table 2.

Evaluation of Adhesion Property

A copper plate (0.1 mm) was adhered to the surfaces of the metallic patterns obtained in Examples 3-1 to 3-7 using an epoxy compound adhesive (trade name: ARALDITE, manufactured by Chiba Geigy Co., Ltd.) and dried at 140° C. for four hours. Then, a 90-degree stripping test was performed based on a publicly known test method for a copper-mixed multilayer plate used for a print wiring plate. The measurement results are shown in Table 2.

Evaluation of Heat Resistance

The materials, in which the metallic patterns obtained in Examples 3-1 to 3-7 were formed, were heated at 300° C. for one hour. Next, the surfaces of the metallic patterns were reciprocatingly rubbed 50 times by hand using a cloth (trade name: BEMCOT, manufactured by Asahi Kasei Corporation) moisturized with water. After the rubbing was completed, the surfaces were observed at a magnification of 100,000 times using a transmission electron microscope (trade name: JEM-200CX, manufactured by JEOL), and the heat resistances of the surfaces of the six conductive pattern materials were evaluated as follows.

Evaluation Criteria

A: No change was observed.

B: Changes such as stripping of the metallic pattern or the like were observed.

TABLE 2

| | Fine line width (μm) | Thickness of metallic film (μm) | Unevenness at substrate interface (nm) | Adhesion property (kN/m) | Heat resistance |
|---|---|---|---|---|---|
| Example 3-1 | 12 | 1.1 | 100 nm or less | 0.4 | A |
| Example 3-2 | 20 | 15 | 100 nm or less | 0.3 | A |
| Example 3-3 | 20 | 1.3 | 100 nm or less | 0.3 | A |
| Example 3-4 | 18 | 1.2 | 100 nm or less | 0.3 | A |
| Example 3-5 | 20 | 15 | 100 nm or less | 0.3 | A |
| Example 3-6 | 20 | 17 | 100 nm or less | 0.3 | A |
| Example 3-7 | 20 | 15 | 100 nm or less | 0.3 | A |

According to the results shown in Table 2, a fine line having a width of at most 30 μm, which is difficult to obtain in the conventional technology, was formed in all of the metallic patterns obtained according to the metallic pattern forming methods of the invention. Further, it was confirmed that these fine line widths could be changed depending on the formation method of the graft pattern (interaction-property region) and conditions of the light exposure. Thus, according to the invention, metallic patterns having desired fine line widths capable of satisfying different purposes can be obtained. All of the metallic patterns obtained according to the metallic pattern forming methods of the invention had an unevenness at the film interface of at most 100 μm. It was found, therefore, that all of the metallic patterns obtained according to the metallic pattern forming methods of the invention are superior in surface smoothness, as well as in adhesion property between the substrate and metallic film and heat resistance.

Further, it was confirmed, with regard to Example 3-7, that the metallic pattern according to the example was superior in terms of the fine line width, thickness of the metallic film, unevenness at the metal interface, adhesion property and heat resistance, and also that the metallic patterns formed on both surfaces of the base material were electrically connected to each other.

What is claimed is:

1. A pattern forming method comprising:
providing a base material having, on a surface thereof, a polyimide including a polymerization initiating moiety in a polymer skeleton thereof;
contacting a compound having one of the following groups (iii) and (iv) to the surface of the base material including the polyimide having the polymerization initiating moiety in the polymer skeleton thereof;
photo-irradiating the polymerization initiating moiety included in the polyimide in a patterned shape to generate an active site in the patterned shape on the surface of the base material; and
generating a graft polymer on the surface of the base material by graft polymerizing the compound from the active site to form one of the following patterns (III) and (IV) on the surface of the base material, wherein:
the pattern (III) is obtained when the compound is a compound having the group (iii), and the pattern (IV) is obtained when the compound is a compound having the group (iv);
the group (iii) is an ethylene addition-polymerizable unsaturated group and a hydrophilic group;
the group (iv) is an ethylene addition-polymerizable unsaturated group and a hydrophilic group that interacts with either an electroless plating catalyst or a precursor thereof;
the pattern (III) is a pattern including a region where the graft polymer is generated and a region where the graft polymer is not generated;
the polyimide having the polymerization initiating moiety in the polymer skeleton thereof has a structure represented by the following Formula (IV):

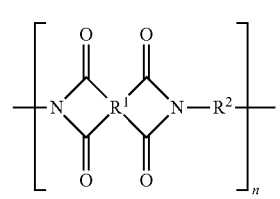

Formula (IV)

wherein $R^1$ represents a tetravalent organic group, $R^2$ represents a bivalent organic group, n represents an integer of at least one, and at least one of $R^1$ and $R^2$ is a group including the polymerization initiating moiety including a structure selected from the group consisting of an aromatic ketone, an onium salt compound, an organic peroxide, a thio-compound, a hexarylbiimidazole compound, a ketoxime ester compound, a borate compound, an azinium compound, an active ester compound, a compound having a carbon halogen bond, and a pyridium compound,
the pattern (IV) is a pattern including a region that interacts with either the electroless plating catalyst or the precursor thereof.

2. The pattern forming method according to claim 1, wherein the compound includes the group (iii).

3. The pattern forming method according to claim 1, wherein the compound includes the group (iii), a metal ion or a metal salt is imparted to the region where the graft polymer is generated, and a metallic fine particle is deposited by reducing the metal ion or a metal ion included in the metal salt so that a region to which the metallic fine particle is adhered is formed.

4. The pattern forming method according to claim 1, wherein the compound includes the group (iv), the electroless plating catalyst or the precursor thereof is imparted to the region that interacts with either the electroless plating catalyst or the precursor thereof, and electroless plating is carried out so that a metallic film having the patterned shape is formed.

5. The pattern forming method according to claim 4, wherein the base material including the polyimide has a film shape or a plate shape, and forming a metallic pattern on both surfaces of the base material, punching, and conductivity processing, in which the conductivity processing is carried out with respect to the hole formed by the punching, are further carried out.

6. The pattern forming method according to claim 1, wherein the polyimide having the polymerization initiating moiety in the polymer skeleton thereof is formed by heating a compound represented by the following Formula (I):

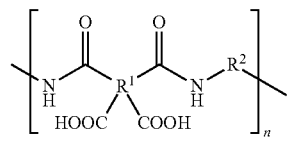

Formula (I)

wherein $R^1$ represents a tetravalent organic group, $R^2$ represents a bivalent organic group, and n represents an integer of at least one.

7. The pattern forming method according to claim 6, wherein a weight-average molecular weight of the compound represented by Formula (I) is from 1,000 to 10,000,000.

8. The pattern forming method according to claim 1, wherein the ethylene addition-polymerizable unsaturated group is selected from the group consisting of a vinyl group, an aryl group, an acrylic group and a methacrylic group.

9. The pattern forming method according to claim 1, wherein the polyimide having the polymerization initiating moiety in the polymer skeleton thereof is a compound selected from the following compounds:

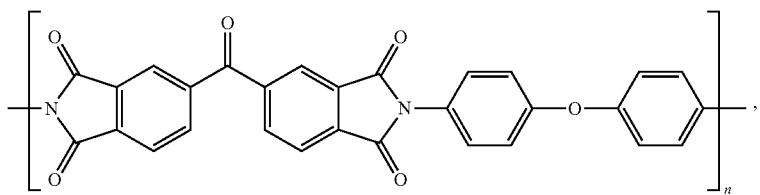

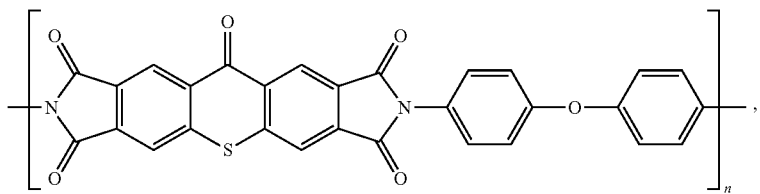

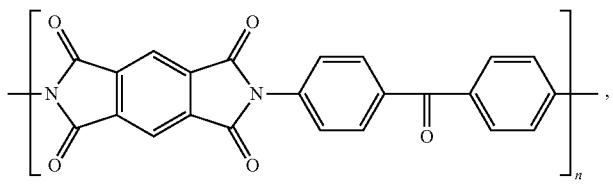

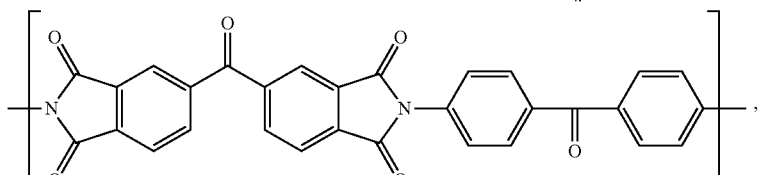

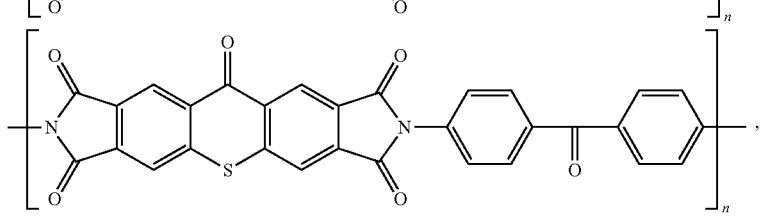

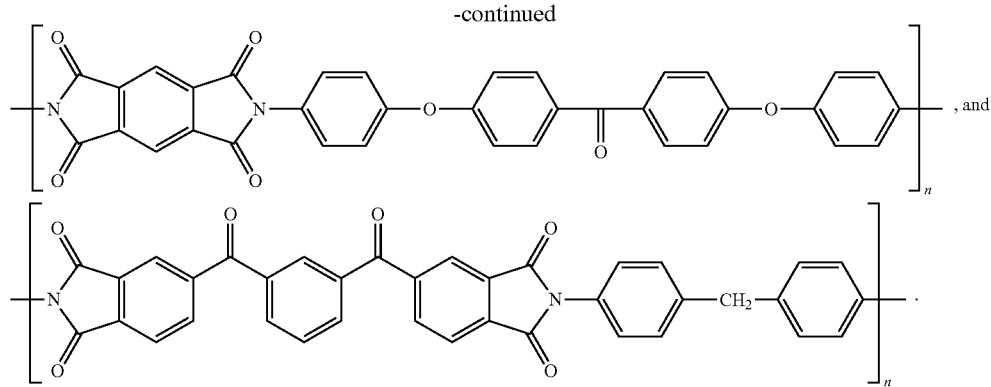
* * * * *